(12) United States Patent
Yamamoto

(10) Patent No.: US 11,011,087 B2
(45) Date of Patent: May 18, 2021

(54) IC, DRIVER IC, DISPLAY SYSTEM, AND ELECTRONIC DEVICE

(71) Applicant: SEMICONDUCTOR ENERGY LABORATORY CO., LTD., Atsugi (JP)

(72) Inventor: Roh Yamamoto, Toyama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/490,956

(22) PCT Filed: Feb. 28, 2018

(86) PCT No.: PCT/IB2018/051254
§ 371 (c)(1),
(2) Date: Sep. 4, 2019

(87) PCT Pub. No.: WO2018/163021
PCT Pub. Date: Sep. 13, 2018

(65) Prior Publication Data
US 2020/0013320 A1    Jan. 9, 2020

(30) Foreign Application Priority Data
Mar. 7, 2017  (JP) .............................. JP2017-043102

(51) Int. Cl.
*G09G 3/00*       (2006.01)
*G01R 31/28*      (2006.01)
(Continued)

(52) U.S. Cl.
CPC ......... *G09G 3/006* (2013.01); *G01R 31/2884* (2013.01); *G01R 35/00* (2013.01);
(Continued)

(58) Field of Classification Search
CPC .. G06F 3/03545; G06F 3/0445; G06F 3/0412; G06F 3/0442; G06F 3/0446;
(Continued)

(56) References Cited

U.S. PATENT DOCUMENTS 5,583,502 A    12/1996  Takeuchi et al.
6,075,520 A *   6/2000  Inoue ...................... G06F 3/044
                                                    178/18.01
(Continued)

FOREIGN PATENT DOCUMENTS

CN       001407526 A      4/2003
CN       101123066 A      2/2008
(Continued)

OTHER PUBLICATIONS

Hamaguchi.M et al., "A 240Hz-Reporting-Rate 143×81 Mutual-Capacitance Touch-Sensing Analog Front-End IC With 37dB SNR for 1mm-Diameter Stylus", ISSCC 2014 (Digest of Technical Papers. IEEE International Solid-State Circuits Conference), Feb. 11, 2014, pp. 214-216.

(Continued)

*Primary Examiner* — Christopher E Leiby
(74) *Attorney, Agent, or Firm* — Fish & Richardson P.C.

(57) ABSTRACT

A test circuit is incorporated in an IC without an increase in a chip area. The IC includes a plurality of pins, a plurality of current sensing circuits, and a current generation circuit. The plurality of current sensing circuits process currents flowing through the plurality of pins in parallel and generates digital data, for example. The current generation circuit includes a capacitor and generates a reference current corresponding to the amount of electric charge of the capacitor. The amount of electric charge can be controlled by a voltage input to the capacitor, and thus the range of output currents for current generation can be made wide. The reference (Continued)

current is used for testing the plurality of current sensing circuits. The IC is used for a source driver IC of a display panel, for example. In this case, currents flowing through pixels in the display panel can be sensed by the plurality of current sensing circuits.

5 Claims, 33 Drawing Sheets

(51) Int. Cl.
*G01R 35/00* (2006.01)
*G09G 3/32* (2016.01)
*H01L 27/32* (2006.01)
*H01L 51/52* (2006.01)

(52) U.S. Cl.
CPC ........... *G09G 3/32* (2013.01); *G09G 2300/08* (2013.01); *G09G 2310/0289* (2013.01); *G09G 2310/0291* (2013.01); *G09G 2310/0294* (2013.01); *G09G 2320/0295* (2013.01); *G09G 2330/12* (2013.01); *H01L 27/3246* (2013.01); *H01L 27/3262* (2013.01); *H01L 27/3265* (2013.01); *H01L 27/3276* (2013.01); *H01L 51/5253* (2013.01); *H01L 51/5259* (2013.01)

(58) Field of Classification Search
CPC .... G06F 3/04164; G06F 3/0418; G06F 3/044; G06F 2203/04112; G09G 3/3648; G09G 2360/147; G09G 2360/144; H01L 27/1225
See application file for complete search history.

(56) References Cited

U.S. PATENT DOCUMENTS

| | | | |
|---|---|---|---|
| 6,184,670 | B1 | 2/2001 | Mulatti et al. |
| 7,795,881 | B2 | 9/2010 | Masuda et al. |
| 7,884,662 | B1* | 2/2011 | Chuang ................. G06F 3/0416 327/336 |
| 8,094,107 | B2 | 1/2012 | Nishimura et al. |
| 8,149,190 | B2 | 4/2012 | Mizukoshi et al. |
| 8,441,462 | B2 | 5/2013 | Kobayashi et al. |
| 8,902,192 | B2 | 12/2014 | Miyamoto et al. |
| 8,942,937 | B2 | 1/2015 | Miyamoto et al. |
| 8,976,154 | B2 | 3/2015 | Miyamoto et al. |
| 9,013,448 | B2 | 4/2015 | Miyamoto et al. |
| 9,030,441 | B2 | 5/2015 | Yumoto et al. |
| 9,041,453 | B2 | 5/2015 | Miyake et al. |
| 9,058,085 | B2 | 6/2015 | Miyamoto et al. |
| 9,146,632 | B2 | 9/2015 | Miyamoto |
| 9,152,286 | B2 | 10/2015 | Yumoto et al. |
| 9,354,757 | B2 | 5/2016 | Miyamoto et al. |
| 9,367,184 | B2 | 6/2016 | Kobayashi et al. |
| 9,454,271 | B2 | 9/2016 | Miyamoto et al. |
| 9,465,492 | B2 | 10/2016 | Miyamoto et al. |
| 2002/0030656 | A1 | 3/2002 | Goto et al. |
| 2003/0057895 | A1 | 3/2003 | Kimura |
| 2006/0072047 | A1 | 4/2006 | Sekiguchi |
| 2007/0126668 | A1 | 6/2007 | Kimura |
| 2008/0036703 | A1 | 2/2008 | Wang et al. |
| 2008/0136627 | A1 | 6/2008 | Hayakawa |
| 2009/0207106 | A1 | 8/2009 | Mizukoshi et al. |
| 2009/0303219 | A1 | 12/2009 | Kimura et al. |
| 2010/0109620 | A1 | 5/2010 | Colombo |
| 2010/0307840 | A1 | 12/2010 | Kobayashi et al. |
| 2011/0122089 | A1* | 5/2011 | Kobayashi ............ G06F 3/0418 345/174 |
| 2011/0153263 | A1* | 6/2011 | Oda ........................ G06F 3/044 702/150 |
| 2011/0227955 | A1* | 9/2011 | Lee ......................... G06F 3/038 345/690 |
| 2012/0187927 | A1 | 7/2012 | Yu et al. |
| 2012/0286697 | A1 | 11/2012 | Kimura |
| 2013/0119412 | A1 | 5/2013 | Kasai et al. |
| 2013/0154672 | A1 | 6/2013 | Fabregas et al. |
| 2013/0211757 | A1 | 8/2013 | Miyamoto |
| 2013/0234133 | A1 | 9/2013 | Saito et al. |
| 2013/0294481 | A1 | 11/2013 | Koyama et al. |
| 2014/0132562 | A1 | 5/2014 | Miyamoto et al. |
| 2014/0146010 | A1* | 5/2014 | Akai ..................... G06F 3/0416 345/174 |
| 2014/0210751 | A1 | 7/2014 | Okamura et al. |
| 2014/0218645 | A1 | 8/2014 | Miyamoto |
| 2015/0015474 | A1 | 1/2015 | Miyake et al. |
| 2015/0187818 | A1 | 7/2015 | Miyake et al. |
| 2015/0317028 | A1 | 11/2015 | Takahashi et al. |
| 2016/0070314 | A1 | 3/2016 | Takahashi et al. |
| 2016/0071463 | A1 | 3/2016 | Takahashi et al. |
| 2016/0085371 | A1* | 3/2016 | Wang ................. H03K 17/9622 345/174 |
| 2016/0093641 | A1 | 3/2016 | Takahashi |
| 2016/0351552 | A1 | 12/2016 | Takahashi et al. |
| 2017/0045407 | A1 | 2/2017 | Nishikawa et al. |
| 2017/0168648 | A1* | 6/2017 | Takahashi ............... G06F 3/044 |
| 2017/0186355 | A1 | 6/2017 | Takahashi et al. |
| 2017/0186371 | A1 | 6/2017 | Takahashi et al. |

FOREIGN PATENT DOCUMENTS

| | | |
|---|---|---|
| CN | 103158576 A | 6/2013 |
| DE | 102012222749 | 6/2013 |
| EP | 1887550 A | 2/2008 |
| JP | 2003-195813 A | 7/2003 |
| JP | 2008-046617 A | 2/2008 |
| JP | 2009-198691 A | 9/2009 |
| JP | 2016-072975 A | 5/2016 |
| JP | 2017-111811 A | 6/2017 |
| JP | 2017-120420 A | 7/2017 |
| KR | 2003-0022084 A | 3/2003 |
| KR | 2017-0077820 A | 7/2017 |
| TW | I221268 | 9/2004 |
| TW | 200809743 | 2/2008 |
| TW | 201729058 | 8/2017 |

OTHER PUBLICATIONS

Kim.K et al., "A Capacitive Touch Controller Robust to Display Noise for Ultrathin Touch Screen Displays", ISSCC 2012 (Digest of Technical Papers. IEEE International Solid-State Circuits Conference), Feb. 20, 2012, pp. 116-117.

Takahashi.K et al., "13.3-inch 8k4k 664-ppi Foldable OLED Display Using Crystalline Oxide Semiconductor FETs", SID Digest '15 : SID International Symposium Digest of Technical Papers, Jun. 2, 2015, pp. 250-253.

Yamamoto.R et al., "13.3-inch 8k4k 664-ppi 120-Hz 12-bit OLED Display Using Top-Gate Self-Align CAAC-OS FETs and 12-bit Source Driver IC", SID DIGEST '16 : SID International Symposium Disest of Technical Papers, May 22, 2016, pp. 53-56.

International Search Report (Application No. PCT/IB2018/051254) dated Jun. 26, 2018.

Written Opinion (Application No. PCT/IB2018/051254) dated Jun. 26, 2018.

\* cited by examiner (PRECHAGE)

(OFFSET CANCELLATION)

(I/V CONVERSION)

(A/D CONVERSION)

<<TEST MODE>>

FIG. 12

| I/V circuit 24i[h] | | | | Decoder 272 | | | | | | | |
|---|---|---|---|---|---|---|---|---|---|---|---|
| | | | | Input | | | Output | | | | |
| | INM | INP1 | INP2 | CMREV | RITG[0] | RITG[1] | RITG[2] | DRITG[0] | DRITG[1] | DRITG[2] | DRITG[3] | DRITG[4] |
| 3-DEFF | 2h-1 | 2h-2 | 2h | L | L | L | L | H | H | L | L | H |
| | 2h | 2h-1 | 2h+1 | H | H | L | L | L | H | H | L | H |
| DEFF | 2h-1 | 2h | 2h | L | L | H | L | H | L | H | L | H |
| | 2h | 2h+1 | 2h+1 | H | L | L | H | L | L | H | H | H |
| | 2h-1 | 2h-2 | 2h-2 | L | L | L | H | H | H | H | H | H |
| | 2h | 2h-1 | 2h-1 | H | H | H | H | L | L | L | H | H |
| SE | 2h-1 | PVR4 (CMVRI) | X | L | | | | | | | | |
| | 2h | | | H | | | | | | | | |
| HiZ | Z | X | X | X | X | X | X | X | X | X | X | L |

X : Either "H" or "L" (Don't care)
Z : High Impedance (Hiz)
3-DEFF : 3-Input Differential Sensing
DEFF : Differential Sensing
SE : Single-ended Sensing (Single-ended sensing mode)

(Differential sensing mode)

(3-Input differential sensing mode)

<<CURRENT SENSING MODE>>

<<RD SEQUENCE>>

< STEP SS12 >

⟨ STEP SS13-1 ⟩

FIG. 31A
FIG. 31B
FIG. 31C
FIG. 31D
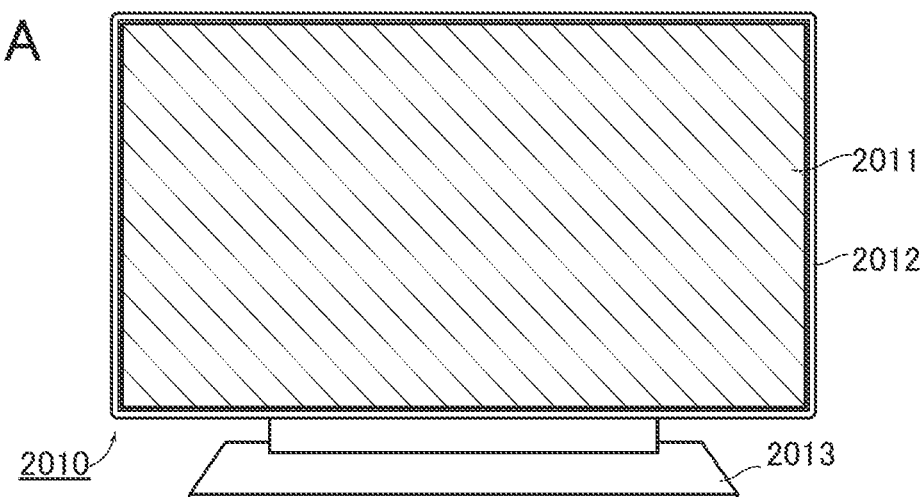
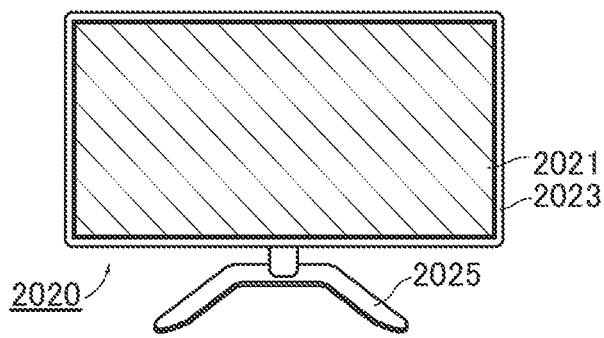
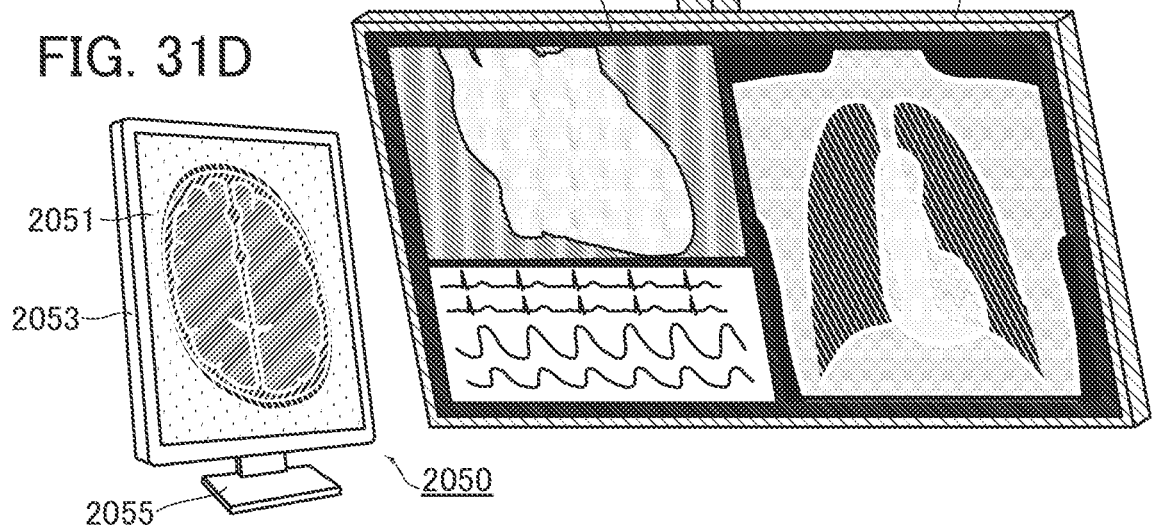

IC, DRIVER IC, DISPLAY SYSTEM, AND ELECTRONIC DEVICE

CROSS REFERENCE TO RELATED APPLICATIONS

This application is a U.S. National Phase Application under 35 U.S.C. § 371 of International Application PCT/IB2018/051254, filed on Feb. 28, 2018, which claims the benefit of a foreign priority application filed in Japan as Application No. 2017-043102 on Mar. 7, 2017, both of which are incorporated by reference.

TECHNICAL FIELD

In the specification, drawings, and claims of this application (hereinafter referred to as "this specification and the like"), a semiconductor device, an electronic component, an electronic device, operating methods thereof, and manufacturing methods thereof are described, for example.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Moreover, a memory device, a display device, a light-emitting device, a lighting device, an electronic device, and the like themselves might be semiconductor devices, or might each include a semiconductor device.

BACKGROUND ART

In order to meet demands for a larger number of gray levels and higher resolution of a display device or the like, a dedicated IC (driver IC) is used in a driver circuit of a display device, particularly in a source driver circuit where a data signal is generated from a video signal (Non-Patent Document 1, for example).

REFERENCE

Patent Document

For pixels of an active matrix display device using light-emitting elements, a variety of circuit configurations have been proposed. In general, a pixel is provided with at least a light-emitting element, a selection transistor that controls input of a grayscale signal to the pixel, and a driving transistor that drives the light-emitting element. Supplying a drain current flowing through the driving transistor to the light-emitting element enables the light-emitting element to emit light with a luminance corresponding to the value of the drain current.

Therefore, in the case where electrical characteristics (e.g., threshold voltage, field-effect mobility) of the driving transistor vary among a plurality of pixels that constitute a screen of a display device, variations in luminance of the light-emitting element are generated even when grayscale signals with the same voltage are supplied. Variations in electrical characteristics of the driving transistor among a plurality of pixels are one of the causes of reduction in display quality of a display device.

For active matrix display devices, the number of pixels provided has been increased to achieve higher resolution, and hundreds of thousands to tens of millions of pixels are provided in one display device. In a general color display device, a pixel is composed of three subpixels corresponding to display colors of red, green, and blue (RGB). For example, in the case where the display resolution is full-HD, the number of subpixels is 1366×768×3 (RGB)=1,049,088; and in the case where the resolution is 8K4K (Super Hi-Vision), the number of subpixels is 7,680×4,320×3 (RGB)=33,177,600. It is very difficult for driving transistors of a large number of subpixels to have perfectly the same electrical characteristics. Thus, measuring the electrical characteristics of a driving transistor and correcting the luminance of a light-emitting element is proposed (e.g., Non-Patent Document 1).

In Non-Patent Document 1, each of the transistors in subpixels and a scan driver included in a display device is a transistor having a channel formed using a metal oxide. In this specification and the like, a transistor whose channel is formed using a metal oxide is referred to as a metal oxide transistor, an oxide semiconductor transistor, or an OS transistor.

REFERENCE

Non-Patent Document

[Non-Patent Document 1] R. Yamamoto et al., "13.3-inch 8k4k 664-ppi 120-Hz 12-bit OLED Display Using Top-Gate Self-Aligned CAAC-OS FETs and 12-bit Source Driver Ics", SID Symposium Digest of Technical Papers, Vol. 47, 2016, pp. 53-56.

DISCLOSURE OF INVENTION

An object of one embodiment of the present invention is to provide a novel test circuit, to make it possible to perform a highly reliable test, to provide a semiconductor device having a wide range of output currents, to make it possible to adjust the value of an output current with high accuracy, and to reduce the circuit area.

Note that the description of a plurality of objects does not disturb the existence of each object. One embodiment of the present invention does not necessarily achieve all the objects listed above. Objects other than those listed above are apparent from the description of this specification and the like, and such objects could be objects of one embodiment of the present invention.

(1) One embodiment of the present invention is an IC including a plurality of pins, a plurality of current sensing circuits, and a current generation circuit. The plurality of current sensing circuits process currents flowing through the plurality of pins in parallel. The current generation circuit includes a capacitor and generates a reference current corresponding to the amount of electric charge of the capacitor. The reference current is used to test the plurality of current sensing circuits.

(2) An IC of one embodiment of the present invention includes first to K-th pins (K is an integer greater than or equal to 2), first to K-th current sensing circuits, and a current generation circuit including a first capacitor. A j-th current sensing circuit (j is an integer greater than or equal to 1 and less than or equal to N) senses a current flowing through a j-th pin. The current generation circuit generates a reference current corresponding to the amount of electric charge held by the first capacitor. The reference current is successively input to the first to K-th current sensing circuits in order to test the first to K-th current sensing circuits.

(3) The IC of the above embodiment (2) further includes a first circuit, a second circuit, a third circuit, and a wiring. The first circuit controls electrical continuity between the j-th pin and the j-th current sensing circuit. The second circuit controls input of the reference current to the wiring. The third circuit selects, from the first to K-th pins, one pin to be electrically connected to the wiring.

(4) In the IC of the above embodiment (2), the current generation circuit includes a first switch, a second switch, a first node, and a second node. A first voltage is input to a first terminal of the first capacitor. A second voltage is input to the first node. The first switch controls electrical continuity between the first node and a second terminal of the first capacitor. The second switch controls electrical continuity between the second node and the second terminal of the first capacitor. The current generation circuit outputs a current flowing through the second node as the reference current.

(5) In the IC of the above embodiment (2), the current generation circuit includes a first switch, a second switch, a first node, a second node, a third node, a first selection circuit, and a second selection circuit. A first voltage is input to a first terminal of the first capacitor. The first switch controls electrical continuity between the first node and a second terminal of the first capacitor. The second switch controls electrical continuity between the second node and the second terminal of the first capacitor. The first selection circuit selects one voltage from a plurality of voltages and inputs the selected voltage to the first node. The second selection circuit selects one node from the first node and the second node. A current flowing through the selected node is output as the reference current.

(6) In the IC of any of the above embodiments (2) to (5), each of the first to K-th current sensing circuits includes a current-voltage conversion circuit. The current-voltage conversion circuit includes an amplifier circuit, a second capacitor, and a third switch. The amplifier circuit includes an inverting input terminal, a first non-inverting input terminal, a second non-inverting input terminal, and an output terminal. A first terminal and a second terminal of the second capacitor are electrically connected to the inverting input terminal and the output terminal, respectively. The third switch controls electrical continuity between the inverting input terminal and the output terminal.

(7) In the IC of any of the above embodiments (2) to (5), each of the first to K-th current sensing circuits includes a current-voltage conversion circuit. The current-voltage conversion circuit includes an amplifier circuit, a second capacitor, and a third switch. The amplifier circuit includes an inverting input terminal, a first non-inverting input terminal, a second non-inverting input terminal, and an output terminal. The amplifier circuit amplifies a difference between a voltage of the inverting input terminal and an average voltage of voltages of the first non-inverting input terminal and the second non-inverting input terminal. A first terminal and a second terminal of the second capacitor are electrically connected to the inverting input terminal and the output terminal. The third switch controls electrical continuity between the inverting input terminal and the output terminal.

(8) In the IC of the above embodiment (6) or (7), the third switch of the current-voltage conversion circuit is controlled by a first signal pair. The current generation circuit includes a delay circuit. The delay circuit delays the first signal pair to generate a second signal pair and delays the second signal pair to generate a third signal pair. The first switch is controlled by the second signal pair. The second switch is controlled by the third signal pair.

(9) Another embodiment of the present invention is a driver IC in which the IC of any of the above embodiments (1) to (8) is provided with a driver portion. The driver portion processes an image signal input from the outside and generates a grayscale signal.

In this specification and the like, ordinal numbers such as "first", "second", and "third" may be used to show the order. Alternatively, ordinal numbers are used to avoid confusion among components in some cases. In such a case, the ordinal numbers do not limit the number of the components. For example, it is possible to replace the term "first" with the term "second" or "third" in describing one embodiment of the present invention.

A transistor has three terminals: a gate, a source, and a drain. The gate is a control terminal for controlling the on/off state of the transistor. Two terminals functioning as a source and a drain are input/output terminals of the transistor. Functions of the input/output terminals of the transistor depend on the type (n-channel type or p-channel type) and the levels of potentials applied to the terminals, and one of the two terminals functions as a source and the other functions as a drain. Therefore, the terms "source" and "drain" can be switched in this specification and the like. In this specification and the like, the two terminals other than the gate may be referred to as a first terminal and a second terminal for convenience.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential (GND) or a source potential). Thus, a voltage can be referred to as a potential and vice versa. Note that a potential has a relative value; therefore, GND does not necessarily mean 0 V.

In this specification and the like, the terms "film" and "layer" can be interchanged depending on the case or circumstances. For example, in some cases, the term "conductive film" can be used instead of the term "conductive layer", and the term "insulating layer" can be used instead of the term "insulating film".

In this specification and the like, a description "X and Y are connected" means that X and Y are electrically connected, X and Y are functionally connected, and X and Y are directly connected.

Accordingly, without being limited to a predetermined connection relationship, for example, a connection relationship shown in drawings or texts, another connection relationship is included in the drawings or the texts. Here, each of X and Y denotes an object (e.g., a device, an element, a circuit, a wiring, an electrode, a terminal, a conductive layer, or a semiconductor region).

One embodiment of the present invention can provide a novel semiconductor device or a novel method for operating the semiconductor device.

Note that the description of the plurality of effects does not preclude the existence of other effects. In one embodiment of the present invention, there is no need to obtain all the effects described above. In one embodiment of the present invention, an object other than the above objects, an effect other than the above effects, and a novel feature will be apparent from the description of the specification and the drawings.

BRIEF DESCRIPTION OF DRAWINGS

FIG. 12 is a truth table of a decoder and a correspondence table between a control signal of a switch matrix and a current sensing mode.

FIGS. 31A to 31D are diagrams each illustrating a structure example of an electronic device.

BEST MODE FOR CARRYING OUT THE INVENTION

Figure 1:
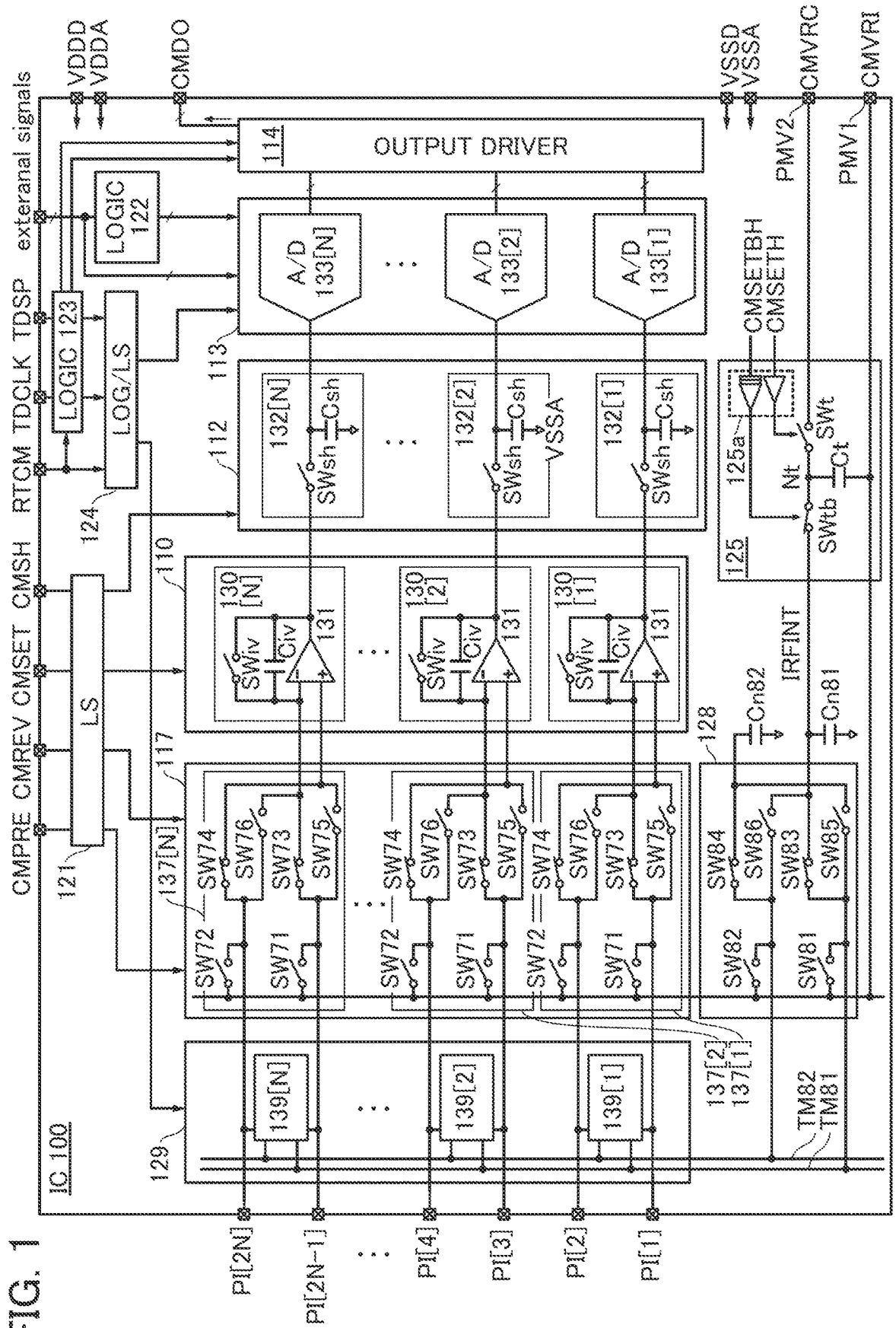
FIG. 1 is a functional block diagram illustrating a structure example of an IC.

Hereinafter, embodiments of the present invention are described. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments and the example.

Any of the embodiments described below can be combined as appropriate. In addition, in the case where a plurality of structure examples (including a manufacturing method example, an operating method example, a usage example, and the like) are given in one embodiment, any of the structure examples can be combined as appropriate, and any of the structure examples can be combined with one or more structure examples described in the other embodiments and the example.

In the drawings, the same elements, elements having similar functions, elements formed of the same material, elements formed at the same time, and the like are sometimes denoted by the same reference numerals, and the description thereof is not repeated in some cases.

When the same reference numerals are used for a plurality of elements and those elements need to be distinguished from each other, "_1", "_2", "[n]", "[m, n]", or the like may be added to the reference numerals. For example, in the case where a plurality of wirings ML are individually distinguished from each other, the wiring ML in a second column (or a second row) may be described as a wiring ML[2].

In this specification, a power supply potential VDD may be abbreviated to "potential VDD", "VDD", or the like. The same applies to other components (e.g., a signal, a voltage, a circuit, an element, an electrode, and a wiring).

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, an IC having a current sensing function is described. FIG. 1 is a functional block diagram of the IC.

An IC 100 illustrated in FIG. 1 includes a current-voltage conversion portion 110, a sample-and-hold portion 112, an analog-digital conversion portion 113, an output driver 114, a switch portion 117, a level shift (LS) portion 121, a logic portion 122, a logic portion 123, a logic/level shift (LOG/LS) portion 124, a current generation circuit 125, a switch matrix 128, a switch portion 129, a wiring TM81, a wiring TM82, a capacitor Cn81, and a capacitor Cn82.

The IC 100 includes a plurality of pins such as a pin PMV1, a pin PMV2, and 2N pins PI (N is an integer greater than or equal to 1). The number of current input channels in the IC 100 is 2N, and 2N pins PI are pins for current input.

The expression "pin PI[1]" or the like is used below to identify one of the 2N pins PI. The expression "pin PI" denotes an arbitrary pin PI. The same applies to other components. As other identification signs for identifying components, "_1", [1,2], and the like are used.

The IC 100 senses currents that flow through the pins PI of N odd-numbered channels (or N even-numbered channels) in parallel. Currents input from the N pins PI are processed in the portions 110, 112, and 113 in parallel and converted into N parallel digital data. The output driver 114 converts the N digital data into serial digital data and outputs the serial digital data to the outside as a signal CMDO. The current-voltage conversion portion 110 includes N unit circuits in order to parallelize current sensing processing. The same applies to the sample-and-hold portion 112, the analog-digital conversion portion 113, and the like. Thus, the number of unit circuits of the current-voltage conversion portion 110 is smaller than that of the pins PI.

The current-voltage conversion portion 110 includes N current-voltage conversion circuits (I/V circuits) 130. The I/V circuit 130 is formed using a current input integrating circuit and includes an amplifier circuit 131, a capacitor Civ, and a switch SWiv. The capacitor Civ is an integrating capacitor. The sample-and-hold portion 112 includes N sample-and-hold circuits (S/H circuits) 132. The S/H circuit 132 includes a capacitor Csh and a switch SWsh. The analog-digital conversion portion 113 includes N analog-digital conversion circuits (A/D circuits) 133.

The switch portion 117 includes N switch matrixes 137. The switch matrix 137 includes a switch SW71, a switch SW72, a switch SW73, a switch SW74, a switch SW75, and a switch SW76. The switches SWiv, SWsh, and SW71 to SW76 are analog switches.

A test circuit for testing the current-voltage conversion portion 110 is incorporated in the IC 100. The test circuit includes the LOG/LS portion 124, the current generation circuit 125, the switch matrix 128, the switch portion 129, the capacitor Cn81, and the capacitor Cn82.

The current generation circuit 125 generates a current IRFINT. The current IRFINT is a reference current used for testing the current-voltage conversion portion 110. The current generation circuit 125 includes a node Nt, a switch SWt, a switch SWtb, a capacitor Ct, and a delay circuit 125a.

The switch portion 129 includes the wiring TM81, the wiring TM82, and N switch circuits 139. The switch portion 129 functions as a demultiplexer (DEMUX) and selects two of the 2N pins PI to have electrical continuity with the wirings TM81 and TM82. Each of the wirings TM81 and TM82 functions as a path of the current IRFINT.

The switch matrix 128 has the same circuit structure as the switch matrix 137 and includes a switch SW81, a switch SW82, a switch SW83, a switch SW84, a switch SW85, and a switch SW86. The switch matrix 128 has functions of the DeMUX and a precharge circuit. The switch matrix 128 selects one of the wirings TM81 and TM82, to which the current IRFINT is to be output, and precharges the wiring TM81 and TM82.

A voltage VDDD, a voltage VDDA, a voltage VSSD, a voltage VSSA, a voltage CMVRI, and a voltage CMVRC are input to the IC 100. Each of the voltages VDDD and VDDA is a high-level-side power supply voltage. Each of the voltages VSSD and VS SA is a low-level-side power supply voltage and is, for example, a ground potential. Each of the voltages VDDD and VSSD is a power supply voltage for a digital circuit. Each of the voltages VDDA and VS SA is a power supply voltage for an analog circuit. The pin PMV1 is a pin for inputting a voltage CMVRI. The pin PMV2 is a pin for inputting a voltage CMVRC.

A variety of signals such as a signal CMPRE, a signal CMREV, a signal CMSET, a signal CMSH, a signal RTCM, a signal TDCLK, and a signal TDSP are input to the IC 100.

The signals CMPRE, CMREV, CMSET, and CMSH are input to a level shift portion 121. The level shift portion 121 is a circuit for converting a digital signal into a signal for an analog circuit, converts a digital signal into a differential signal, and shifts the level of the differential signal. In this specification and the like, reference numerals in which "H" or "BH" is added to the symbols used for a digital signal are used as symbols for such a differential signal. For example, a pair of differential signals that correspond to the signal CMPRE is represented by "CMPREH" and "CMPREBH". The signal CMPREH is a signal with the same logic as the signal CMPRE, and the signal CMPREBH is an inverted signal of the signal CMPRH.

The signal CMPRE is a signal that controls precharge of the pin PI. The signal CMREV is a signal that specifies whether the channel for which a current is sensed is an odd-numbered channel or an even-numbered channel. The signal CMSET is a control signal for offset cancellation of the I/V circuit 130. The signal CMSH is a control signal for sampling operation of the S/H circuit 132.

The signal CMPREH, the signal CMPREBH, the signal CMREVH, and the signal CMREVBH are input to the switch portion 117 and the switch matrix 128. The signal CMSETH and the signal CMSETBH are input to the current-voltage conversion portion 110 and the current generation circuit 125. The signal CMSHH and the signal CMSHBH are input to the S/H portion 112.

The logic portion 122 processes an external signal and generates a control signal for the analog-digital conversion portion 113. Control signals are input from the logic portion 122 and the outside to the analog-digital conversion portion 113.

The signals RTCM, TDCLK, and TDSP are input to the logic portion 123. The signal RTCM is a signal for determining the operation mode of the IC 100. The operation mode of the IC 100 is roughly classified into a current sensing mode in which currents flowing through the pins PI are sensed and a test mode in which the operation of an internal circuit is verified. The test mode is executed in pre-shipment inspection of the IC 100, for example.

The logic portion 123 outputs the signal TDSP and the signal TDCLK to one of the output driver 114 and the LOG/LS portion 124 in accordance with the signal RTCM. The signal TDSP is a start pulse signal, and the signal TDCLK is a clock signal. The output driver 114 converts N digital signals output from the analog-digital conversion portion 113 into a serial digital signal and outputs the signal CMDO in accordance with the signals TDCLK and TDSP. The signals RTCM, TDCLK, and TDSP are input to the LOG/LS portion 124. The LOG/LS portion 124 processes the input signals to generate control signals for the analog-digital conversion portion 113 and the switch portion 129.

<<Current Sensing Circuit>>

Figure 2:
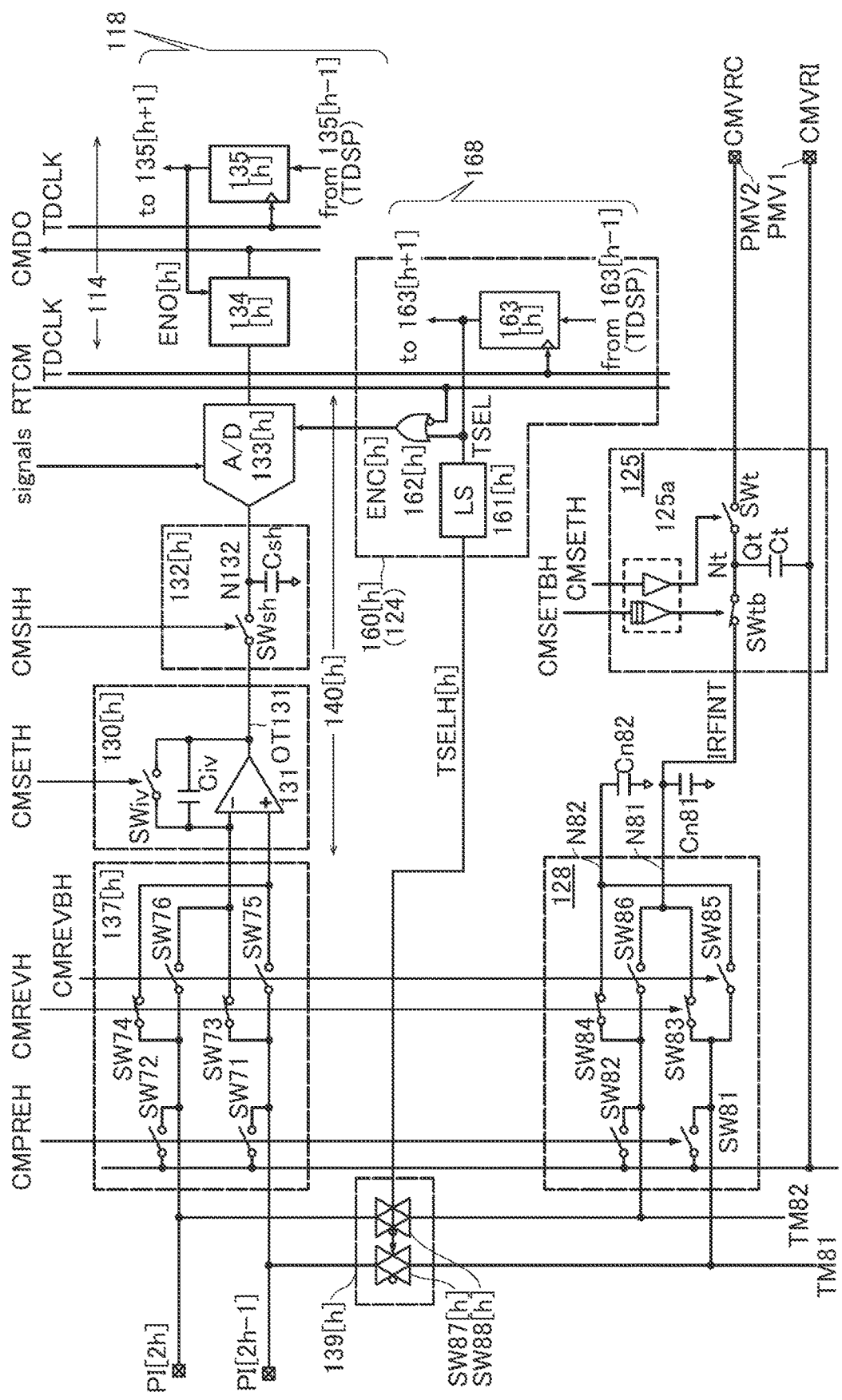
FIG. 2 is a circuit diagram illustrating a structure example of a unit circuit of a current sensing circuit.

In the IC 100, one current sensing circuit is provided for two input channels. FIG. 2 illustrates a unit circuit of the current sensing circuit and a structure example of a circuit used for a test of the unit circuit.

Note that although the signals CMSETH and CMSETBH are input from the level shift portion 121 to the switch SWiv, FIG. 2 illustrates only the signal CMSETH with which the switch SWiv is turned on when the signal CMSET is at a high level ("H"). The same applies to signals input to switches in FIG. 2 and other drawings.

The unit circuit of the current sensing circuit includes the I/V circuit 130, the S/H circuit 132, and the A/D circuit 133. The unit circuit is referred to as a CM circuit 140 for convenience. The CM circuit 140[$h$] ($h$ is an integer greater than or equal to 1 and less than or equal to N) senses currents flowing through a pin PI[2$h$−1] and a pin PI[2$h$]. The switch matrix 137[$h$] selects the pin PI that is targeted to be monitored by the CM circuit 140[$h$]. A circuit structure example of the switch matrix 137[$h$] is described below.

The switch SW71 controls electrical continuity between the pin PI[2$h$−1] and the pin PMV1. The switch SW72 controls electrical continuity between the pin PI[2$h$] and the pin PMV1. The on/off of the switch SW71 and the switch SW72 is controlled by the signals CMPREH and CMPREBH.

The switch SW73 controls electrical continuity between the pin PI[2$h$−1] and an inverting input terminal (hereinafter referred to as a terminal INM) of an amplifier circuit 131[$h$]. The switch SW74 controls electrical continuity between the pin PI[2$h$] and a non-inverting input terminal (hereinafter referred to as a terminal INP) of the amplifier circuit 131[$h$]. The switch SW75 controls electrical continuity between the pin PI[2$h$−1] and the terminal INP) of the amplifier 131[$h$]. The switch SW76 controls electrical continuity between the pin PI[2$h$] and the terminal INM of the amplifier circuit 131[$h$]. The on/off of the switches SW73 to SW76 is controlled by the signals CMREVH and CMREVBH.

In the output driver 114, N buffer circuits 134 and N registers 135 are provided. An N-stage shift register 118 is formed of the N registers 135. The signal TDCLK is input to the N registers 135. The signal TDSP is input to the register 135[1] in a first stage. To the register 135[$h$] in any of second and subsequent stages, an output signal of the register 135[$h$−1] in the previous stage is input.

An output signal of the register 135[$h$] is input to the buffer circuit 134[$h$] as a signal ENO[h]. The signal ENO[h] is an output enable signal of the buffer circuit 134[$h$]. A digital signal generated in the A/D circuit 133[$h$] is input to the buffer circuit 134[$h$]. The buffer circuit 134[$h$] outputs the digital signal in accordance with the signal ENO[h]. The shift register 118 controls timings at which the N buffer circuits 134 output digital signals, whereby the serial signal CMDO is output to the outside of the IC 100.

The switch circuit 139[$h$] includes a switch SW87[$h$] and a switch SW88[$h$]. The switch SW87[$h$] controls electrical continuity between the pin PI[2$h$−1] and the wiring TM81. The switch SW88[$h$] controls electrical continuity between the pin PI[2$h$] and the wiring TM82.

The LOG/LS portion 124 includes N circuits 160. The circuit 160 generates a signal ENC, a signal TSELH, and a signal TSELBH. The signal ENC is an enable signal of the A/D circuit 133. The signals TSELH and TSELBH are control signals for the switches SW87 and SW88.

The circuit 160 includes a level shifter 161, an OR circuit 162, and a register 163. An N-stage shift register 168 is formed of N registers 163. The signal TDCLK is input to the N registers 163. The signal TDSP is input to the register 163[1] in a first stage. To the register 163[$h$] in any of second and subsequent stages, an output signal of the register 163[$h$−1] is input.

An output signal of the register 163[$h$] is input to the register 163[$h$+1] and input to the OR circuit 162[$h$] and the level shifter 161[$h$] as the signal TSEL[h]. The OR circuit 162[$h$] obtains a logical sum of a signal RTCMB (an inversion signal of the signal RTCM) and the signal TSEL[h] and generates the signal ENC[h]. The level shifter 161[$h$] converts the signal TSEL[h] into a differential signal and shifts the level of the differential signal to generate the signals TSELH[h] and TSELBH[h].

The switch matrix 128 includes a node N81 and a node N82. A capacitor Cn81 and a capacitor Cn82 are electrically connected to the node N81 and the node N82, respectively. The current IRFINT is input from the current generation circuit 125 to the node N81.

The switch SW81 controls electrical continuity between the wiring TM81 and the pin PMV1. The switch SW82 controls electrical continuity between the wiring TM82 and the pin PMV1. The on/off of the switch SW81 and the switch SW82 is controlled by the signals CMPREH and CMPREBH. The switch SW83 controls electrical continuity between the wiring TM81 and the node N81. The switch SW84 controls electrical continuity between the wiring TM82 and the node N82. The switch SW85 controls electrical continuity between the wiring TM81 and the node N82. The switch SW86 controls electrical continuity between the wiring TM82 and the node N81. The on/off of the switches SW83 to SW86 is controlled by the signals CMREVH and CMREVBH.

<<Current Generation Circuit>>

Figure 3:
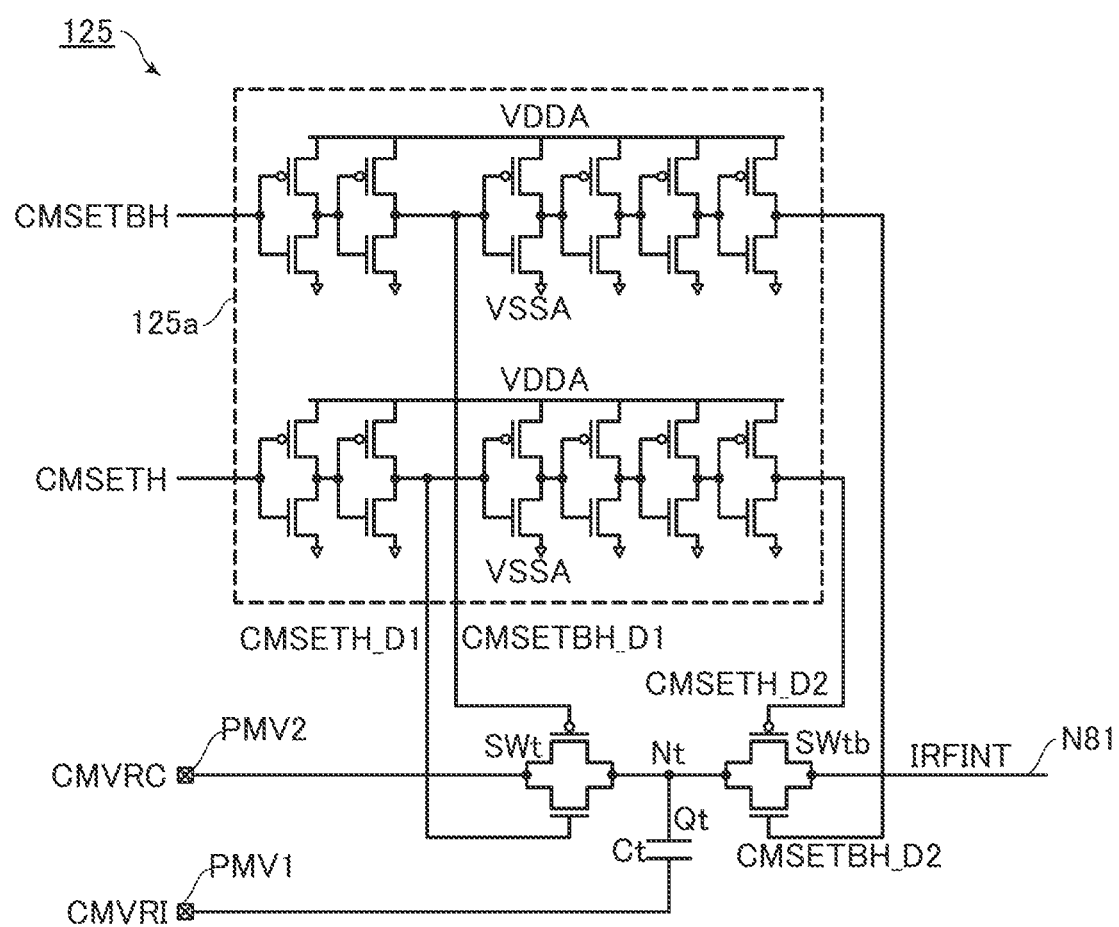
FIG. 3 is a circuit diagram illustrating a structure example of a current generation circuit.

FIG. 3 illustrates a circuit structure example of the current generation circuit 125.

As illustrated in FIG. 3, the delay circuit 125$a$ is formed of 12 CMOS inverter circuits. The delay circuit 125$a$ delays the signals CMSETH and CMSETBH to generate a signal CMSETH_D1 and a signal CMSETBH_D1 and delays the signals CMSETH_D1 and CMSETBH_D1 to generate a signal CMSETH_D2 and a signal CMSETBH_D2. The signals CMSETH_D1 and CMSETBH_D1 control the on/off of the switch SWt. The signals CMSETH_D2 and CMSETBH_D2 control the on/off of the switch SWtb.

The capacitor Ct is electrically connected to the node Nt and the pin PMV1. The switch SWt controls electrical continuity between the pin PMV2 and the node Nt. The switch SWtb controls electrical continuity between the node Nt and the node N81. The switches SWt an SWtb are exclusive to each other. When one of the switches SWt and SWtb is in an on state, the other is in an off state. The states of the switches SWt and SWtb are determined by the signal CMSET. The timings of switching of the switches SWt and SWtb are made different from each other by the delay circuit 125$a$. First, the switch SWt is changed from the on state to the off state. Subsequently, the switch SWtb is changed from the off state to the on state.

The capacitor Ct is charged while the switch SWt is in the on state and the switch SWtb is in the off state. The amount of electric charge Qt of the capacitor Ct is Ct|CMVRC−CMVRI|. The capacitor Ct is discharged while the switch SWt is in the off state and the switch SWtb is in the on state, and the current IRFINT corresponding to the amount of electric charge Qt flows through the node N81. Whether the current IRFINT is a source current or a sink current with respect to the node N81 depends on the magnitude relation between a voltage CMVRC and a voltage CMVRI.

The current generation circuit 125 generates the current IRFINT using the capacitor Ct and the two switches SWt and SWtb that controls charge and discharge of the capacitor Ct. The value of the current IRFINT can be controlled by the voltages CMVRI and CMVRC.

Accordingly, as the current IRFINT, a minute current (e.g., lower than or equal to several tens of nanoamperes) can be generated with high accuracy, and the value of the current IRFINT can be adjusted with high accuracy.

In some cases, many resistors are used in a current generation circuit in order to enable generation of a minute current and fine adjustment of the current value. Such a current generation circuit has a large area and thus is not suitable for a test circuit incorporated in an IC. The test circuit becomes unnecessary after shipment of the IC and thus is required to have a small area. The current generation circuit 125 does not include a resistor and is formed using a CMOS circuit and a capacitor, and thus an increase in the area of the IC 100 due to incorporation of the current generation circuit 125 can be prevented.

<<Current Sensing Mode>>

Figure 4A:
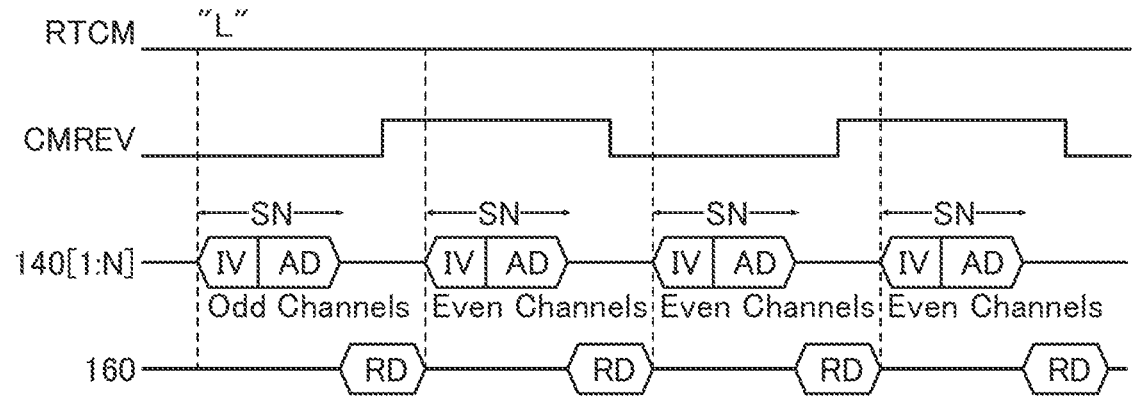
FIG. 4A is a timing chart showing an example of an operation in a current sensing mode.

FIG. 4A shows an example of an operation sequence of the IC 100 in the current sensing mode. The signal RTCM at a low level ("L") is input to the IC 100 in order to bring the operation mode of the IC 100 to the current sensing mode. The LOG/LS portion 124 outputs the signals TDSP and TDCLK to the circuit 160 while the signal RTCM is at "L". Accordingly, in the current sensing mode, the signal ENC is kept at "H", and thus the A/D circuit 133 is always in an active state.

The operation sequence is roughly classified into a sensing (SN) sequence and a reading (RD) sequence. The SN sequence includes a current-voltage (IV) conversion sequence and a digital-analog conversion (AD) sequence. In the case where currents for N odd-numbered channels are sensed, the signal CMREV at "L" is input to the IC 100. In the case where current sensing of N even-numbered channels is performed, the signal CMREV at "H" is input to the IC 100.

In the IV sequence, the CM circuits 140[1] to 140[N] convert currents flowing through the target pins PI into voltages. In the AD sequence, the CM circuits 140[1] to 140[N] convert the voltages (analog data) obtained in the IV sequence into digital data. In the RD sequence, the digital data obtained by the CM circuits 140[1] to 140[N] is sequentially read by the output driver 114.

Figure 4B:
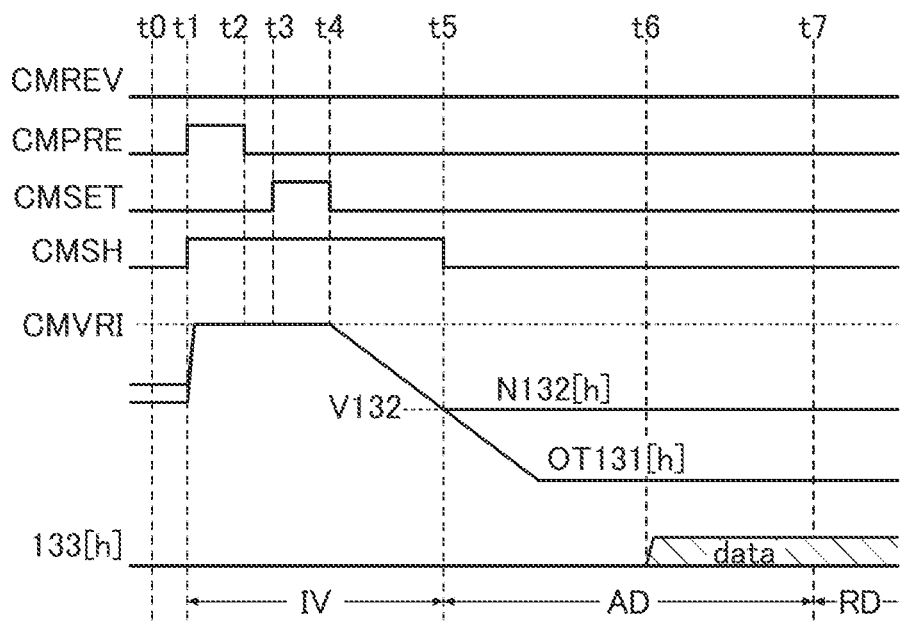
FIG. 4B is a timing chart showing an example of an IV sequence and an AD sequence.

An operation example of the CM circuit 140[$h$] in the IV sequence and the AD sequence is described with reference to FIG. 4B, FIGS. 5A to 5E, and the like. FIG. 4B is a timing chart of the CM circuit 140[$h$], where t0, t1, and the like represent the time. FIGS. 5A to 5E are circuit diagrams for describing the operation example of the CM circuit 140[$h$].

<IV Sequence>

Figure 5A:
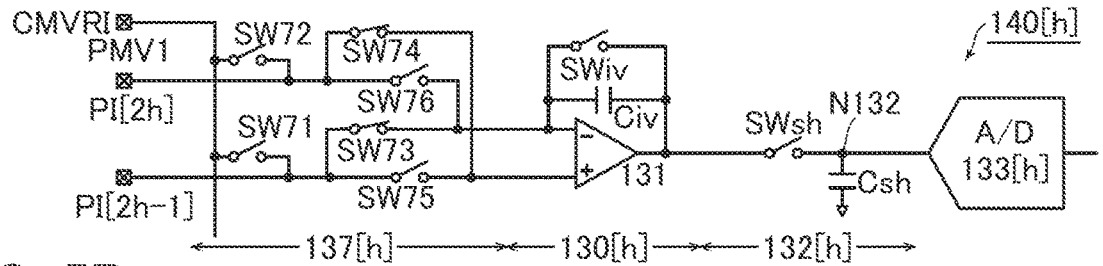
FIGS. 5A to 5E are circuit diagrams for describing an operation example in a current sensing mode.
Figure 5B:
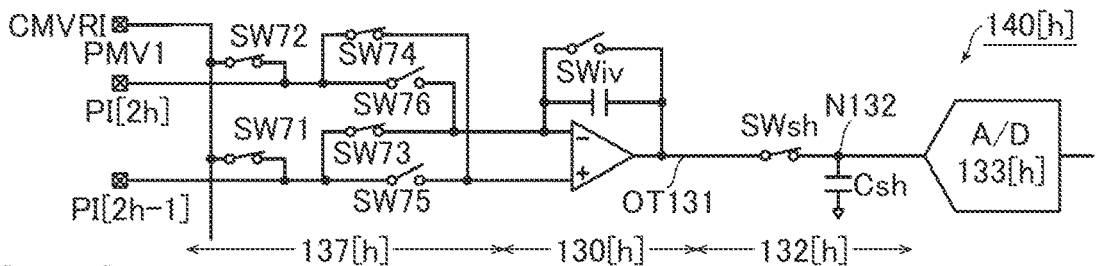
Figure 5C:
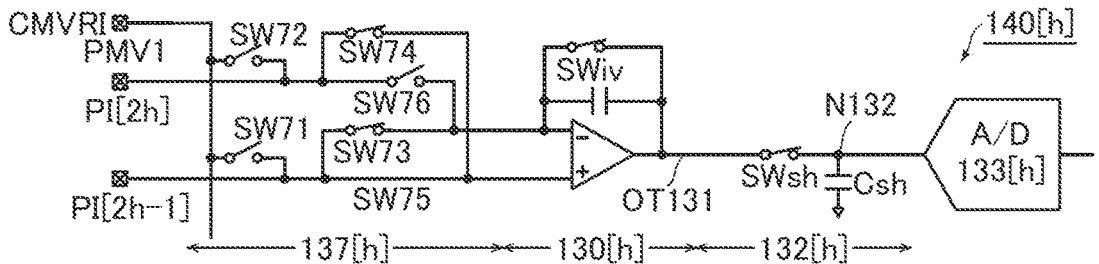
Figure 5D:
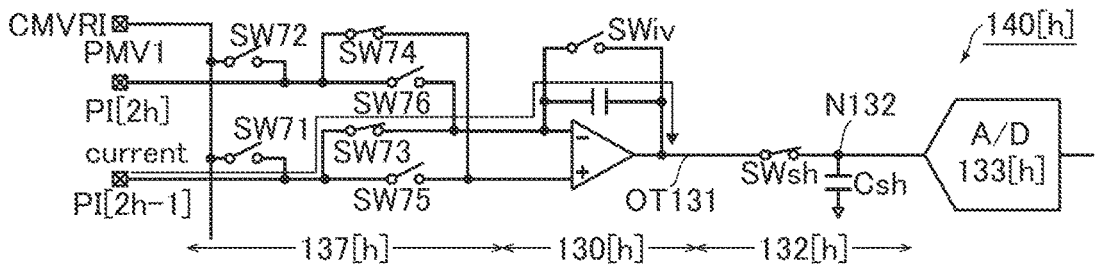
Figure 5E:
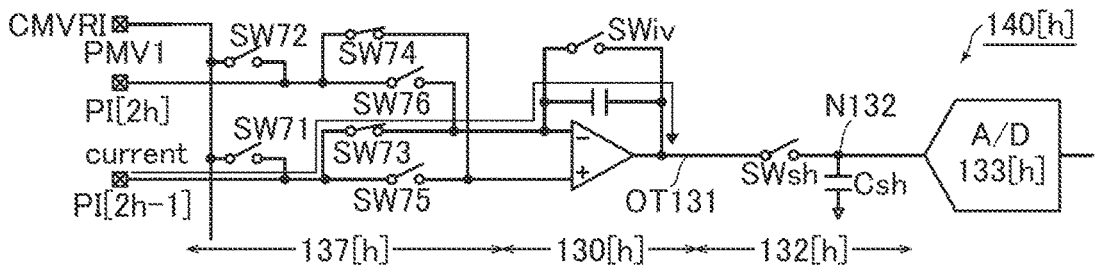

At the time t0, the signal CMREV is at "L", and thus in the switch matrix 137[$h$], the switches SW73[$h$] and SW74[$h$] are in an on state, and the switches SW75[$h$] and SW76[$h$] are in an off state (see FIG. 5A). Accordingly, the pin PI[2$h$−1] and the terminal INM[h] in the amplifier circuit 131[$h$] are electrically connected to each other, and the pin PI[2$h$] and the terminal INP[h] in the amplifier circuit 131[$h$] are electrically connected to each other.

(Precharge)

In a period from t1 to t2, 2N pins PI are precharged. When the signal CMPRE becomes "H", the switches SW71[$h$] and SW72[$h$] are turned on (see FIG. 5B). Accordingly, the pins PI[2$h$−1] and PI[2$h$] are electrically connected to the pin PMV1 and precharged to the voltage CMVRI. In addition, the terminals INM[h] and INP[h] are precharged to the voltage CMVRI.

At the time t1, the signal CMSH becomes "H", and thus the switch SWsh[h] is turned on. An output terminal of the amplifier circuit 131[$h$] (hereinafter referred to as a "terminal OT131[$h$]") and a node N132[$h$] of the S/H circuit 132[$h$] are electrically connected to each other.

(Offset Cancellation)

In a period from t3 to t4, offset cancellation for correction of the offset voltage of the I/V circuit 130 is performed. At t3, the signal CMSET becomes "H", and thus the switch SWiv[h] is turned on. The terminal INM[h] and the output terminal OT131[$h$] are electrically connected to each other, whereby the offset voltage of the amplifier circuit 131[$h$] is corrected.

(Current-Voltage Conversion)

In a period from t4 to t5, the I/V circuit 130 converts a current flowing through the terminal INM into a voltage, and the S/H circuit 132 performs a sampling operation.

At t4, the signal CMSET becomes "L". The switch SWiv[h] is turned off, and the I/V circuit 130[$h$] starts an integrating operation. By the integrating operation of the I/V circuit 130[$h$], the voltage of the output terminal OT131[$h$] is decreased.

Since the terminal INP[h] is electrically connected to the pin PI[2$h$], the amplifier circuit 131[$h$] is operated as a differential amplifier circuit. Accordingly, the amplifier circuit 131[$h$] cancels the common mode noise of the pin PI[2$h$−1] and the common mode noise of the pin PI[2$h$], and thus the signal-to-noise ratio (SNR) of an output signal of the I/V circuit 130[$h$] can be improved.

<AD Sequence>

The signal CMSH becomes "L" at t5, the IV sequence is terminated, and the AD sequence is started. In the S/H circuit 132[$h$], the switch SWsh[h] is turned off, and thus a voltage V132 of the output terminal OT131[$h$] at t5 is held (see FIG. 5E). The voltage V132 corresponds to the amount of the current flowing through the terminal INM[h] in the period from t4 to t5. At t6, the A/D circuit 133[$h$] converts the voltage V132 into digital data and outputs the digital data to the buffer circuit 134[$h$] of the output driver 114.

<RD Sequence>

Figure 4C:
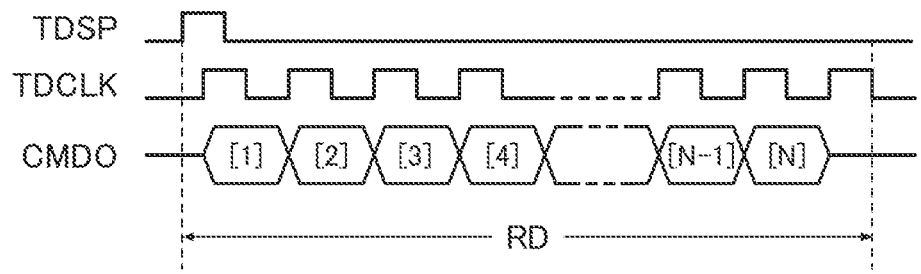
FIG. 4C is a timing chart showing an example of an RD sequence.

FIG. 4C is a timing chart showing an example of the RD sequence. When the signal TDSP is input to the output driver 114, the RD sequence is started. In the shift register 118 of the output driver 114, a shift operation of the signal TDSP is performed in response to a rise in the signal TDCLK, and the digital data is sequentially output from the buffer circuits 134[1] to 134[N].

The signal CMREV is set to "H" while the RD sequence is executed, the channels that are targeted to be monitored are changed from the odd-numbered channels to the even-numbered channels. By the switch matrix 137[$h$], the terminal INM[h] of the amplifier circuit 131[$h$] and the terminal INP[h] of the amplifier circuit 131[$h$] are electrically connected to the pin PI[2$h$] and the pin PI[2$h$−1].

<<Test Mode>>

Figure 6A:
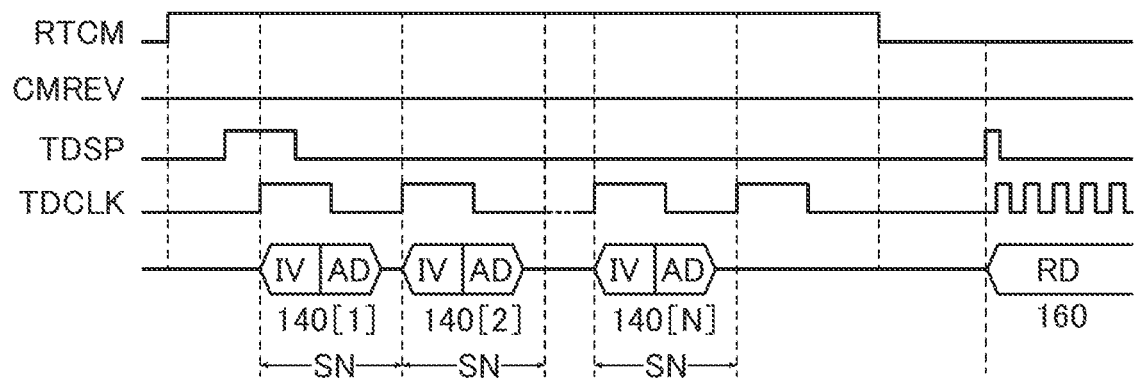
FIG. 6A is a timing chart showing an example of an operation in a test mode.
Figure 6B:
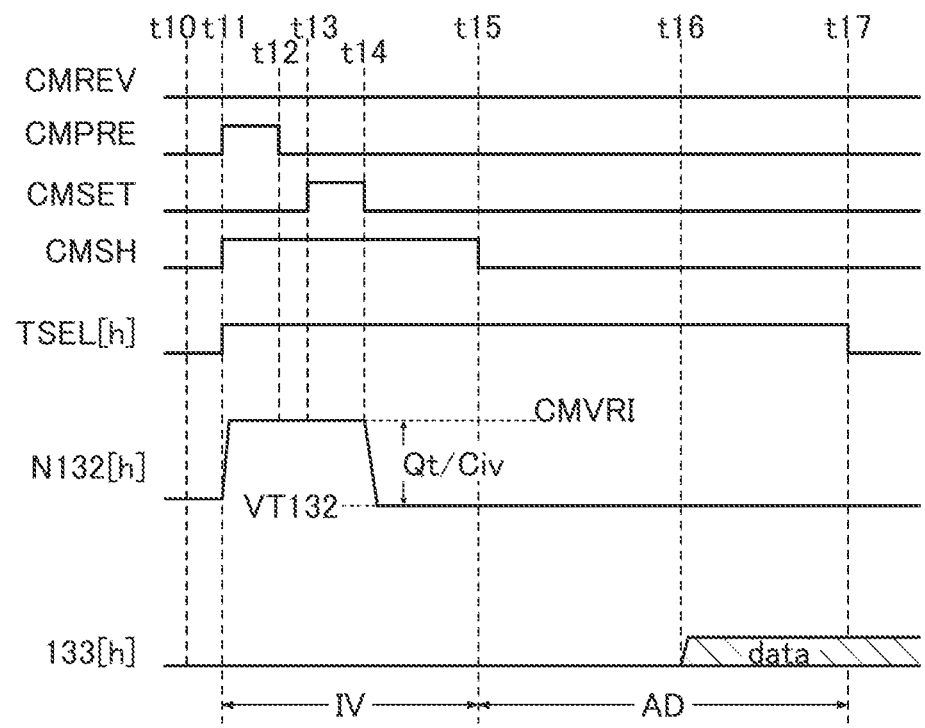
FIG. 6B is a timing chart showing an example of an IV sequence and an AD sequence.

In the test mode, the current IRFINT generated in the current generation circuit 125 is successively input to the CM circuits 140[1] to 140[N], whereby one unit of the CM circuit 140 is tested at a time. FIG. 6A shows an example of the operation sequence of the IC 100 in the test mode.

The signal RTCM at "H" is input to the IC 100 in order to bring the operation mode of the IC 100 to the test mode.

The logic portion 123 outputs the signals TDSP and TDCLK to the LOG/LS portion 124 while the signal RTCM is at "H". The signal CMREV is "L" in order to input the current IRFINT to the terminal INM of the amplifier circuit 131.

The shift register 168 of the LOG/LS portion 124 performs a shift operation of the signal TDSP in accordance with the signal TDCLK to generate the signals TSEL[1] to TSEL[N]. The CM circuits 140[1] to 140[N] are sequentially selected by the signals TSEL[1] to TSEL[N]. The selected CM circuit 140 executes the IV sequence and the AD sequence described above.

After the SN sequence by the CM circuit 140[N], the signal RTCM is set to "L" for execution of the RD sequence. As described above, the output driver 114 is operated in accordance with the signals TDSP and TDCLK, and thus the signal CMDO is output from the IC 100.

The operation of the CM circuit 140 in the test mode is similar to the operation in the current sensing mode. The CM circuit 140 is operated as shown in the timing chart in FIG. 4B. The test mode is different from the current sensing mode in that the current IRFINT is input to the selected CM circuit 140 while the IV sequence is performed. The IV sequence and the AD sequence of the CM circuit 140[$h$] in the test mode are described with reference to FIG. 2, FIGS. 5A to 5D, FIG. 6B, and the like.

<IV Sequence>

At t10, the signal CMREV is at "L". The switches SW73[$h$] and SW74[$h$] are in an on state, and the switches SW75[$h$] and SW76[$h$] are in an off state (see FIG. 5A). In the switch matrix 128, the switches SW83 and SE84 are in an on state, and the switches SW85 and SW86 are in an off state.

At t11, the register 163[$h$] outputs the signal TSEL[h] at "H". The A/D circuit 133[$h$] is activated. By the switch matrix 128, the switch circuit 139[$h$], and the switch matrix 137[$h$], the pin PI [2h−1] is electrically connected to the wiring TM81 and the terminal INM[h], and the pin PI[2h] is electrically connected to the wiring TM82 and the terminal INP[h].

(Precharge)

In a period from t11 to t12, the pin PI[2h−1], the pin PI[2h], the wiring TM81, and the wiring TM82 are precharged. When the signal CMPRE becomes "H", the switches SW71[$h$], SW72[$h$], SW81, and SW82 are turned on. The pin PI[2h−1], the pin PI[2h], the wiring TM81, and the wiring TM82 are electrically connected to the pin PMV1, and thus the pin PI[2h−1], the pin PI[2h], the wiring TM81, the wiring TM82, the terminal INM[h], the terminal INP[h], and the node Nt are precharged to the voltage CMVRI. The amount of electric charge Qt of the capacitor Ct in the current generation circuit 125 is 0 coulombs.

The signal CMSH becomes "H" at t11, and thus the switch SWsh[h] is turned on. The output terminal OT131[h] of the amplifier circuit 131[$h$] and the node N132[$h$] are electrically connected to each other.

(Offset Cancellation)

In a period from t13 to t14, offset cancellation in which the offset voltage of the I/V circuit 130[$h$] is corrected is performed. The signal CMSET is at "H", and thus the switch SWiv[h] is turned on, so that the terminal INM[h] and the output terminal OT131[$h$] are electrically connected to each other.

In a period from t13 to t14, the capacitor Ct of the current generation circuit 125 is charged. With a delay of a certain period from the time when the signal CMSET becomes "H", the switch SWt is turned on. Subsequently, the switch SWtb is turned off with a delay of a certain period. The capacitor Ct is charged, and the amount of electric charge Qt is (CMVRC−CMVRI)Ct. Here, CMVRC>CMVRI is satisfied.

(Current-Voltage Conversion and Sampling)

In a period from t14 to t15, the current generation circuit 125 generates and outputs the current IRFINT. The I/V circuit 130 converts the current flowing through the terminal INM into a voltage, and the S/H circuit 132 performs a sampling operation.

The signal CMSET becomes "L" at t14, and thus the switch SWiv[h] is turned off. The I/V circuit 130[$h$] starts an integrating operation using the voltage of the terminal INP[h] as a reference voltage.

With a delay of a certain period from the time when the signal CMSET becomes "L", the switch SWt is turned off. Subsequently, the switch SWtb is turned on with delay of a certain period. The current IRFINT is generated by electric charge accumulated in the capacitor Ct to be output. The current IRFINT is input to the terminal INM[h] through the wiring TM81. The I/V circuit 130[$h$] integrates the current IRFINT and converts the current IRFINT into a voltage. The voltage VT132 of the node N132[$h$] is CMVRI−Qt/Civ.

<AD Sequence>

The signal CMSH becomes "L" at t15, the IV sequence is terminated, and the AD sequence is started. In the S/H circuit 132[$h$], the switch SWsh[h] is turned off, and thus the voltage VT132 of the output terminal OT131[$h$] is held. At t16, the A/D circuit 133[$h$] converts the voltage VT132 into digital data and outputs the digital data to the buffer circuit 134[$h$]. The signal TSEL[h] becomes "L" at t17, and thus the AD sequence is terminated.

In the IC 100, the reference current used for a test is internally generated, and thus highly reliable pre-shipment inspection can be performed on a plurality of current sensing circuits. As another method of the pre-shipment inspection, a method in which a reference current is generated by a current generation device provided outside the IC, and the reference current is sequentially input to a plurality of current sensing circuits can be given. For the following reason, it is difficult to evaluate the plurality of current sensing circuits accurately by this method.

As the value of the reference current becomes smaller, a current-voltage conversion circuit is likely to be influenced by noise. When the reference current is lower than or equal to several tens of nanoamperes, for example, it becomes very difficult to evaluate the current-voltage conversion circuit. Although the current generation device is used as an ideal current source, it is difficult to input the reference current stably from the outside to a circuit whose input impedance is changed, such as the I/V circuit 130.

Accordingly, in the case where the value of the reference current is small, the reference current is preferably generated in the IC for highly reliable inspection. In this case, the current generation circuit is required to have a small circuit area, generate a minute current (e.g., a current lower than or equal to several tens of nanoamperes), and perform adjustment with high accuracy (e.g., adjustment in several nanoamperes). The current generation circuit 125 in this embodiment satisfies these requirements.

Although many resistors are used in order to generate a minute current in some cases, the current IRFINT is generated using two switches and one capacitor in the current generation circuit 125. The value of the current IRFINT can be controlled by the voltages CMVRI and CMVRC and thus can be adjusted with high accuracy.

When the current generation circuit 125 is incorporated in the IC 100, the plurality of CM circuits 140 can be tested with high accuracy. When the current generation circuit 125 has a small area, the area overhead of the IC 100 which is caused by incorporation of the test circuit can be suppressed.

Embodiment 2

In this embodiment, a source driver IC using the test circuit of Embodiment 1 is described.

Figure 7:
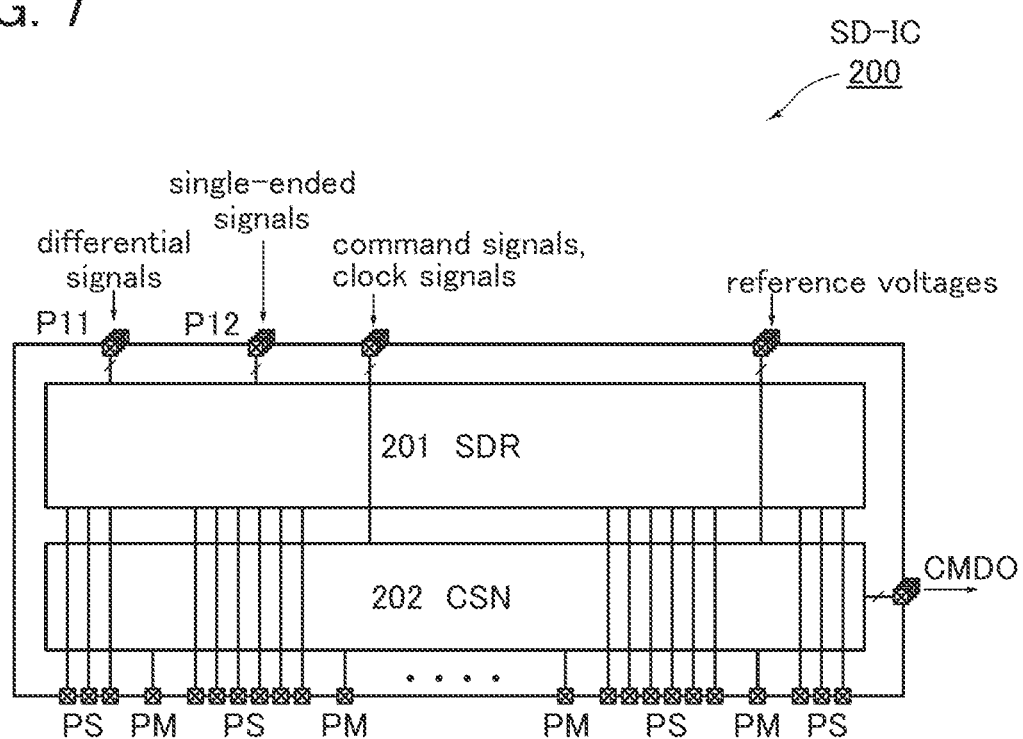
FIG. 7 is a functional block diagram illustrating a structure example of a source driver IC (SD-IC).

FIG. 7 is a functional block diagram illustrating a structure example of the source driver IC. A source driver IC 200 (hereinafter, referred to as an "SD-IC 200") illustrated in FIG. 7 includes a source driver portion 201 (hereinafter, referred to as an "SDR portion 201"), a current sensing portion (hereinafter, referred to as a "CSN portion 202"), and a plurality of pins PS, PM, P11, and P12.

The SD-IC 200 is mounted on a display panel including a pixel array. The SDR portion 201 processes an image signal and generates a grayscale signal that is to be supplied to the pixel array. The pins PS are pins for outputting the grayscale signal. The pins P11 and P12 are input pins for the SDR portion 201. The pins P11 are input pins of a differential signal and the pins P12 are input pins of a single-ended signal. The input signals of the pins P11 include an image signal, a clock signal, and the like. The input signals of the pins P12 include a command signal and the like.

The CSN portion 202 is a circuit for sensing a current flowing through the pixel array. The number of input channels of the CSN portion 202 is 2N (N is an integer greater than or equal to 1), and 2N pins PM[1] to PM[2N] are connected. The CSN portion 202 processes currents (analog signals) flowing through the pins PM of N odd-numbered (or even-numbered) channels in parallel, generates a serial digital signal (a signal CMDO), and outputs the signal. The signal CMDO is used to correct the grayscale signal, whereby luminance unevenness of the display panel can be reduced.

<SDR Portion 201>

Figure 8:
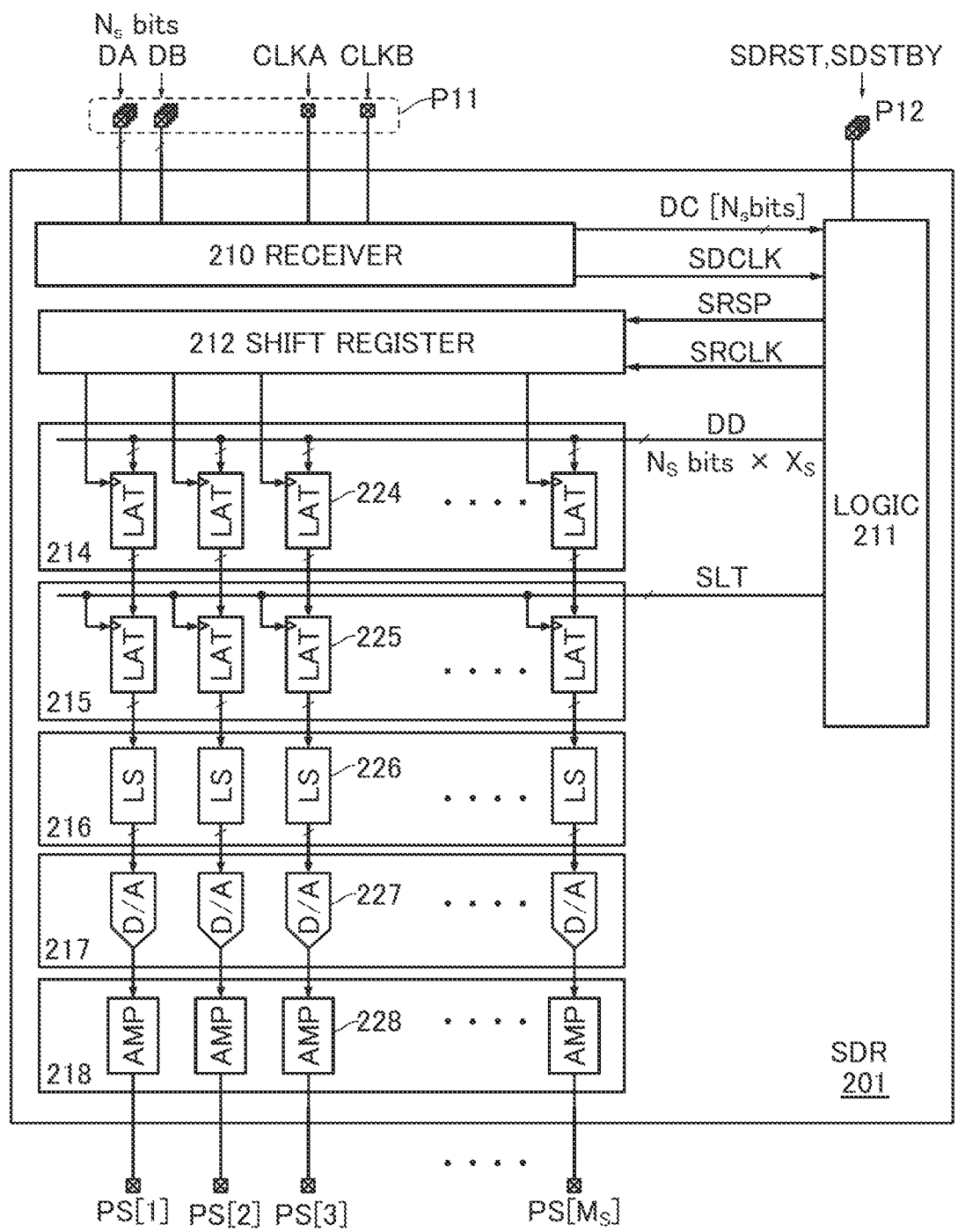
FIG. 8 is a functional block diagram illustrating a structure example of a source driver (SDR) portion.

FIG. 8 is a functional block diagram illustrating a structure example of the SDR portion 201. The SDR portion 201 includes a receiver 210, a logic portion 211, a shift register 212, latch portions 214 and 215, a level shift portion 216, a digital-analog conversion portion (D/A portion) 217, and an amplifier portion 218. In the example in FIG. 8, the number of pins PS is Ms (Ms is an integer greater than or equal to 1).

To perform the parallel processing, the portions 214 to 218 are each formed of Ms unit circuits. The latch portion 214 includes Ms latch circuits (LAT) 224. The latch portion 215 includes Ms latch circuits 225. The level shift portion 216 includes Ms level shift circuits (LS) 226. The D/A portion 217 includes Ms digital-analog conversion circuits (D/A circuits) 227. The amplifier portion 218 includes Ms amplifier circuits (AMP) 228.

The receiver 210 converts the differential signal input to the pins P11 into a single-ended signal. For example, a low voltage differential signaling (LVDS) receiver can be used as the receiver 210.

Image signals DA and DB and clock signals CKLA and CLKB are input to the receiver 210. A signal pair formed of an $N_S$-bit image signal DA ($N_S$ is an integer greater than or equal to 1) and an $N_S$-bit image signal DB is a differential image signal. A signal pair formed of a signal CLKA and a signal CLKB is a differential clock signal. In the receiver 210, the image signals DA and DB are converted into a single-ended $N_S$-bit image signal DC, and the clock signals CLKA and CLKB are converted into a single-ended signal SDCLK. The image signal DC and the signal SDCLK are each input to the logic portion 211.

For example, a reset signal SDRST, a standby signal SDSTBY, and the like are input to the pins P12. The logic portion 211 controls an internal circuit of the SDR portion 201 in accordance with the signal SDCLK, a command signal input from the pins P12, and the like. In the case where the command signal is a differential signal, the command signal is input to the logic portion 211 through the receiver 210.

The logic portion 211 generates control signals such as signals SRSP, SRCLK, and SLT. The signals SRSP and SRCLK are a start pulse signal and a clock signal, respectively, and input to the shift register 212. The signal SLT is a latch signal and input to the latch portion 215.

The logic portion 211 converts the serial image signal DC into a parallel image signal DD (serial-to-parallel conversion function). Here, the logic portion 211 divides the image signal DC into $X_S$ parts ($X_S$ is an integer greater than or equal to 1) to generate $X_S$ image signals DD ($N_S$ bits). The image signals DD are output to the latch portion 214. The value of the image signals DD expresses a grayscale value.

The shift register 212 includes registers in a plurality of stages. The signal SRSP is input to a register in a first stage. The register in each stage outputs a sampling signal in accordance with the signal SRCLK. The latch portion 214 stores the image signal DD in the latch circuit 224 in a column specified by the sampling signal. The latch portion 215 rewrites data in each latch circuit 225 to data of the corresponding latch circuit 224 in accordance with the signal SLT.

The level shifters 226 convert the image signals output from the latch circuits 225 into differential signals and shift the level of the signals. The D/A circuits 227 convert the differential signals output from the level shifters 226 into analog signals. The amplifier circuits 228 amplify the output signals (analog signals) of the D/A circuits 227 and output the signals to the pins PS. The output signals of the pins PS are grayscale signals.

<CSN Portion 202>

Figure 9:
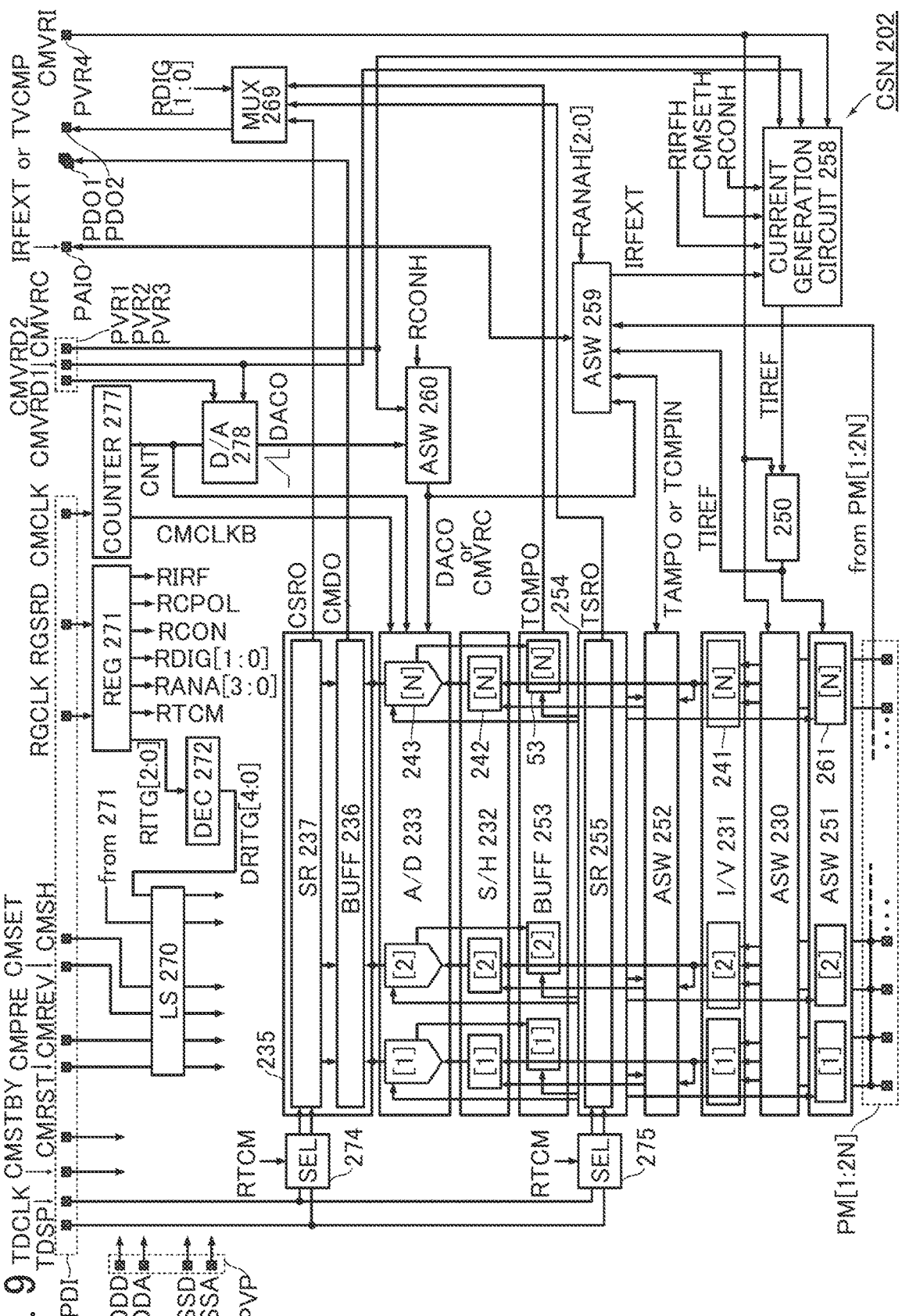
FIG. 9 is a functional block diagram illustrating a structure example of a current sensing (CSN) portion.

FIG. 9 is a functional block diagram illustrating a structure example of the CSN portion 202.

The pins PM[1] to PM[2N] and pins PVP, PDI, PVR1 to PVR4, PDO1, PDO2, and PAIO are electrically connected to the CSN portion 202.

The pins PVP are input pins of power supply voltages VDDD, VDDA, VSSD, and VSSA. The pins PVR1 to PVR4 are input pins of reference voltages. Voltages CMVRD1, CMVRD2, and CMVRC are input to the pins PVR1 to PVR4.

The pins PM[1] to PM[2N] are current input pins. The pins PDI are digital input pins, and various digital signals such as signals CMSTBY and CMRST are input to the pins. The signal CMSTBY is a standby signal, by which whether the CSN portion 202 is brought into a standby mode or an active mode is controlled. The signal CMRST is a reset signal for a reset of a logic circuit of the CSN portion 202.

The pins PDO1 and PDO2 are digital output pins, and the pins PAIO are analog input/output pins. The functions of the pins PDO2 and PAIO can be changed depending on the operation of the CSN portion 202.

The CSN portion 202 includes an analog switch (ASW) portion 230, an I/V portion 231, a S/H portion 232, an analog-digital conversion portion (A/D portion) 233, an output driver 235, an ASW circuit 260, a level shift portion 270, a setup register (REG) 271, a decoder (DEC) 272, selectors (SEL) 274 and 275, a counter 277, and a D/A circuit 278.

The I/V portion 231 includes N I/V circuits 241. The S/H portion 232 includes N S/H circuits 242. The A/D portion includes N A/D circuits 243. The output driver 235 includes a buffer (BUFF) portion 236 and a shift register (SR) 237. The I/V circuit 241, the S/H circuit 242, and the A/D circuit 243 form a unit circuit of the current sensing circuit. The unit circuit formed of the I/V circuit 241[h], the S/H circuit 242[h], and the A/D circuit 243[h] is referred to as a CM circuit 245[h] for convenience.

Various circuits are provided in the CSN portion 202 to verify the operation of the CM circuit 245. A switch matrix 250, ASW portions 251 and 252, a buffer portion 253, a LOG/LS portion 254, a current generation portion 258, an ASW circuit 259, and a multiplexer (MUX) 269 are provided in the CSN portion 202.

The ASW portion 251 includes N ASW circuits 261, the buffer portion 253 includes N tri-state (TRI) buffer circuits 53, and the LOG/LS portion 254 includes a shift register 255.

Currents flowing through the pins PM of N odd-numbered (or even-numbered) channels are input to the I/V portion 231 by the ASW portion 230. The N currents input are processed in parallel by N CM circuits 245 and converted into N digital signals. The output driver 235 converts N digital signals into a serial digital signal and generates the signal CMDO. The signal CMDO is output from the pins PDO1.

The setup register 271 stores data for setting the operation of the CSN portion 202. A signal RGCLK is a clock signal for the setup register 271. A signal RGSRD is a serial digital signal. While the signal RGCLK is active, the setup register 271 captures the signal RGSRD and updates data. The data held in the setup register 271 determines the logic of the signals RTCM, RCON, RIRF, RCPOL, RANA[3:0], RDIG[1:0], and RITG[2:0]. In the case where the number of pins PDI for digital input can be increased, all or some of the signals generated by the setup register 271 may be external input signals.

The decoder 272 decodes the signal RITG[2:0] and generates a signal DRITG[4:0].

The level shift portion 270 converts a digital signal into a differential signal and shifts the level of the signal. The signals CMPRE, CMREV, CMSET, CMSH, DRITG[4:0], RCON, RIRF, and RANA[3:0] are input to the level shift portion 270. Note that a level shift circuit may be provided in an analog circuit so as to perform a level shift of a digital signal inside the analog circuit.

A signal CMCLK is a clock signal. The counter 277 counts the number of rises (or falls) of the signal CMCLK and generates a signal CNT representing a count value. The least significant bit of the signal CNT is a signal CMCLKB. The signal CNT is input to the D/A circuit 278 and the A/D portion 233, and the signal CNT is input to the A/D portion 233. The D/A circuit 278 converts the signal CNT into an analog signal and generates a signal DACO. The signal DACO is a ramp wave signal. To the ASW circuit 260, signals RCONH and RCONBH are input from the level shift portion 270, the signal DACO is input from the D/A circuit 278, and the voltage CMVRC is input from the pin PVR3. From the ASW circuit 260, the signal DACO is output to the A/D portion 233 when the signal RCON is "1", and the voltage CMVRC is output to the A/D portion 233 when the signal RCON is "0".

The resolution of the A/D portion 233 is 12 bits, for example. The number of bits of the output signal CNT of the counter 277 is 12, and the D/A circuit 278 is a 12-bit D/A circuit.

The signals TDSP and TDCLK are input to the CSN portion 202 through the pins PDI. The signals TDSP and TDCLK are a start pulse signal and a clock signal, respectively. By the selector 274, the signals TDSP and TDCLK are output to the shift register 237 when the signal RTCM is "0", and the output of the signals TDSP and TDCLK to the shift register 237 is stopped when the signal RTCM is "1". By the selector 275, the signals TDSP and TDCLK are output to the shift register 255 when the signal RTCM is "1", and the output of the signals TDSP and TDCLK to the shift register 255 is stopped when the signal RTCM is "0".

The level shift portion 270 outputs differential signals generated from the signals RIRF, CMSET, and RCON to the current generation portion 258. The current generation portion 258 outputs a current TIREF. The current TIREF is input to the I/V portion 231 through the switch matrix 250 and the ASW portions 251 and 230. The current TIREF is a reference current for a test of the I/V portion 231.

The ASW portion 252 has functions of an output circuit that reads a signal TAMPO from the I/V portion 231 and an input circuit that transmits a signal TCMPIN for testing the A/D portion 233. The buffer portion 253 holds an internal signal of the A/D portion 233, and the signal held is output as a signal TCMPO to the MUX 269. The LOG/LS portion 254 controls the A/D portion 233, the ASW portions 251 and 252, and the buffer portion 253. A signal RANA[2:0] is a signal for setting the function of the pin PAIO. The level shift portion 270 outputs a differential signal generated from the signal RANA[2:0] to the ASW portion 252. A signal RDIG[1:0] is a signal for setting the function of the pin PDO2, and input to the MUX 269. The ASW circuit 259 sets the function of the pin PAIO, and the MUX 269 sets the function of the pin PDO2.

<<Current Generation Portion 258>>

Figure 10:
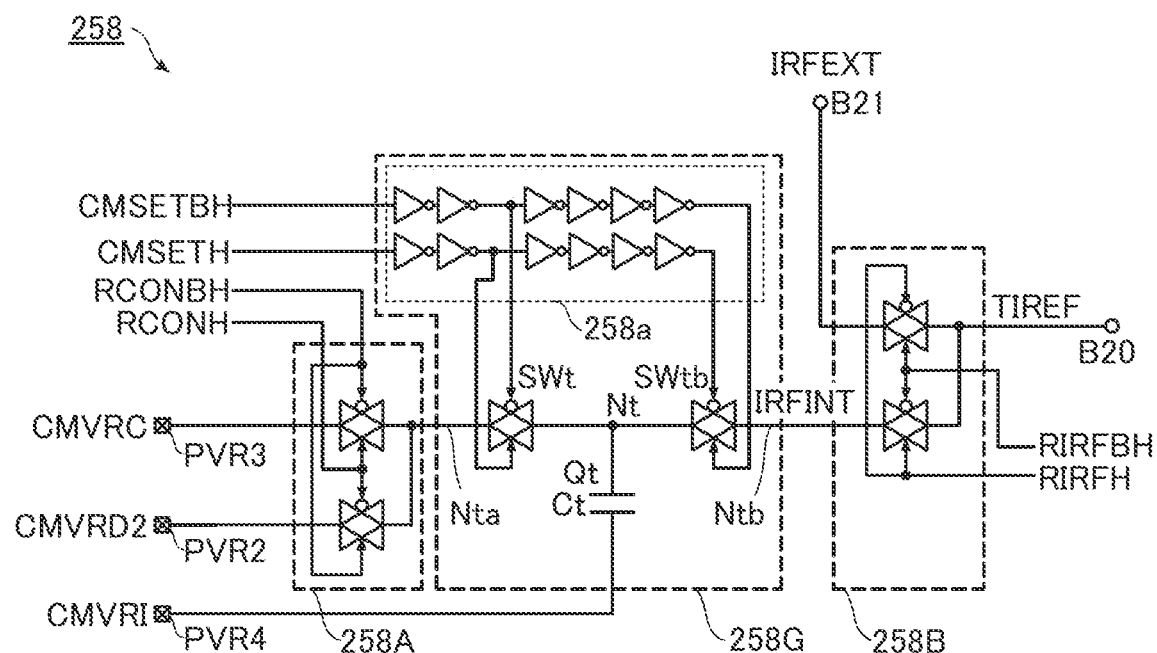
FIG. 10 is a circuit diagram illustrating a structure example of a current generation portion.

FIG. 10 illustrates a circuit structure example of the current generation portion 258. The current generation portion 258 includes terminals B20 and B21, a current generation circuit 258G, and ASW circuits 258A and 258B. The terminal B20 is an output terminal of the current TIREF. The terminal B21 is an input terminal of a current IRFEXT. The current IRFEXT is an external reference current, and input to the terminal B21 through the pin AOI and the ASW circuit 259.

The current generation circuit 258G has a circuit structure similar to that of the current generation circuit 125 in FIG. 3 and includes a delay circuit 258a, the switches SWt and SWtb, the capacitor Ct, the node Nt, and nodes Nta and Ntb. The current generation circuit 258G generates the current IRFINT corresponding to the amount of electric charge Qt in the capacitor Ct. The function of the delay circuit 258a is similar to that of the delay circuit 125a in FIG. 3; the delay circuit 258a delays the signals CMSETH and CMSETBH to generate the signals CMSETH_D1 and CMSETBH_D1, respectively, and delays the signals CMSETH_D1 and CMSETBH to generate the signals CMSETH_D2 and CMSETBH_D2, respectively. The signals CMSETH_D1 and CMSETBH_D1 are input to the switch SWt, and the signals CMSETH_D2 and CMSETBH_D2 are input to the switch SWtb. The voltage CMVRC or CMVRD2 is input to the node Nta through the ASW circuit 258A. The node Ntb is an output node of the current IRFINT.

The ASW circuit 258A has a function of a selection circuit. The signals RCONH and RCONBH are input to the ASW circuit 258A. When the signal RCON is "0", electrical continuity between the node Nta and the pin PVR2 is established by the ASW circuit 258A and the voltage CMVRC is input to the node Nta. When the signal RCON is "1", electrical continuity between the node Nta and the pin PVR3 is established by the ASW circuit 258A and the voltage CMVRC is input to the node Nta. Thus, a voltage Vt of the capacitor Ct is set to |CMVRD2−CMVRI| or |CMVRDC−CMVRI| depending on the signal RCON.

The ASW circuit 258B has a function of a selection circuit. Signals RIRFBH and RIRFH are input to the ASW circuit 258B from the level shift portion 270. When the signal RIRF is "0", electrical continuity between the terminal B20 and the terminal B21 is established by the ASW circuit 258B and the current IRFEXT flows through the terminal B20. When the signal RIRF is "1", electrical continuity between the terminal B20 and the node Ntb is established by the ASW circuit 258B and the current IRFINT flows through the terminal B20. Thus, the test reference current TIREF is set to the external reference current (IRFEXT) or the internal reference current (IRFINT) by the signal RIRF.

<<ASW Portions 230, 251, and 252, I/V Portion 231, and S/H Portion 232>>

Figure 11:
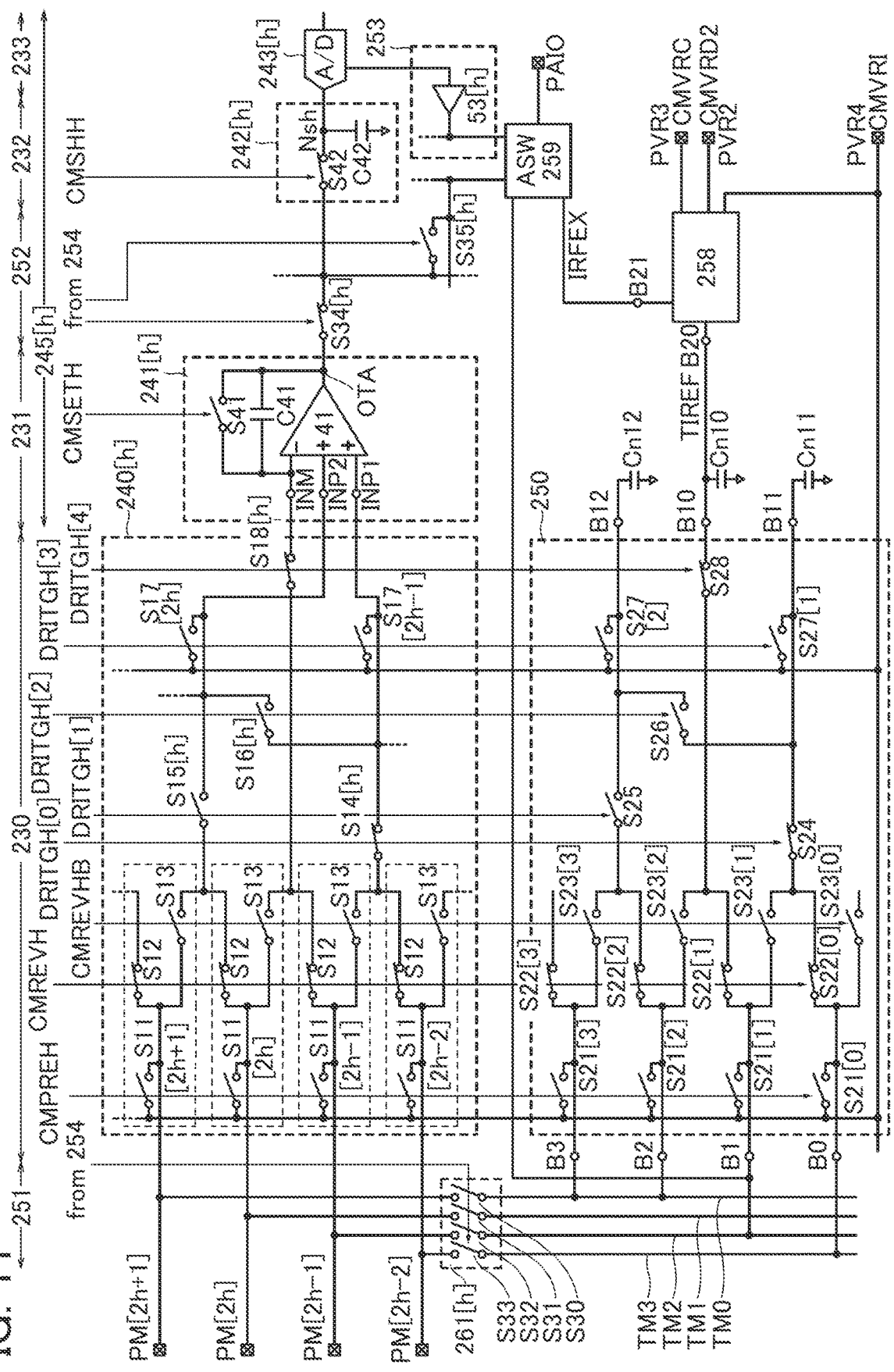
FIG. 11 is a circuit diagram illustrating a structure example of a current sensing circuit and a test circuit

A circuit structure example of the ASW portion 230, the I/V portion 231, the S/H portion 232, and the like is described with reference to FIG. 11. FIG. 11 illustrates a unit circuit of the portions corresponding to the CM circuit 245[h].

The level shift portion 270 outputs differential signals generated from the signals CMPRE, CMREV, and DRITG [4:0] to the ASW portion 230 and the switch matrix 250, outputs a differential signal generated from the signal CMSET to the I/V portion 231, and outputs a differential signal generated from the signal CMSH to the S/H portion 232.

The I/V circuit 241[h] senses currents flowing through the pins PM[2h−1] and PM[2h]. The I/V circuit 241[h] is formed of a current input integrating circuit and includes an amplifier circuit 41, a capacitor C41, and a switch S41. The on/off of the switch S41 is controlled by the signals CMSETH and CMSETBH.

The amplifier circuit 41 includes one inverting input terminal (−), two inverting input terminals (+), and an output terminal. Here, the inverting input terminal (−) is referred to as a terminal INM, the two inverting input terminals (+) are referred to as terminals INP1 and INP2, and the output terminal is referred to as a terminal OTA.

The S/H circuit 242 includes a node Nsh, a capacitor C42, and a switch S42. The on/off of the switch S42 is controlled by the signals CMSHH and CMSHBH.

The ASW portion 252 includes N switches S34 and N switches S35. The on/off of the switches S34 and S35 is controlled by an output signal of the LOG/LS portion 254. The switch S34[h] controls electrical continuity between the I/V circuit 241[h] and the S/H circuit 242[h]. The switch S35[h] controls electrical continuity between the S/H circuit 242[h] and the ASW circuit 259.

A TRI buffer circuit 53[h] of the buffer portion 253 holds an internal signal of the A/D circuit 243[h]. Electrical continuity between the pin PAIO and an output terminal of the TRI buffer circuit 53[h] is controlled by the ASW circuit 259.

The ASW portion 251 includes wirings TM0 to TM3. The ASW portion 251 functions as a DeMUX, and four pins of 2N pins PM have electrical continuity with the wirings TM0 to TM3.

The ASW circuit 261[h] includes switches S30[h] to S33[h]. The on/off of the switches S30[h] to S33[h] is controlled by an output signal of the LOG/LS portion 254. The switch S30[h] controls electrical continuity between the wiring TM0 and the pin PM[2h+1]. The switch S31[h] controls electrical continuity between the wiring TM1 and the pin PM[2h]. The switch S32[h] controls electrical continuity between the wiring TM2 and pin PM[2h−1]. The switch S33[h1] controls electrical continuity between the wiring TM3 and pin PM[2h−2].

The ASW portion 230 includes (2N+2) switches S11, (2N+2) switches S12, (2N+2) switches S13, N switches S14, N switches S15, N switches S16, N switches S18, and 2N switches S17. The switches S11[2h−2] to S11[2h+1], S12[2h−2] to S12[2h+1], S13[2h−2] to S13[2h+1], S14[h], S15[h], S16[h], S17[2h−1], S17[2h], and S18[h] form a switch matrix 240[h]. The switch matrix 240[h] selects a pin to have electrical continuity with the I/V circuit 241[h] from the pins PM[2h−1] to PM[2h+1] and PVR4.

Note that although the pin PM[0] (h=1) and the pin PM[2N+1] (h=N) are not provided in the SD-IC 200, the switches S11[0], S11[2N+1], S12[0], S12[2N+1], and the like are provided in the ASW portion 230.

The switch matrix 250 has a circuit structure similar to that of the switch matrix 240.

The switch matrix 250 includes terminals B0 to B3 and B10 to B12 and switches S21[0] to S21[3], S22[0] to S22[3], S23[0] to S23[3], S24, S25, S26, S27[1], S27[2], and S28. The ASW circuit 259 makes the terminal B1 have electrical continuity with the pin PAIO.

The ASW portion 230 and the switch matrix 250 are controlled by a common signal. The on/off of the switches S11 and S21 is controlled by the signal CMPREH and a signal CMPREBH. The signal CMPRE is a precharge signal that controls precharge of the pins PM and the wirings TM0 to TM3. The on/off of the switches S12, S13, S21, and S23 is controlled by the signal CMREVH and a signal CMREVBH. The signal CMREV is a signal for setting a channel that is targeted to be monitored.

The on/off of the switches S14 and S24 is controlled by signals DRITGH[0] and DRITGBH[0]. The on/off of the switches S15 and S25 is controlled by signals DRITGH[1] and DRITGBH[1]. The on/off of the switches S16 and S26 is controlled by signals DRITGH[2] and DRIGBH[2]. The on/off of the switches S17 and S27 is controlled by signals DRITGH[3] and DRITGBH[3]. The on/off of the switches S18 and S28 is controlled by signals DRITGH[4] and DRITGBH[4].

The terminals B0 to B3 are electrically connected to the wirings TM3 to TM0, respectively. The terminal B10 is electrically connected to the terminal B20 of the current generation portion 258. To take measures against noise, capacitors Cn10 to Cn12 are electrically connected to the terminals B10 to B12, respectively.

<<Switch Matrix 240 and I/V Circuit 241>>

The amplifier circuit 41 of the I/V circuit 241 has a function of amplifying a difference between an average voltage of voltages of the terminals INP1 and INP2 and a voltage of the terminal INM. For example, the amplifier circuit 41 has a function of amplifying a difference voltage $((V_{inp1}+V_{inp2})/2-V_{inm})$ when voltages of the terminals INP1, INP2, and INM are $V_{inp1}$, $V_{inp2}$, and $V_{inm}$. For example, given that the amplification factor (differential gain) of the amplifier circuit 41 is AD and the common mode gain thereof is 0 dB, the relationship between a voltage $V_{ampo}$ of the terminal OTA of the amplifier circuit 41 and the input voltages $V_{inp1}$, $V_{inp2}$, and $V_{inm}$ is represented by the following formula:

$$V_{ampo}=A_D((V_{inp1}+V_{inp2})/2-V_{inm}) \qquad (a1).$$

Electrical continuity between the I/V circuit 241[h] and the pins PVR4 and PM[2h−1] to PM[2h+1] is set by the circuit structure of the switch matrix 240[h]. Since the switch matrix 240[h] is a programmable switch circuit, the I/V circuit 241[h] can have a plurality of current sensing modes. The current sensing modes include a 3-input differential sensing mode, a differential sensing mode, a single-ended sensing mode, and a high impedance mode. With reference to FIG. 12 and FIGS. 13A to 13C, the current sensing modes and their corresponding circuit structures of the switch matrix 240[h] are described.

Figure 13A:
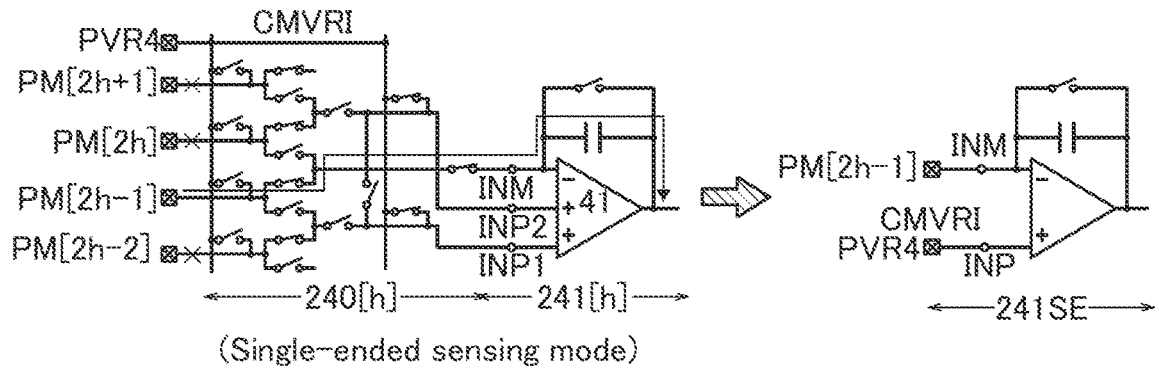
FIGS. 13A to 13C are each a diagram for describing a current sensing mode and a circuit structure of a switch matrix.
Figure 13B:
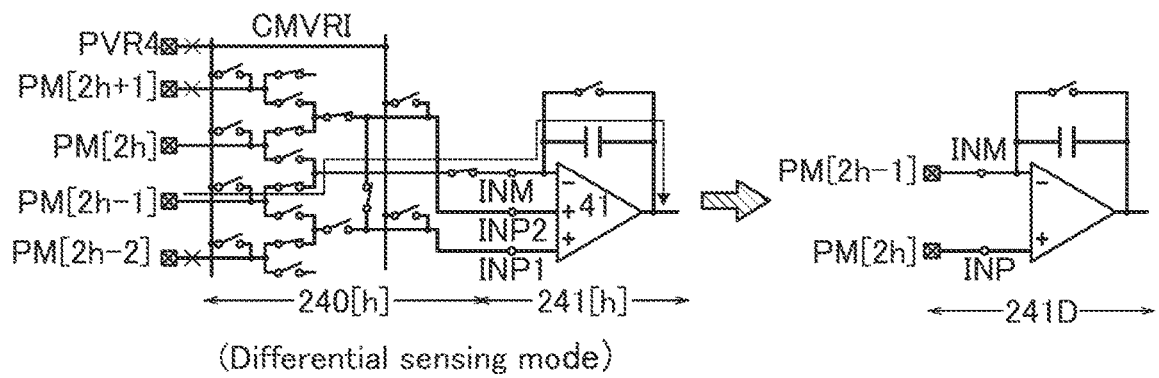
Figure 13C:
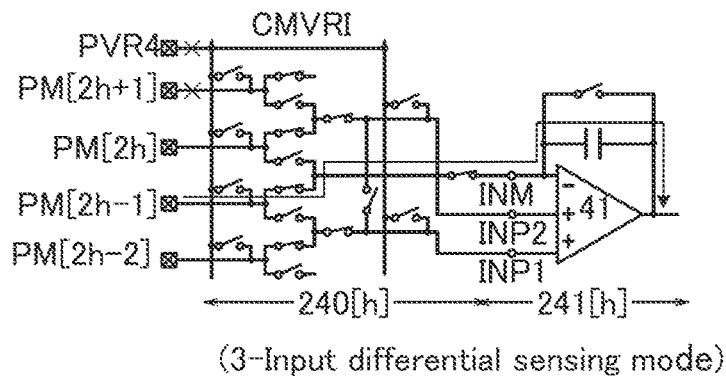

FIG. 12 shows control signals of the switch matrix 240[h], their corresponding functions of the I/V circuit 241[h], and a truth table of the decoder 272. The column "INM" represents the pin PM connected to the terminal INM[h]. For example, "2h" shows that the electrical continuity between the terminal INM[h] and the pin PM[2h] is established. The same applies to the columns "INP1" and "INP2". FIGS. 13A to 13C illustrate the current sensing modes and their corresponding circuit structures of the switch matrix 240[h].

The channel that is targeted to be monitored is set by the signal CMREV. An odd-numbered channel is targeted to be monitored when the signal CMREV is "H", and an even-numbered channel is targeted to be monitored when the signal CMREV is "L". The signal input mode of the I/V circuit 241 is set by signals RITG[0] to RITG[2]. In other words, the current sensing mode of the I/V circuit 241 is determined by the signal RITG[2:0].

(High Impedance (HIz) Mode)

When the signal RITG[2:0] is 3'b111, the terminal INM[h] is brought into a high impedance state by the switch matrix 240[h].

(Single-Ended Sensing (SE) Mode)

FIG. 13A illustrates a circuit structure of the switch matrix 240[h] in the case where the signal CMREV is 1'b0 and the signal RITG[2:0] is 3'b100. The terminal INM[h] has electrical continuity with the pin PM[2h−1], and the terminals INP1[h] and INP2[h] have electrical continuity with the pin PVR4. Thus, the circuit structure of the I/V circuit 241[h] in FIG. 13A is equivalent to that of an integrating circuit 241SE. The integrating circuit 241SE is a single-ended input integrating circuit and integrates a current flowing through the pin PM[2h−1] with the use of the constant voltage (CMVRI) as a reference voltage.

(Differential Sensing (DEFF) Mode)

FIG. 13B illustrates a circuit structure of the switch matrix 240[h] in the case where the signal CMREV is 1'b0 and the signal RITG[2:0] is 3'b010. The terminal INM[h] has electrical continuity with the pin PM[2h−1], and the terminals INP1[h] and INP2[h] have electrical continuity with the pin PM[2h]. Thus, the circuit structure of the I/V circuit 241[h] in FIG. 13B is equivalent to that of a differential integrating circuit 241D. The differential integrating circuit 241D integrates a current flowing through the pin PM[2h−1] with the use of a voltage of the pin PM[2h] as a reference voltage.

(3-Input Differential Sensing (3-DEFF) Mode)

The current sensing mode for the I/V circuit 241 having the circuit structure where different signals can be input to the three pins INM, INP1, and INP2 is the "3-input differential sensing mode".

FIG. 13C illustrates a circuit structure of the switch matrix 240[h] in the case where the signal CMREV is 1'b0 and the signal RITG[2:0] is 3'b000. The terminal INM[h] has electrical continuity with the pin PM[2h−1]. The terminals INP1[h] and INP2[h] have electrical continuity with the pins PM[2h−2] and PM[2h+1], respectively. The I/V circuit 241 integrates a current flowing through the pin PM[2h−1] with the use of an average voltage of voltages of the pins PM[2h−1] and PM[2h] as a reference voltage.

In the 3-input differential sensing mode, since the voltages of the two pins PM are used as the reference voltage of the I/V circuit 241, a noise component of the reference voltage can be leveled off. Accordingly, in the 3-input differential sensing mode, common mode noise can be removed from the output of the amplifier circuit 41 more effectively than in the differential sensing mode.

The switch matrix 250 is set to have the same circuit structure as the switch matrix 240[h] by the signals CMREV and RITG[2:0]. Depending on the circuit structure of the switch matrix 250, electrical continuity between the terminals B10, B11, and B12 and the wirings TM0 to TM3 is set.

For example, when the signal CMREV is 1'b0 and the signal RITG[2:0] is 3'b000 (see FIG. 13C), the switch matrix 250 makes the terminals B10, B11, and B12 have electrical continuity with the wirings TM1, TM0, and TM2, respectively.

Figure 14:
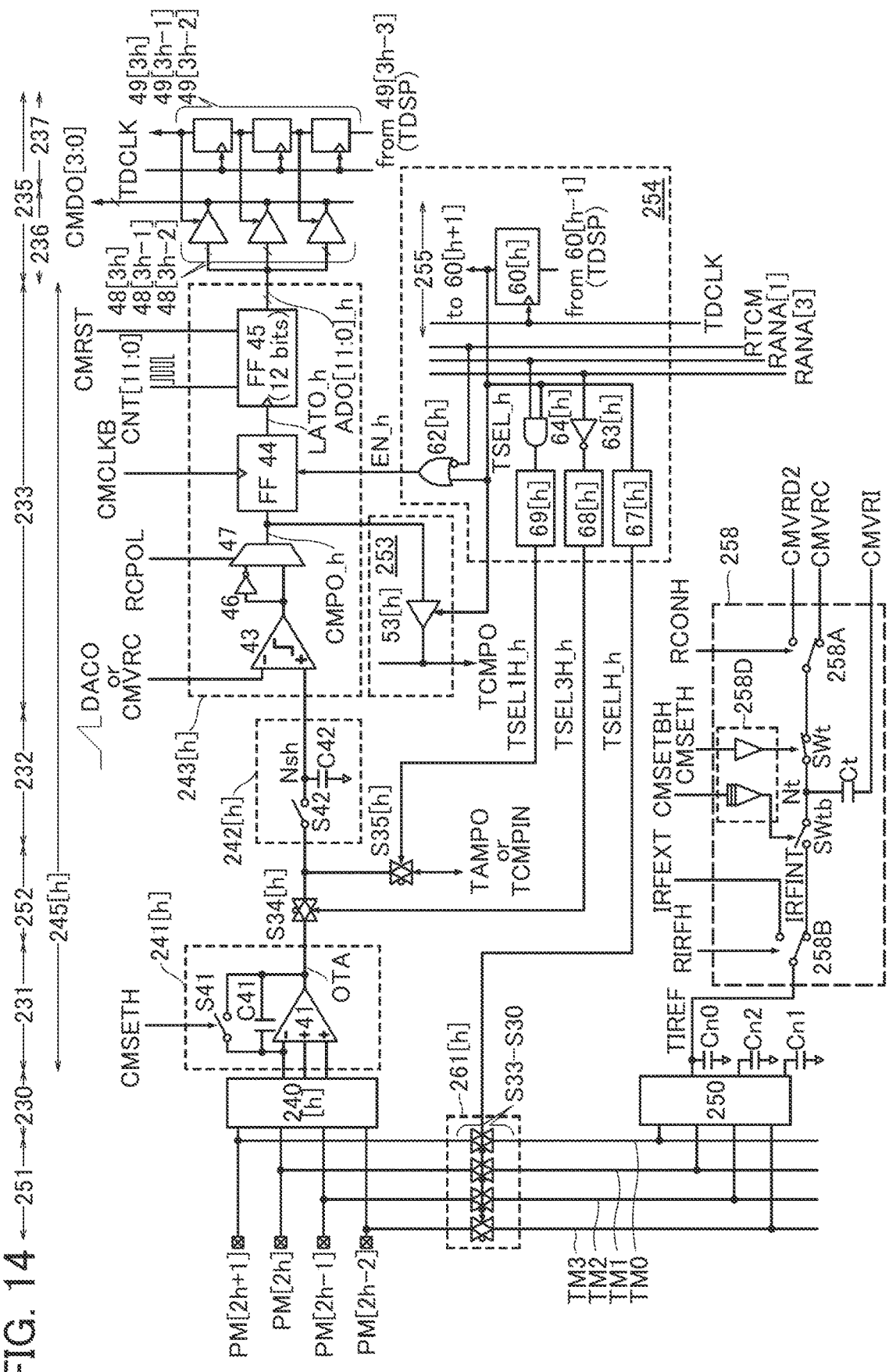
FIG. 14 is a circuit diagram illustrating a structure example of a current sensing circuit and a test circuit.

With reference to FIG. 14, a structure example of the A/D portion 233, the output driver 235, the buffer portion 253, and the LOG/LS portion 254 is described. FIG. 14 illustrates a unit circuit of the portions.

<<A/D Portion 233>>

The A/D circuit 243[h] includes the comparator 43[h], the flip-flops (FF) 44[h] and 45[h], the inverter circuit 46[h], and the selector 47[h].

A non-inverting input terminal (hereinafter, referred to as a terminal (+)) of the comparator 43[h] is electrically connected to the node Nsh[h] of the S/H circuit 242[h]. The signal DACO or the voltage CMVRC is input to an inverting input terminal (hereinafter, referred to as a terminal (−)) through the ASW circuit 260. When the signal RCON is "0", the voltage CMVRC is input to the terminal (−). When the signal RCON is "1", the signal DACO is input to the terminal (−). Depending on the circuit structure of the comparator 43[h] or the like, the node Nsh[h] may be electrically connected to the terminal (−) while the output of the ASW circuit 260 may be electrically connected to the terminal (+).

The signal RCPOL is input to the selector 47[h]. The signal PCPOL sets the polarity of a signal CMPO_h to be input to the flip-flop 44[h]. When the signal PCPOL is "0", the selector 47[h] outputs an output signal of the comparator 43[h] to the flip-flop 44[h]. When the signal PCPOL is "1", the selector 47[h] outputs an output signal of the inverter circuit 46[h] to the flip-flop 44[h]. The signal CMPO_h at this time is an inverted signal of the output signal of the comparator 43[h].

The flip-flop 44[h] is formed of, for example, a delay (D) flip-flop. A signal EN_h and the signal CMCLKB are input to the flip-flop 44[h]. The signal EN_h is an enable signal of the flip-flop 44[h] and generated in the LOG/LS portion 254. The signal CMCLKB is a clock signal of the flip-flop 44[h]. Data in the flip-flop 44[h] is updated at the timing of a rise of the signal CMCLKB. The data in the flip-flop 44[h] is output as a signal LATO_h to a flip-flop 45[h].

The flip-flop 45[h] functions as a register that temporarily stores a signal CNT[11:0]. The flip-flop 45[h] is formed of, for example, a 12-bit D flip-flop. The signal LATO_h, the signal CNT[11:0], and a signal CMSRT are input to the flip-flop 45[h]. The signal LATO_h is used as a clock signal, and the signal CMSRT is used as a reset signal. When an output signal of the flip-flop 44[h] undergoes a low-to-high level transition, the flip-flop 45[h] stores the signal CNT[11:0]. A signal ADO[11:0]_h output by the flip-flop 45[h] represents a count value of the counter 277.

<<Output Driver 235>>

The buffer portion 236 includes 3N TRI buffer circuits 48. Each TRI buffer circuit 48 holds 4-bit data, for example. To hold the signal ADO[11:0]_h, three TRI buffer circuits 48[3h−2], 48[3h−1], and 48[3h] are provided. The TRI buffer circuits 48[3h−2], 48[3h−1], and 48[3h] hold the signals ADO[11:8]_h, ADOUT[7:4]_h, and ADO[3:0]_h, respectively.

The shift register 237 is formed of 3N stages of flip-flops 49. The signal TDCLK is input to the flip-flop 49 in each stage, and the signal TDSP is input to a flip-flop 49[1] in a first stage. An output signal of the flip-flop 49 is used as an enable signal of the TRI buffer circuit 48.

Any one of the 3N TRI buffer circuits 48 is selected by an output signal of the shift register 237. Output terminals of the non-selected TRI buffer circuits 48 are brought into a high impedance state. An output terminal of the selected TRI buffer circuit 48 is electrically connected to the pin PDO1. The output signal of the selected TRI buffer circuit 48 is output as a signal CMDO[3:0] from the pin PDO1.

<<Buffer Portion 253>>

The signal CMPO_h is output to the TRI buffer circuit 53[h] and held. A signal TSEL_h is input from the shift register 255 to the TRI buffer circuit 53[h]. When the signal TSEL_h is "H", the TRI buffer circuit 53[h] outputs a signal. In other words, an output signal of the TRI buffer circuit 53 selected by the shift register 255 is output as the signal TCMPO to the MUX 269.

<<LOG/LS Portion 254>>

The LOG/LS portion 254 includes N OR circuits 62, N inverter circuits 63, N AND circuits 64, N level shift circuits 67, N level shift circuits 68, and N level shift circuits 69. The signal RTCM is input to the OR circuit 62, the signal RANA[1] is input to the AND circuit 64, and the signal RANA[3] is input to the inverter circuit 63.

The shift register 255 is formed of N stages of flip-flops 60. The signal TDCLK is input to the flip-flop 60 in each stage, and the signal TDSP is input to a flip-flop 60[1] in a first stage. The signal TSEL_h is an output signal of the flip-flop 60[h]. The signal TSEL_h is input to the TRI buffer circuit 53[h], the OR circuit 62[h], the inverter circuits 63[h] and 64[h], and the level shift circuit 67[h].

The OR circuit 62[h] obtains a logical sum of the signal TSEL_h and the inversion signal of the signal RTCM and generates the signal EN_h. The signal EN_h is output to the flip-flop 44[h].

The level shift circuit 67[h] converts the signal TSEL_h into a differential signal and shifts the level of the signal, thereby generating signals TSELH_h and TSELBH_h. The signals TSELH_h and TSELBH_h control the on/off of the switches S30[h] to S33[h].

The inverter circuit 63[h] obtains a negation of the signal RANA[3] and generates a signal TSEL3. The level shift circuit 68[h] converts the signal TSEL3 into a differential signal and shifts the level of the signal, thereby generating signals TSEL3H_h and TSEL3BH_h. The signals TSEL3H_h and TSEL3BH_h control the on/off of the switch S34[h].

The AND circuit 64[h] obtains a logical product of the signal TSEL_h and the signal RANA[1] and generates a signal TSEL1. The level shift circuit 69[h] converts the signal TSEL1_h into a differential signal and shifts the level of the signal, thereby generating signals TSEL1H_h and TSEL1BH_h. The signals TSEL1H_h and TSEL1BH_h control the on/off of the switch S35[h].

<<ASW Portion 252>>

As described above, the ASW portion 252 has functions of an output circuit that reads the signal TAMPO in the test mode and an input circuit that transmits the signal TCMPIN to the A/D portion 233. For example, when the switches S34[h] and S35[h] are in an on state, the output of the amplifier circuit 41[h] is transmitted as the signal TAMPO to the ASW circuit 259. When the switch S34[h] is in an off state and the switch S35[h] is in an on state, the signal TCMPIN is input from the ASW circuit 259 to the S/H circuit 242[h].

<<Pin PAIO>>

Table 1 is a truth table of the pin PAIO. The function of the pin PAIO is set by the signal RANA[3:0]. Specifically, the circuit structure of the ASW circuit 259 is set by the signal RANA[2:0] and that of the ASW portion 252 is set by the signals RANA[1] and RANA[3].

TABLE 1

| Pin PAIO | | | | | |
|---|---|---|---|---|---|
| Attribute | Input/output | RANA[0] | RANA[1] | RANA[2] | RANA[3] |
| Input | IRFEXT | L | L | L | L |
| Output | IRFINT | H | L | L | L |
| Output | TAMPO | L | H | L | L |
| Input | TCMPIN | L | H | L | H |
| Output | DACO | H | H | L | L |
| Output | PM[1:2N] | L | L | H | L |
| | High impedance | H | H | H | L |

Although currents flowing through the pins PM[1] to PM[2N] are monitored using the output of the pin PAIO, there is no limitation on the number of pins PM that are targeted to be monitored and the pin number.

<<Pin PDO2>>

Table 2 is a truth table of the pin PDO2. An output signal of the pin PDO2 is set by the signal RDIG[1:0]. Specifically, the MUX 269 decodes the signal RDIG[1:0] and selects a signal output from the pin PDO2.

TABLE 2

| Output signal of pin PDO2 | RDIG[0] | RDIG[1] |
|---|---|---|
| CSRO | L | L |
| TSRO | H | L |
| TCMPO | L | H |

A signal CSRO is an output signal of the flip-flop 49[3N] in a last stage of the shift register 237. A signal TSRO is an output signal of the flip-flop 60[N] in a last stage of the shift register 255. The signal CSRO is monitored to indicate the termination timing of the RD sequence. The signal TSRO is monitored to indicate the termination timing of the SN sequence of the N CM circuits 245 in the test mode.

An operation mode of the CSN portion 202 can be set independently of an operation mode of the SDR portion 201. The operation mode of the CSN portion 202 is roughly classified into a current sensing mode and a test mode.

<<Current Sensing Mode>>

Figure 15A:
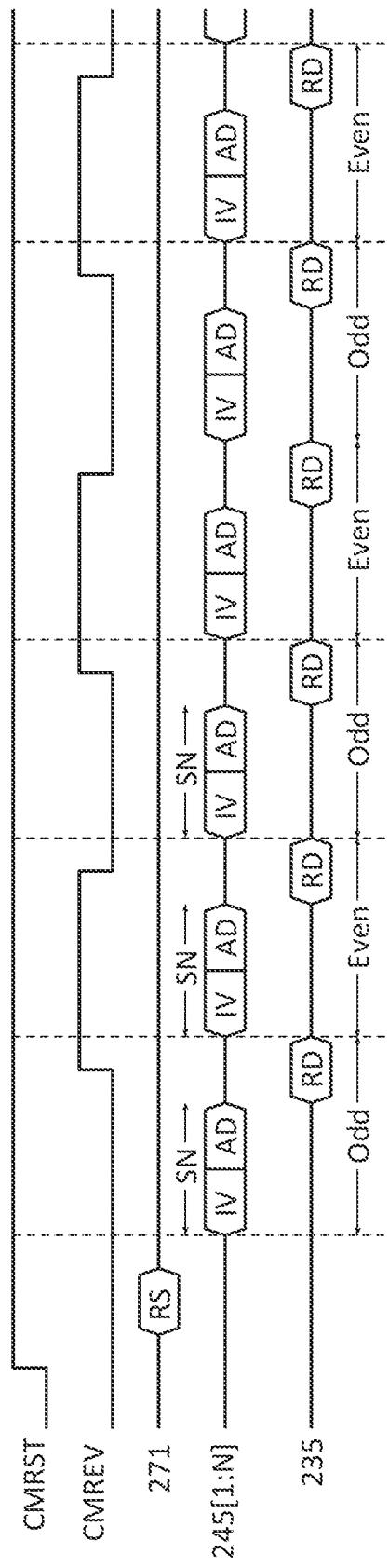
FIG. 15A is a timing chart showing an example of an operation in a current sensing mode.

FIG. 15A shows an example of an operation sequence of the CSN portion 202 in the current sensing mode. The operation sequence is roughly classified into an register setting (RS) sequence, a sensing (SN) sequence, and a reading (RD) sequence. The SN sequence includes the current-voltage conversion (IV) sequence and the digital-analog conversion (AD) sequence.

(RS Sequence)

In the RS sequence, configuration data in the setup register 271 is updated. When the signal CMRST becomes "H", logic circuits (the setup register 271, the flip-flop 45 of the A/D portion 233, and the like) of the CSN portion 202 are reset. Next, the signals RGCLK and RGSRD are input to the setup register 271. At the timing of a rise (or a fall) of the signal RGCLK, the setup register 271 captures the signal RGSRD and stores data. Here, the configuration data is written to the setup register 271 as follows.

To set the CSN portion 202 to the current sensing mode, the signal RTCM is "0". To set the I/V portion 231 to a 2-input differential sensing mode, the signal RITG[2:0] is 3'b000. To input the signal DACO to the A/D portion 233, the signal RCON is "1". To set the signal CMPO to an output signal of the comparator 43, a signal RPOL is "0". In the current sensing mode, a signal RIRF is "0". To bring the pin PAIO into a high impedance state, the signal RANA[3:0] is 4'b0111. To output the signal CSRO from the pin PDO2, the signal RDIG[1:0] is 2'b00.

After the RS sequence is executed, an SN sequence is executed alternately for N odd-numbered channels and N even-numbered channels. In the SN sequence, currents flowing through odd-numbered (or even-numbered) pins PM are processed in parallel by N CM circuits 245 and converted into digital signals. Every time the SN sequence is executed, the output driver 235 performs a reading operation. The CSN portion 202 executes a predetermined number of cycles of the SN sequence and the RD sequence, and the current sensing mode is terminated.

Figure 16:
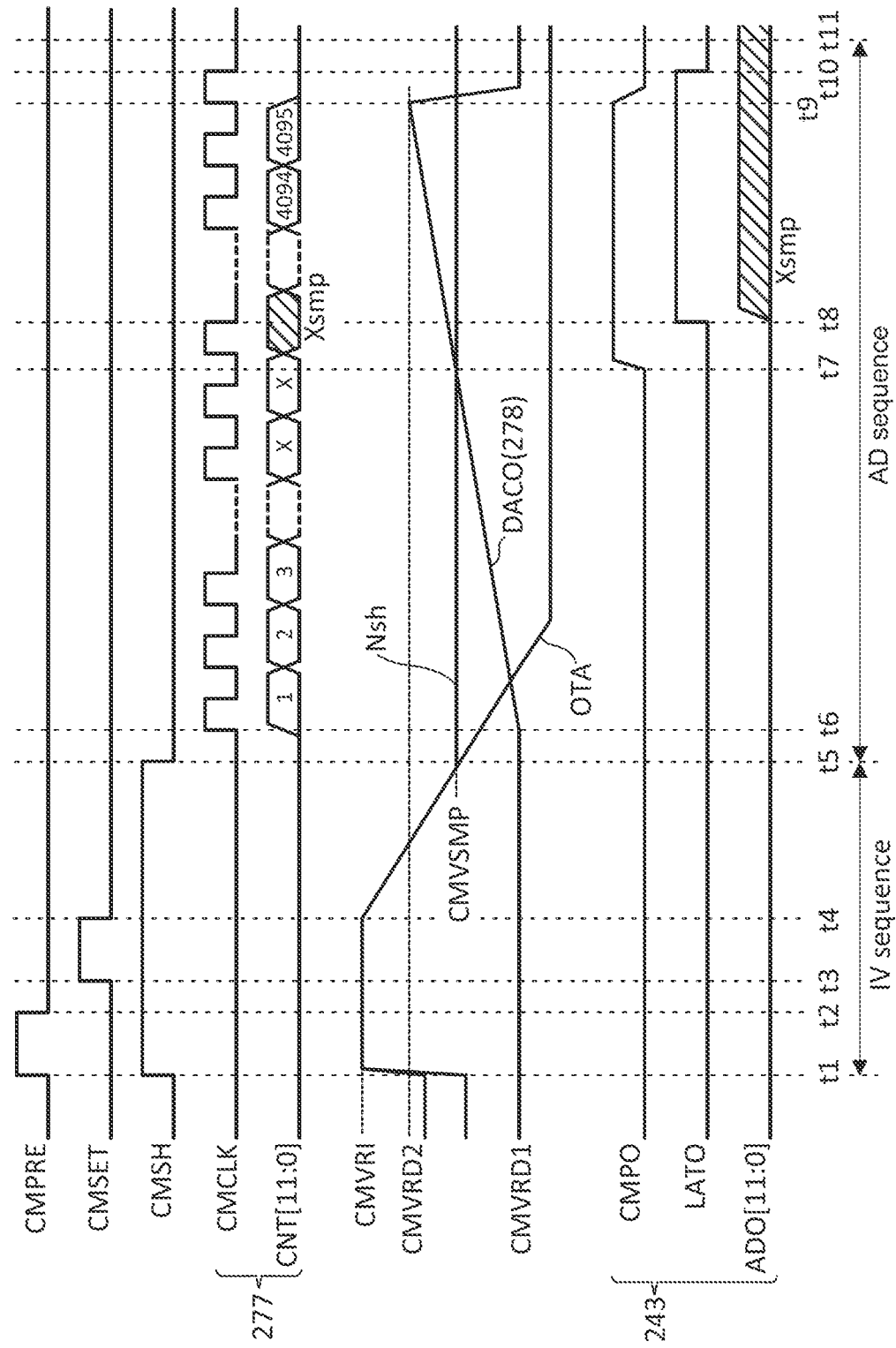
FIG. 16 is a timing chart showing an example of an IV sequence and an AD sequence.

With reference to FIG. 16, operation examples of the IV sequence and the AD sequence are described. FIG. 16 is a timing chart of the CM circuit 245. Here, the magnitude relation between the reference voltages is CMVRI>CMVRD2>CMVRD1. The current that is to be sensed is the source current flowing from the pin PM out of the SD-IC 200.

<IV Sequence>

In a period from t1 to t5, the IV sequence is performed. Note that prior to t1, the circuit structures of the ASW portion 230 and the CM circuit 245[h] are set by the configuration data in the setup register 271. The A/D circuit 243 is in an active state. Electrical continuity between the terminal OTA of the I/V circuit 241 and an input terminal of the S/H circuit 242 is established. Specifically, the terminals INM[h], INP1[h], and INP2[h] of the I/V circuit 241[h] are electrically connected to the pins PM[2h–1], PM[2h–2], and PM[2h], respectively.

(Precharge)

In a period from t1 to t2, a precharge operation is performed. The signal CMPRE at "H" is input, turning on the switches S11 of the ASW portion 230. Consequently, N pins PM and the terminals INM, INP1, and INP2 of the N I/V circuits 241 are each electrically connected to the pin PVR4 and precharged to the voltage CMVRI.

At t1, the signal CMSH becomes "H", turning on the switch S42. The node Nsh of the S/H circuit 242 has electrical continuity with the terminal OTA of the I/V circuit 241.

(Offset Cancellation)

In a period from t3 to t4, offset cancellation in which the offset voltage of the amplifier circuit 41 is corrected is performed. The signal CMSET at "H" is input, turning on the switch S41. The terminal OTA has electrical continuity with the terminal INM, and the capacitor C41 is discharged.

(I/V Conversion)

In a period from t4 to t5, the I/V circuit 241 converts a current flowing through the terminal INM into a voltage, and the S/H circuit 242 samples the voltage of the terminal OTA.

At t4, the signal CMSET becomes "L", so that the I/V circuit 241 starts an integrating operation using an average voltage of the voltage of the terminal INP1 and the voltage of the terminal INP2 as a reference voltage. The voltage of the terminal INM[h] decreases due to the current flowing through the pin PM[2h–1], and accordingly the voltage of the terminal OTA[h] decreases.

The signal CMSH becomes "L" at t5, and the I/V sequence is terminated. A voltage CMVSMP of the terminal OTA at t5 is held by the S/H circuit 242. The voltage CMVSMP corresponds to the amount of electric charge flowing through the terminal INM in the period from t4 to t5.

<A/D Sequence>

In a period from t5 to t11, the AD sequence is executed. In a period from t6 to t11, the signal CMCLK is input to the counter 277, and the counter 277 generates the signals CNT[11:0] and CMCLKB. The signal CMCLKB is an inverted signal of the signal CMCLK. The D/A circuit 278 converts the signal CNT[11:0] into an analog signal and generates the signal DACO. The signal DACO is input to a terminal (+) of the comparator 43.

The comparator 43 compares the voltage CMVSMP of the node Nsh and the voltage of the signal DACO. At t7 when the voltage of the signal DACO exceeds the voltage CMVSMP, the output signal of the comparator 43 undergoes an "H"-to-"L" transition. Here, since the output signal of the inverter circuit 46 is the signal CMPO, the signal CMPO undergoes a "L"-to-"H" transition at t7.

With a rise of the signal CMCLKB (a fall of the signal CMCLK), data in the flip-flop 44 is updated by the signal CMPO. At t8 when the signal CMCLKB rises, the signal LATO becomes "1" ("H"). With a rise of the signal LATO (clock signal), the flip-flop 45 stores the signal CNT[11:0], that is, a count value Xsmp. The count value Xsmp represents the amount of current flowing through the terminal INM in the period from t4 to t5.

At t9, the count value of the counter 277 becomes 0, so that the signal CMPO undergoes an "H"-to-"L" transition. With a rise of the signal CMCLKB at t10, data in the flip-flop 44 is updated by the signal CMPO, so that the signal LATO becomes "L". The data ADO[11:0] in the flip-flop 45 is not updated until the signal LATO undergoes an "L"-to-"H" transition.

<RD Sequence>

Figure 15B:
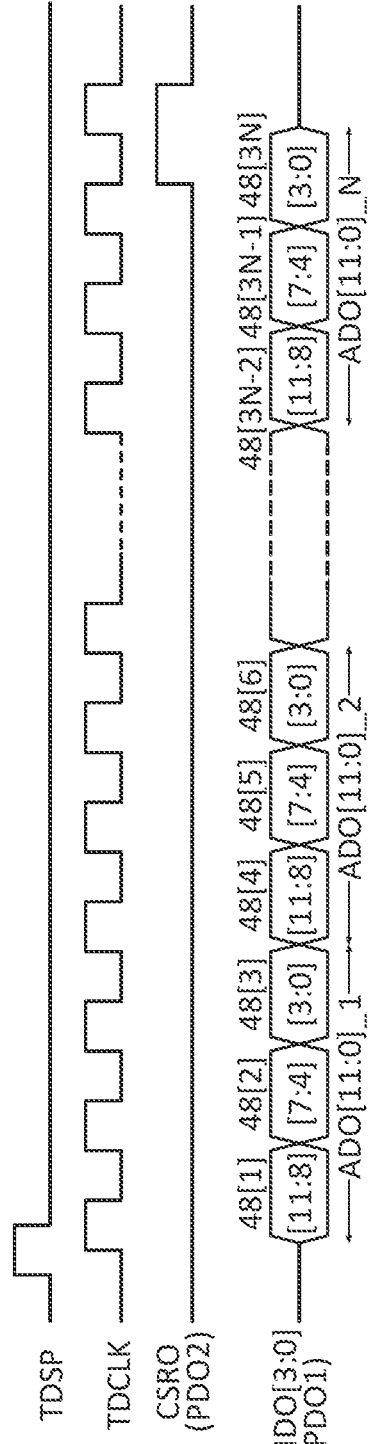
FIG. 15B is a timing chart showing an example of an RD sequence.

FIG. 15B is a timing chart showing an example of the RD sequence. When the signal TDSP is input to the output driver 235, the RD sequence is started. In the shift register 237 of the output driver 235, a shift operation of the signal TDSP is performed in response to a rise of the signal TDCLK, and the flip-flops 49[1] to 49[3N] output enable signals to the TRI buffer circuits 48[1] to 48[3N], respectively. The enable signals at "H" are successively input to the TRI buffer circuits 48[1] to 48[3N], and 4-bit data held is output as the signal CMDO[3:0] to the pin PDO1. As the output of the shift register 237 in the last stage, the signal CSRO is output from the pin PDO2.

While the RD sequence is executed, the signal CMREV is set to "L" from "H" (or "H" from "L") and the channel that is targeted to be monitored is changed.

<<Test Mode>>

Figure 18:
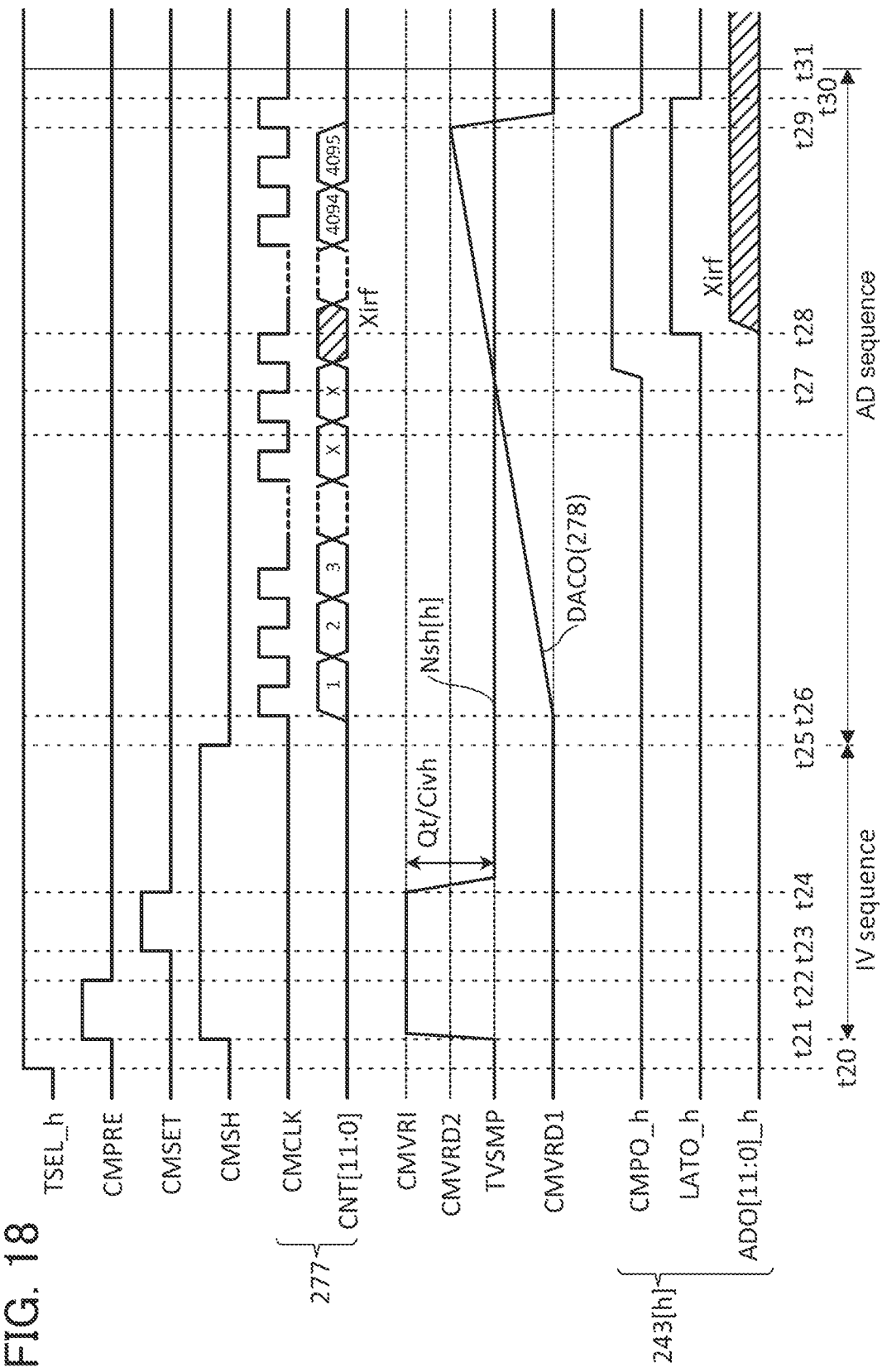
FIG. 18 is a timing chart showing an example of an IV sequence and an AD sequence in a test mode.

In the test mode, the current TIREF is successively input to the CM circuits 245[1] to 245 [N], whereby one unit of the CM circuits 245 is tested at a time. FIG. 18 shows an example of an operation sequence of the CSN portion 202 in the test mode. The operation sequence is roughly classified into an RS sequence (1), N cycles of the SN sequence, an RS sequence (2), and the RD sequence.

<RS sequence (1)>

In the RS sequence (1), the configuration data in the setup register 271 is updated. When the signal CMRST becomes "H", the setup register 271, the flip-flop 45 of the A/D portion 233, and the like of the CSN portion 202 are reset. Next, the signals RGCLK and RGSRD are input to the setup register 271, and the configuration data is written to the setup register 271. In the RS sequence (1), the signal RTCM is set to "1" to bring the CSN portion 202 into the test mode.

<SN Sequence>

By the selector 275, the signals TDCLK and TDSP are input to the shift register 255. The shift register 255 performs a shift operation of the signal TDSP to generate the signals TSEL[1] to TSEL[N]. The CM circuits 245[1] to 245[N] are successively selected by the signals TSEL[1] to TSEL[N]. The selected CM circuit 245 executes the SN sequence.

The SN sequence of the CM circuit 245 in the test mode is similar to that in the current sensing mode. A major difference is that the current TIREF is input from the current generation portion 258 to the terminal INM. In order that the current TIREF be input to the I/V portion 231, the signal CMREV is fixed at "L".

For example, in the RS sequence (1), configuration data for outputting the signal TSRO from the pin PDO2 is written to the setup register 271. Thus, the output of the pin PDO2 is monitored to indicate the termination of the SN sequence of the CM circuit 245[N].

<RS sequence (2)>

In the RS sequence (2), configuration data for executing the RD sequence is written to the setup register 271. In the RS sequence (2), the signal RTCM is set to "0". For example, to output the signal CSRO from the pin PDO2, the signal RDIG[1:0] is set to 2'b00. As the other configuration data, the same data as that in the RS sequence (1) can be used.

<RD Sequence>

In accordance with the timing chart in FIG. 15B, the output driver 235 is operated. The N 12-bit digital signals (ADO[11:0]) generated by the CM circuits 245[1] to 245[N] are converted into serial 4-bit digital signals (CMDO[3:0]) and output from the pin PDO1. By analysis of the signals CMDO [3:0], quality determination of the CM circuit 245, for example, is performed.

Figure 17:
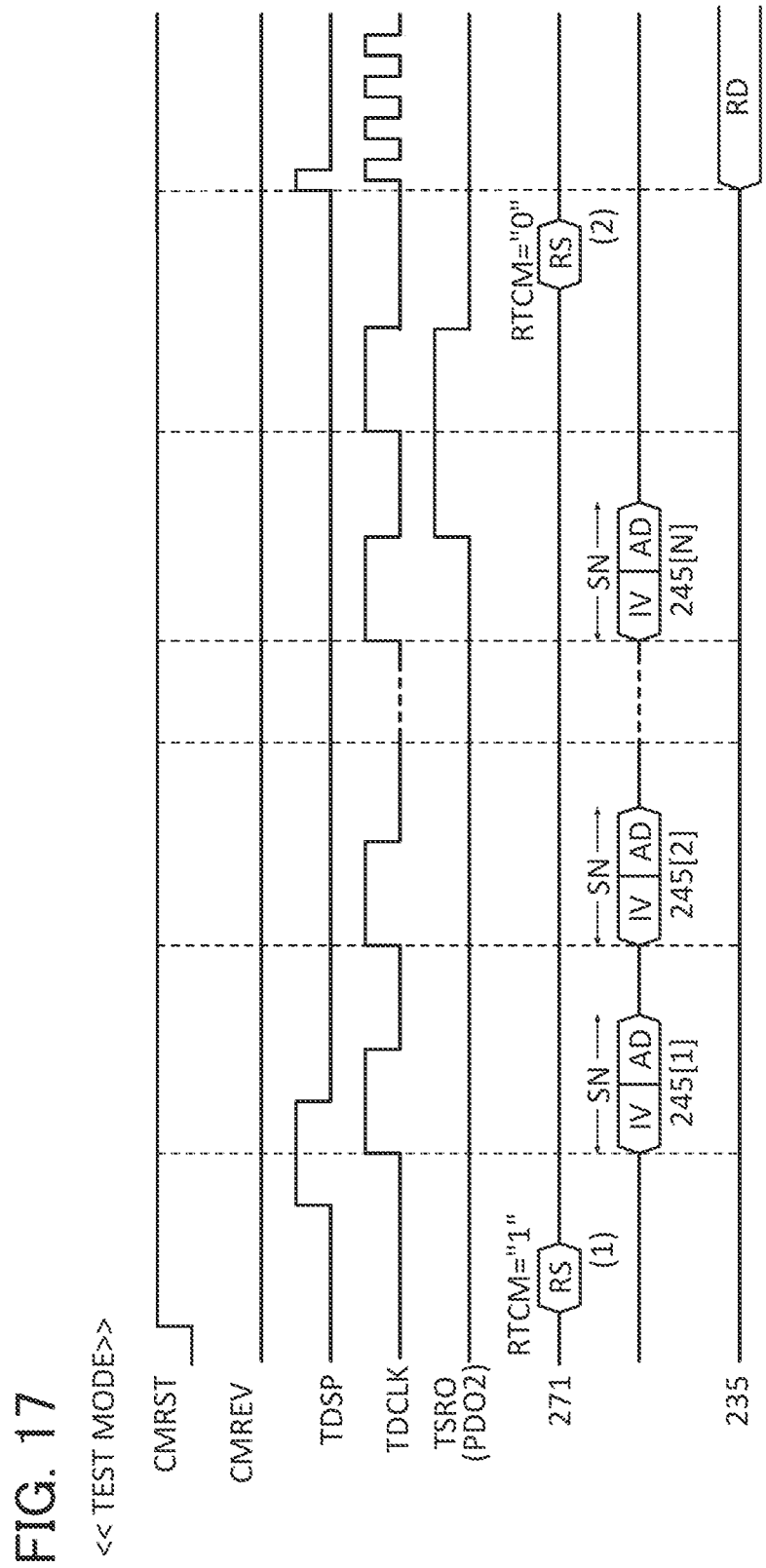
FIG. 17 is a timing chart showing an example of an operation in a test mode.

In an example in FIG. 17, the frequencies of the signals TDSP and TDCLK are set in accordance with data of the signal RTCM. The frequencies of the signals TDSP and TDCLK are higher when the signal RTCM is "0" than when the signal RTCM is "1".

<<IV and AD Sequences>>

FIG. 18 shows an operation example of the IV and AD sequences of the CM circuit 245[h] in the current sensing mode.

In the RS sequence (1), data in the setup register 271 is set as follows. To set the CSN portion 202 to the test mode, the signal RTCM is "1". To set the current TIREF to the current IRFINT, the signal RIRF is "1". To set the I/V portion 231 to the 2-input differential sensing mode, the signal RITG[2:0] is 3'b000. To input the signal DACO to the A/D portion 233, the signal RCON is "1". When the signal RCON is set to "1", the voltage CMVRC is input to the current generation portion 258. To set the signal CMPO to the output signal of the comparator 43, the signal RPOL is "0". To bring the pin PAIO into a high impedance state, the signal RANA[3:0] is 4'b0111. To output the signal TSRO from the pin PDO2, the signal RDIG[1:0] is 2'b01.

<IV Sequence>

Prior to t21, the circuit structures of the ASW portion 230 and the switch matrixes 240[h] and 250 are set by the configuration data in the setup register 271. The switch matrix 240[h] makes the terminals INM[h], INP1[h], and INP2[h] have electrical continuity with the pins PM[2h-1], PM[2h-2], and PM[2h], respectively. The terminals B0 to B3 of the switch matrix 250 have electrical continuity with the wirings TM3 to TM0, respectively. The current TIREF is input to the terminal INM[h] through the TM3.

At t20, the flip-flop 60[h] generates the signal TSEL_h at "H". The switches S30 to S33 of the ASW circuit 261[h] are turned on, and electrical continuity between the pins PM[2h-1] to PM[2h+1] and the wirings TM3 to TM0 is established. The enable signal (TSEL_h) at "H" is input to the TRI buffer circuit 53[h], and the enable signal (EN_h) at "H" is input to the flip-flop 44[h].

Since the signal RANA[3] is "0" and the signal RANA[1] is "1", the switches S34[h] and S35[h] are in an on state.

(Precharge)

In a period from t21 to t22, a precharge operation is performed. The signal CMPRE at "H" is input, turning on the switches S11 of the ASW portion 230 and the switches S21 of the switch matrix 250. The pins PM[2h-1] to PM[2h+1], the terminals INM[h], INP1[h], and INP2[h], and the wirings TM0 to TM3 are each electrically connected to the pin PVR4 and precharged to the voltage CMVRI.

The signal CMSH becomes "H" at t21, and thus the switch S42[h] is turned on. The node Nsh[h] has electrical continuity with the terminal OTA[h].

(Offset Cancellation)

In a period from t23 to t24, offset cancellation in which the offset voltage of the amplifier circuit 41[h] is corrected is performed. The switch S41[h] is in an on state. The capacitor C41[h] is discharged, and the amount of electric charge is 0 coulombs.

(Generation of Current IRFINT)

In the period from t23 to t24, the switch SWt of the current generation portion 258 is in an on state, and the switch SWtb is in an off state. The voltage CMVRC is input to the node Nt, and the capacitor Ct is charged. The amount of electric charge Qt of the capacitor Ct is (CMVRC−CMVRI)×Ct. At t24 when the signal CMSET becomes "L", the switch SWt is turned off with a delay of a certain period. Next, the switch SWtb is turned on, and the current IRFINT flows to the node Ntb. The current IRFINT is output as the current TIREF from the terminal B20 to the switch matrix 250. The current TIREF is input to the terminal INM[h] through the wiring TM2.

(I/V Conversion)

In a period from t24 to t25, the I/V circuit 241[h] converts the current TIREF flowing through the terminal INM[h] into a voltage, and the S/H circuit 242[h] samples the voltage of the terminal OTA[h].

At t24, the signal CMSET becomes "L", so that the I/V circuit 241 starts an integrating operation using an average voltage of the voltage of the terminal INP1 and the voltage of the terminal INP2 as a reference voltage. The voltage of the node Nsh[h] decreases to the voltage TVSMP. The difference between the voltage TVSMP and the voltage CMVRI is Qt/Civh; Civh is the capacitance of C41[h] of the I/V circuit 241[h].

<A/D Sequence>

In a period from t25 to t31, the AD sequence is executed. The A/D circuit 243[h] converts the voltage TVSMP into a 12-bit digital signal (ADO[11:0]_h). A count value Xirf corresponds to the amount of electric charge Qt.

The test method of the CSN portion 202 is not limited to the above. Depending on the configuration data in the setup register 271, modification of the data to be obtained, the signal to be used in the test, the operation sequence, or the like is possible.

For example, with the signal RANA[3:0] set to 4'0011 and the signal RCON set to "1", the signal DACO is output from the pin PAIO. A DC offset voltage of the D/A circuit 278 can be obtained from the voltage of the pin PAIO.

For example, with the signal RANA[3:0] set to 4'0010, the signal TAMPO is output from the pin PAIO. An offset voltage of the I/V circuit 241 can be obtained from the voltage of the pin PAIO. In this case, in order that the I/V circuit 241 be operated as a voltage follower, the signal RIRF is "0" and the signal RITG[2:0] is 3'100, for example (see FIG. 12).

For example, with the signal RANA[3:0] set to 4'1010, the signal TCMPIN is input from the pin PAIO. The A/D portion 233 can be tested using the signal TCMPIN. For example, with the signal RTCM set to "0", a test of the A/D portion 233 in the current sensing mode may be executed.

In the current generation portion 258, the current IRFINT is generated by charging the capacitor Ct with a voltage. Thus, the current generation portion 258 achieves a wide range of output currents and can accurately adjust the values of the output currents. Accordingly, when the current generation portion 258 is incorporated into the SD-IC 200, a highly reliable test of the plurality of CM circuits 245 can be performed. This is described in Example 1.

When formed without using many resistors, the current generation portion 258 can have a small area. An area overhead of the SD-IC 200 caused by including the current generation portion 258 can be suppressed, which reduces the cost of the SD-IC 200.

Embodiment 3

In this embodiment, a display panel including the SD-IC of Embodiment 2 and a display system including the display panel are described.

<<Structure Example of Display System>>

Figure 19A:
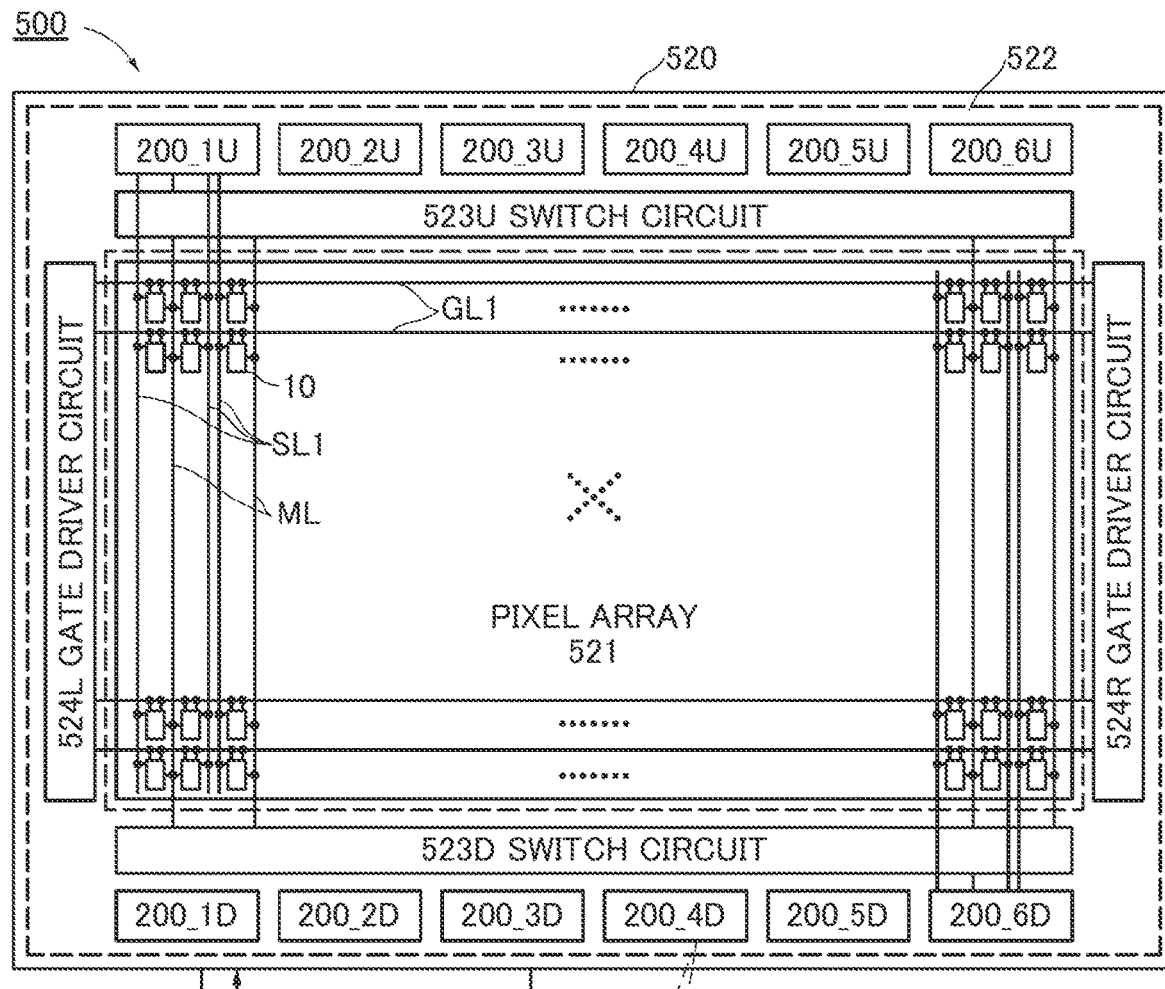
FIG. 19A is a block diagram illustrating a structure example of a display system.

FIG. 19A is a block diagram illustrating a structure example of a display system. A display system 500 includes a processor 510, a display controller 515, and a display panel 520.

The processor 510 includes an execution unit 512 and a memory device 513. The display controller 515 includes an image processor 516, a timing controller 517, and a memory device 518. The display panel 520 includes a pixel array 521 and a peripheral circuit 522.

The processor 510 executes various programs to control the entire display system 500. The execution unit 512 has a function of executing a program. For example, the execution unit 512 is an arithmetic logic unit (ALU), and the memory device 513 is a cache memory. Alternatively, as the execution unit 512, any of a variety of processors such as a central processing unit (CPU) and a microprocessor unit (MPU) can be used. In the case where the display system 500 is incorporated as an electronic component in an electronic device, for example, a processor of the electronic device (host device) is used as the processor 510.

The display controller 515 is a controller for controlling the display panel 520. The timing controller 517 generates a variety of signals for setting the timing of the operation of the peripheral circuit 522. The image processor 516 processes an image signal transmitted from the processor 510. The memory device 518 stores data necessary for the display controller 515 to execute processing. As examples of the data, image data processed by the image processor 516, parameter data used in the image processor 516 and the timing controller 517, and the like can be given.

The display panel 520 includes the pixel array 521 and the peripheral circuit 522. The pixel array 521 includes subpixels 10, gate lines GL1, source lines SL1, and wirings ML.

Figure 19B:
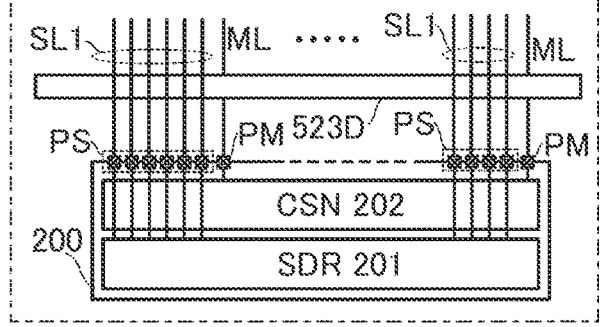
FIG. 19B is a schematic view illustrating a connection structure between an SD-IC and a pixel array.

The peripheral circuit 522 includes a switch circuit 523U, a switch circuit 523D, a gate driver circuit 524L, a gate driver circuit 524R, and 12 SD-ICs 200. Here, in order to distinguish the 12 SD-ICs 200 from each other, the reference numeral "200" is followed by "_1U", "_1D", or the like as illustrated in FIG. 19A. FIG. 19B schematically illustrates a connection structure between the SD-IC 200 and the pixel array 521.

The pins PS of the SD-IC 200 are electrically connected to the source lines SL1. The connection between the pin PM and the wiring ML is controlled by the switch circuit 523D (or the switch circuit 523U). Each of the switch circuits 523U and 523D is an interface between the pixel array 521 and the CSN portion 202. The SDR portion 201 of the SD-IC 200 processes an image signal transmitted from the display controller 515 to generate a grayscale signal supplied to the source line SL1. The CSN portion 202 of the SD-IC 200 senses a current flowing through the wiring ML. The signal CMDO generated by the CSN portion 202 is transmitted to the processor 510. The processor 510 processes the signal CMDO and updates a parameter used in the image processor 516, for example. A structure in which the signal CMDO is processed by the image processor 516 of the display controller 515 can also be employed.

The number of the SD-ICs 200 to be included in the display system 500 is determined in accordance with the specifications of the SD-IC 200, the number of pixels, and the like.

The gate driver circuit 524L generates a scan signal for selecting the subpixel 10 to which a grayscale signal is input, and inputs the scan signal to the gate line GL1. The same applies to the gate driver circuit 524R.

The switch circuits 523U and 523D and the gate driver circuits 524L and 524R have a gate-on-array structure and are formed over the same insulating surface as the pixel array 521. The SD-IC 200 is mounted by a chip on glass (COG) method. The structure of the peripheral circuit 522 is not limited to the above structure. The SD-IC 200 may have some of functions of the switch circuits 523U and 523D. Each of the gate driver circuits 524L and 524R may be formed of one or more gate driver ICs. Examples of methods of mounting an IC on the display panel 520 include a chip on film (COF) method and a tape automated bonding (TAB) method in addition to the COG method.

An FPC is mounted on the display panel 520. A voltage, a signal, and the like are input to the pixel array 521 and the peripheral circuit 522 through the FPC.

<<Pixel Array 521>>

Structure examples of the subpixel 10 and the pixel array 521 are described with reference to FIGS. 20A and 20B.

Figure 20A:
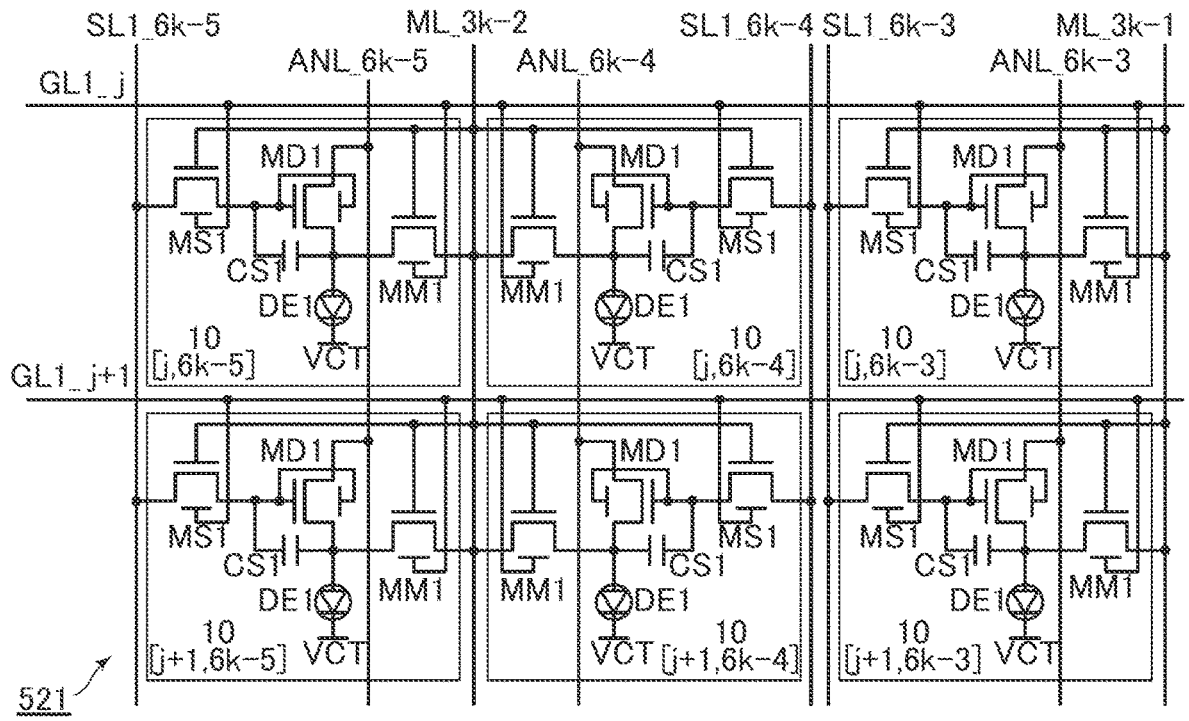
FIGS. 20A and 20B are diagrams illustrating a structure example of a pixel array.

FIG. 20A illustrates six subpixels 10 arranged in two rows and three columns. In this specification and the like, the gate line GL1_j (j is an integer greater than or equal to 1) is the gate line GL1 in a j-th row. The source line SL1_6k (k is an integer greater than or equal to 1) is the source line SL1 in a 6k-th column. The subpixel 10[j,6k] is the subpixel 10 in the j-th row and the 6k-th column.

The subpixel 10 includes an electroluminescent (EL) element DE1, transistors MS1, MD1, and MM1, and a capacitor CS1. The subpixel 10 is electrically connected to the gate line GL1, the source line SL1, the wiring ML, and a wiring ANL. In the example of FIG. 20A, the wiring ML is shared by two adjacent columns.

The EL element DE1 includes a pair of electrodes (a pixel electrode and a common electrode) and an EL layer. The EL layer includes a region sandwiched between a pair of electrodes. The EL layer includes at least a layer containing a light-emitting material (light-emitting layer). Another functional layer such as a layer containing an electron-transport material (electron-transport layer) or a layer containing a hole-transport material (hole-transport layer) can be provided in the EL layer. The EL element is referred to as an organic EL element when containing an organic light-emitting material, and is referred to as an inorganic EL element when containing an inorganic light-emitting material. One of a pair of electrodes functions as an anode, and the other functions as a cathode. In the example of FIG. 20A, the pixel electrode is the anode and the common electrode is the cathode. The pixel electrode is electrically connected to the transistor MD1 and the capacitor CS1, and a voltage VCT is input to the common electrode.

Although an example in which the display element of the subpixel is an EL element is described in this embodiment, a different light-emitting element can be used as the display element. Examples of the light-emitting element include a light-emitting diode, a light-emitting transistor, and a light-emitting element including a quantum dot.

The wiring ANL has a function of a voltage supply line, for example. The voltage of the wiring ANL may be set higher than the voltage VCT. Although the wiring ANL is provided in every column in the example of FIGS. 20A and 20B, one wiring ANL may be provided for a plurality of columns.

The transistor MS1 is referred to as a selection transistor, and the transistor MD1 is referred to as a driving transistor. The transistor MD1 functions as a current source for the EL element DE1. The transistor MD1 supplies a drain current corresponding to a gate voltage to the EL element DE1. The capacitor CS1 is a storage capacitor for holding the gate voltage of the transistor MD1. The transistor MM1 controls readout of a current from the subpixel 10 to the wiring ML. Here, a transistor having a function like the transistor MM1 is referred to as a monitor transistor.

Each of the transistors MS1, MD1, and MM1 is an OS transistor with a back gate. The back gates of the transistors MS1 and MM1 are electrically connected to the gate line GL1. Gates of the transistors MS1 and MM1 are electrically connected to the wiring ML. The back gate of the transistor MD1 is electrically connected to a gate thereof.

Figure 20B:
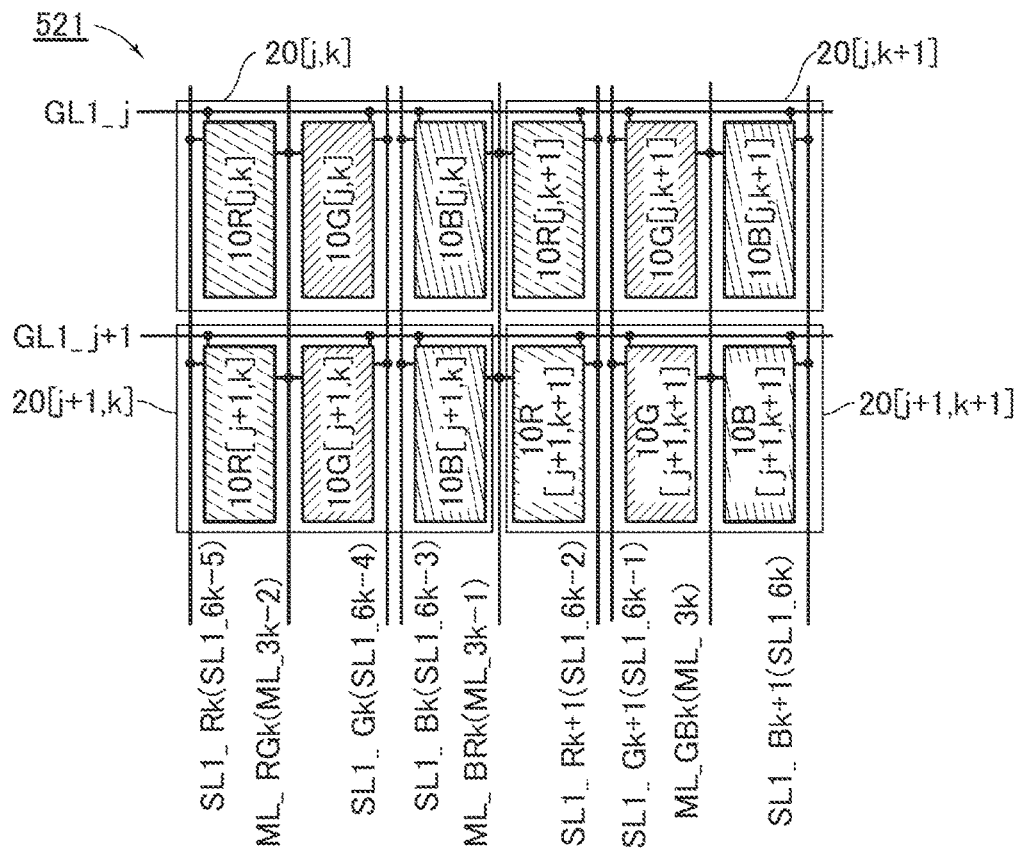

As illustrated in FIG. 20B, three kinds of subpixels 10 for displaying red (R), green (G), and blue (B) are provided in the pixel array 521. The three (RGB) subpixels 10 constitute a pixel 20.

To distinguish components according to the color expressed by the subpixels, an identification sign such as "R" or "_R" is added. For example, the subpixel 10R represents a red subpixel 10. The source line SL1_Gk is the source line SL1 in a k-th column to which a grayscale signal for green is input.

The number of the subpixels in the pixel array 521 is $2N_c \times 3$ (RGB) in the row (horizontal) direction and $N_r$ in the column (vertical) direction (each of $N_r$ and $N_c$ is an integer greater than or equal to 1).

In the case where the display resolution of the display panel 520 is 8K4K (7680×4320), for example, the number of the subpixels 10 is 7680×3 (RGB)×4320. The number of each of the source lines SL1_R, SL1_G, and SL1_B is 7680. The number of the wirings ML is 3840×3.

The structure of the pixel is not limited to the structure illustrated in the example of FIG. 20B and may be a structure in which one subpixel 10R, two subpixels 10G, and one subpixel 10B constitute one pixel, for example. Examples of a combination of colors of the subpixels 10 include [C (cyan), M (magenta), Y (yellow)], [R, G, B, W (white)], [R, G, B, Y], and [R, G, B, C].

<Switch Circuit 523U and Switch Circuit 523D>

Figure 21A:
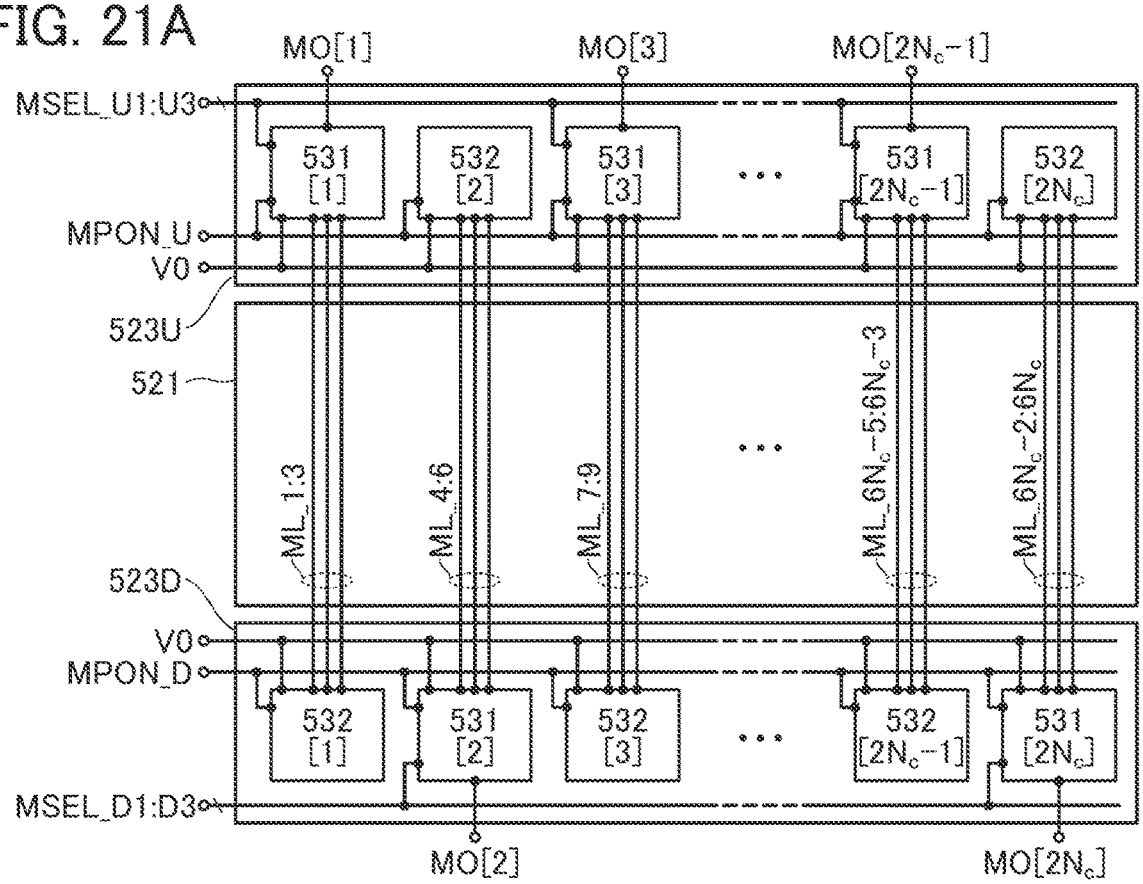
FIGS. 21A and 21B are diagrams illustrating a structure example of a switch circuit.
Figure 21B:
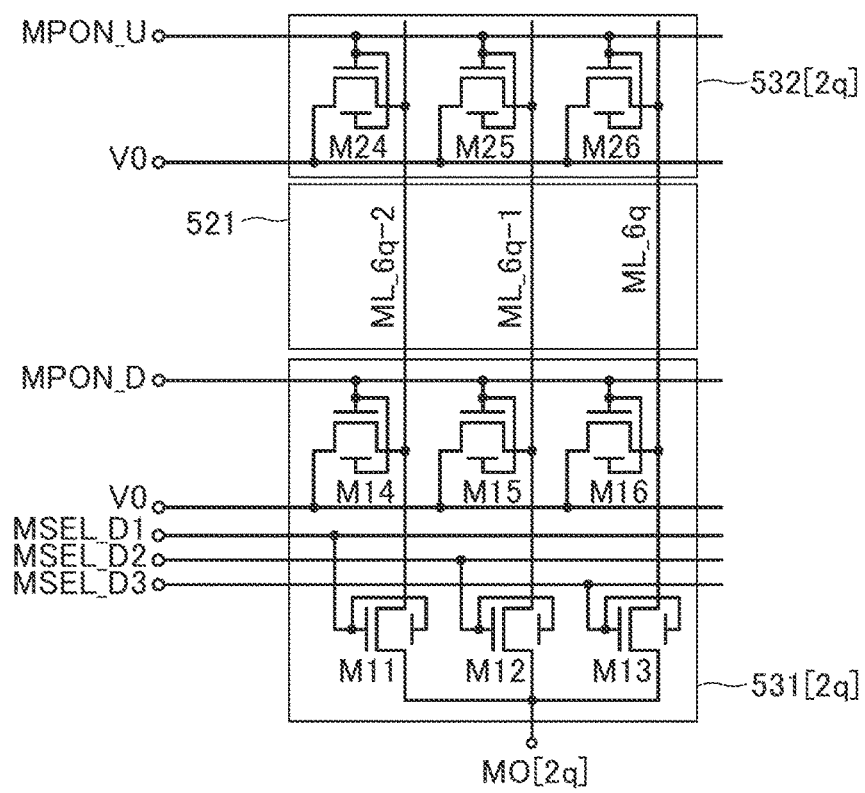

The switch circuits 523U and 523D are described with reference to FIGS. 21A and 21B.

A voltage V0 and signals MPON_U and MSEL_U[1] to MSEL_U[3] are input to the switch circuit 523U. The voltage V0 and signals MPON_D and MSEL_D[1] to MSEL_D[3] are input to the switch circuit 523D.

The switch circuit 523U includes $N_c$ terminals MO[2q−1], $N_c$ circuits 531[2q−1], and $N_c$ circuits 532[2q]. The switch circuit 523D includes $N_c$ terminals MO[2q], $N_c$ circuits 532[2q−1], and $N_c$ circuits 531[2q]. Note that q is an integer greater than or equal to 1 and less than or equal to $N_c$. The terminal MO is electrically connected to the pin PM of the SD-IC 200.

The circuit 531 includes transistors M11 to M16. The circuit 532 includes transistors M24 to M26. Each of the transistors M11 to M16 and the transistors M24 to M26 is an OS transistor with a back gate.

The circuit 531 controls electrical continuity between three wirings ML and the terminal MO. The wiring ML to be electrically connected to the terminal MO is selected with the signals MSEL_U1 to MSEL_U3 and MSEL_D1 to MSEL_D3. By the circuits 531 and 532, the voltage V0 can be input from both ends of the wiring ML. By the signals MPON_U and MPON_D, input of the voltage V0 to the wiring ML is controlled. The voltage V0 is input to the wiring ML while the display panel 520 displays an image. To sense a current flowing through the subpixel 10, electrical continuity between one or more wirings ML and the terminal MO is established.

Figure 22:
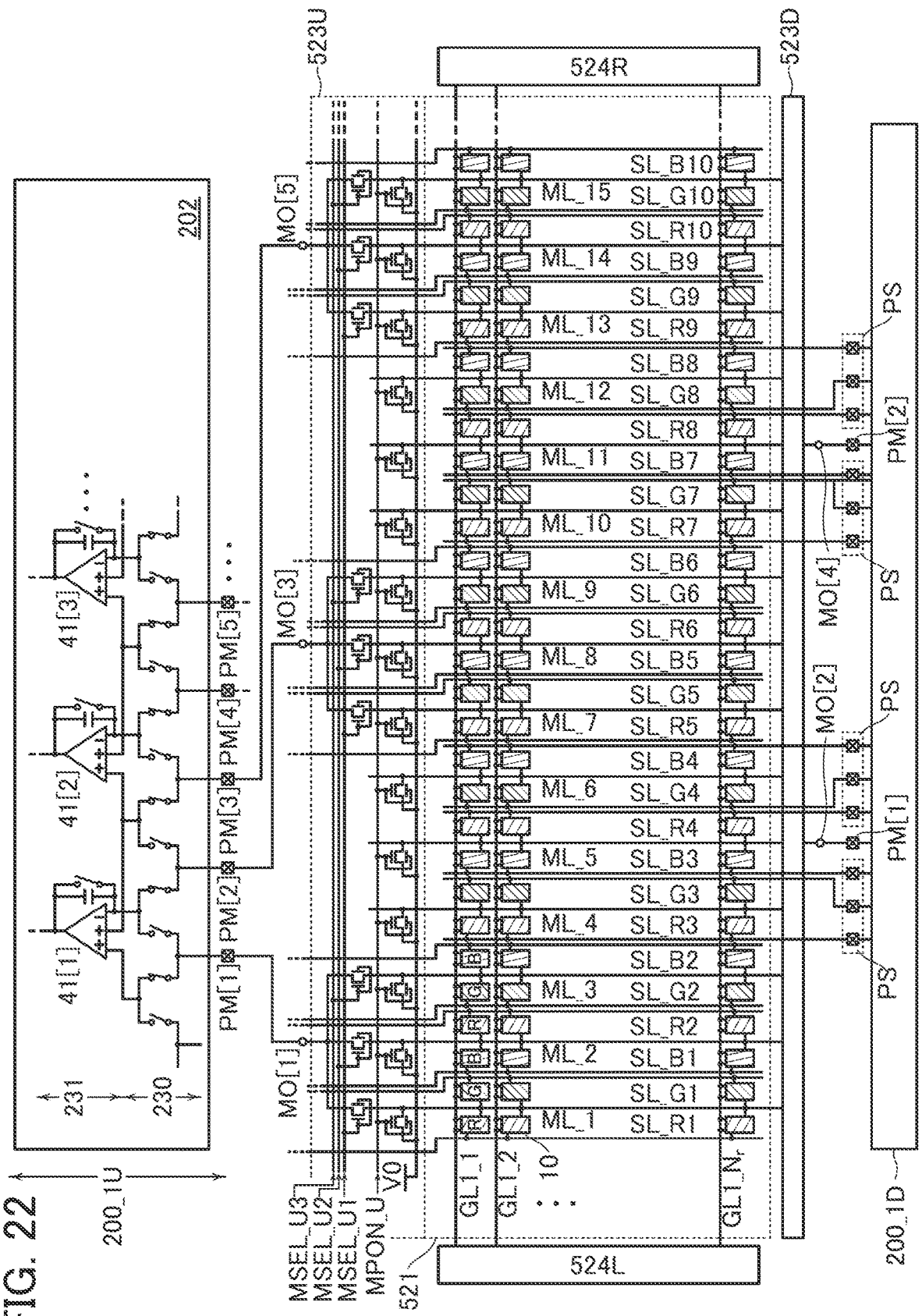
FIG. 22 is a diagram illustrating an example of a connection structure between a pixel array, a gate driver circuit, and an SD-IC.

With reference to FIG. 22, the connection structure between the pixel array 521, the gate driver circuits 524L and 524R, and the SD-ICs 200 is described.

The gate lines GL1_1 to GL1_$N_r$ are electrically connected to both of the gate driver circuits 524L and 524R. The gate driver circuits 524L and 524R have the same circuit structure and include OS transistors. A scan signal is input from both ends of the gate line GL1 at the same time by the gate driver circuits 524L and 524R. Alternatively, for example, the gate lines GL1 in odd-numbered rows may be driven by the gate driver circuit 524L, and the gate lines GL1 in even-numbered rows may be driven by the gate driver circuit 524R.

The connection destination (the SD-IC 200) of the source lines SL1 and the wirings ML changes every two columns of pixels (every six columns of subpixels). FIG. 22 typically illustrates a connection structure between the pixel array 521 and the SD-ICs 200_1U and 200_1D. A main part of the CSN portion 202 of the SD-IC 200_1U is simplified.

The connection destination (the SD-IC 200) of the wirings ML changes every three wirings between the SD-IC_1U and the SD-IC_1D. A terminal MO[1], a terminal MO[3], and a terminal MO[5] are electrically connected to the pin PM[1], the pin PM[2], and the pin PM[3], of the SD-IC 200_1U, respectively. A terminal MO[2] and a terminal MO[4] are electrically connected to the pin PM[1] and the pin PM[2], of the SD-IC 200_1D, respectively.

The connection destination (the SD-IC 200) of the source lines SL1_R changes every two wirings between the SD-IC 200_1U and the SD-IC 200_1D. The same applies to the source lines SL1_G and SL1_B.

<<Current Sensing>>

Figure 23:
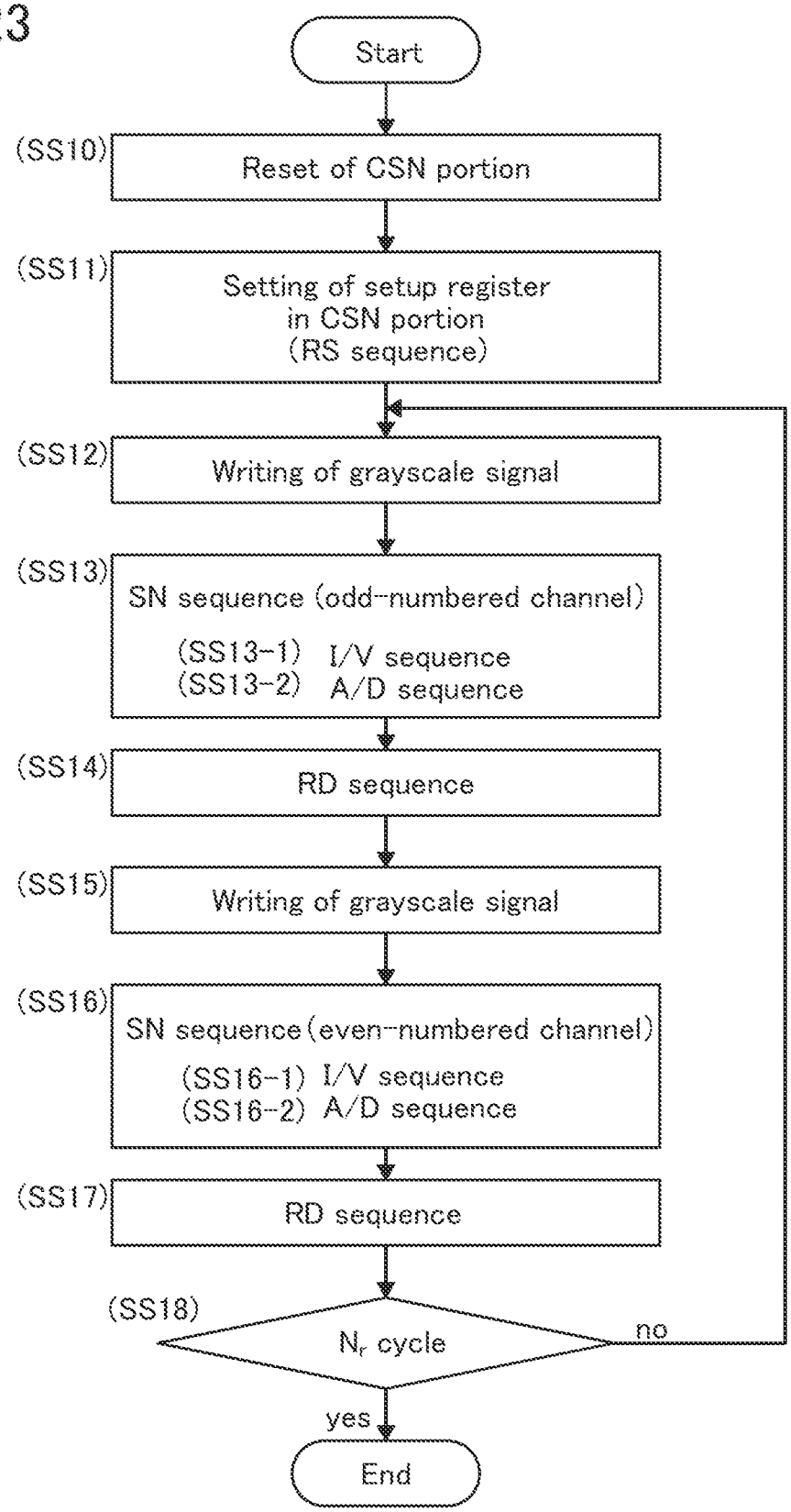
FIG. 23 is a flow chart showing an example of a current sensing operation of a display system.
Figure 24:
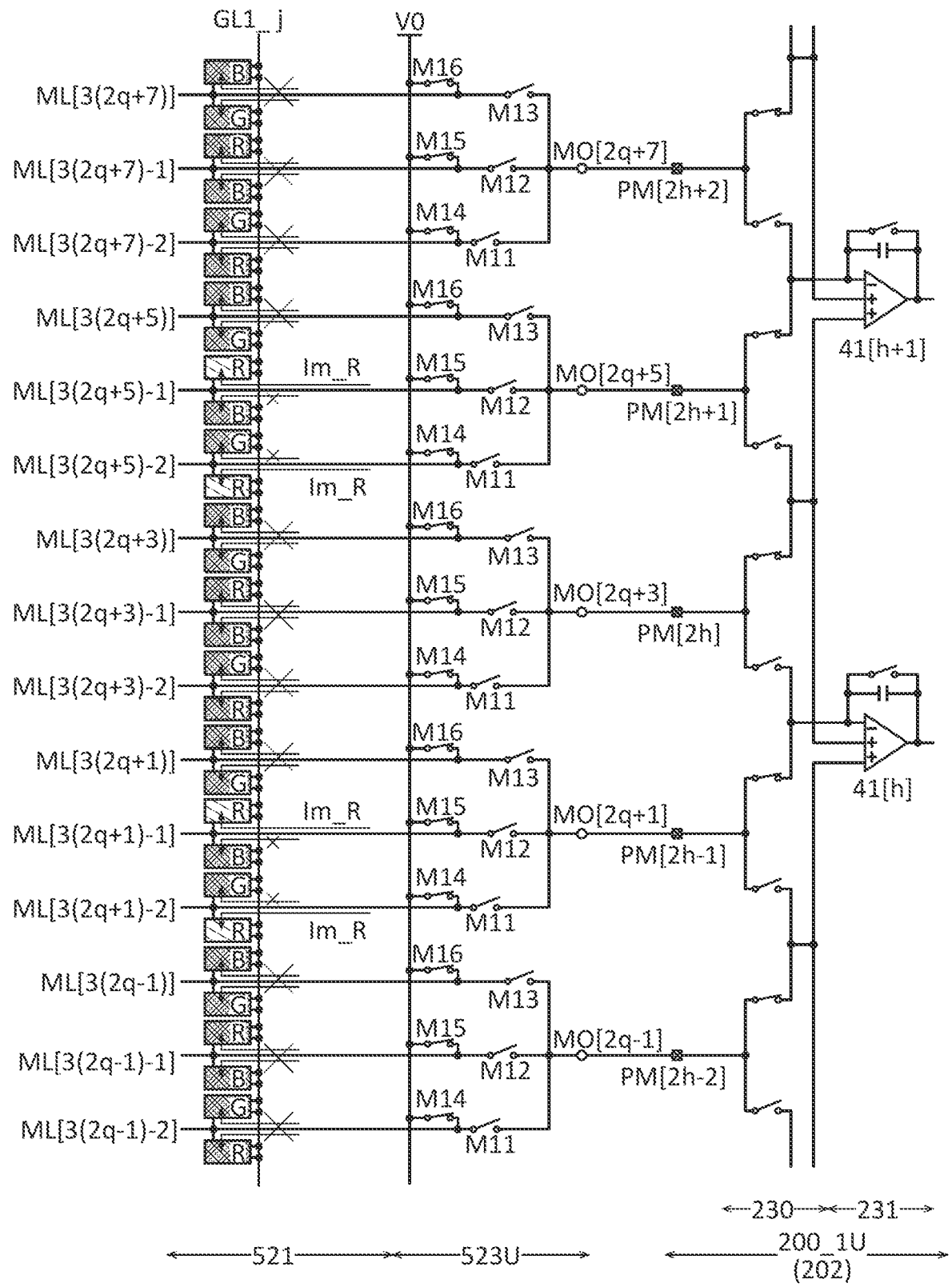
FIG. 24 is a simplified circuit diagram for describing a current sensing operation example.
Figure 25:
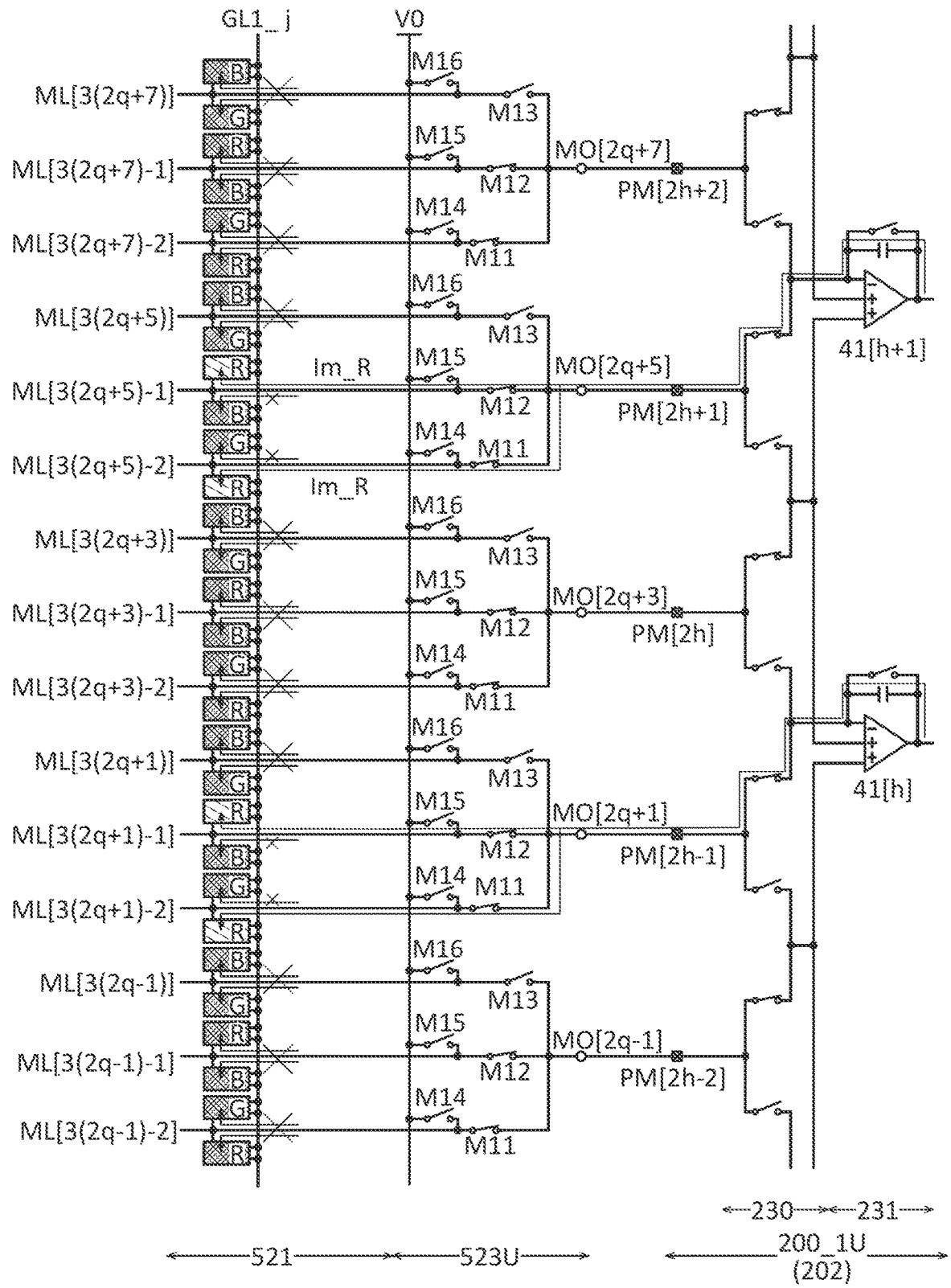
FIG. 25 is a simplified circuit diagram for describing a current sensing operation example.

A current sensing operation example is described with reference to FIG. 23, FIG. 24, and FIG. 25. FIG. 23 is a flow chart of a current sensing operation example. FIG. 24 and FIG. 25 are simplified circuit diagrams for describing the current sensing operation example.

(Step SS10)

The signal CMRST at "H" is input to the CSN portion 202, and thus the CSN portion 202 is reset.

(Step SS11)

The RS sequence is executed, and configuration data for bringing the mode of the CSN portion 202 to the current sensing mode is written to the setup register 271 of the CSN portion 202. The subsequent steps are described using an example where the sensing mode of the I/V portion 231 is the 3-input differential sensing mode.

Steps SS12 to SS17 are one cycle of the current sensing operation. In Step SS12, grayscale signals are written to the subpixels 10 in a j-th row. The CSN portion 202 executes the SN sequence and the RD sequence of the odd-numbered channels (Steps SS13 and SS14). In Step SS15, grayscale signals are written to the subpixels 10 in the j-th row. The CSN portion 202 executes the SN sequence and the RD sequence of the even-numbered channels (Steps SS16 and SS17). Steps SS12 to SS17 are executed the same number of times as the number of rows ($N_r$) in the pixel array 521, and the current sensing operation is terminated (Step SS18).

(Step SS12)

Grayscale signals are written to the subpixels 10 by the peripheral circuit 522. In the case of Step SS12 in the j-th cycle, for example, the gate line GL1_j is selected, and grayscale signals are written to the subpixels 10 in the j-th row.

In Step SS13, the CSN portion 202 senses currents for the odd-numbered channels. Accordingly, in Step SS12, grayscale signals written to the target subpixels 10 in Step SS13 are different from grayscale signals written to the nontarget subpixels 10 in Step SS13. A grayscale signal for the subpixel 10 that is targeted to be sensed is referred to as a "grayscale signal CM", and a grayscale signal for the nontarget subpixel 10 is referred to as a "grayscale signal NL".

When the gate line GL1_j is in a selected state, a current Im flows between the transistor MM1 of the subpixel 10 to which the grayscale signal CM has been written and the wiring ML, and the current Im does not flow between the transistor MM1 of the subpixel 10 to which the grayscale signal NL has been written and the wiring ML. For example, a grayscale signal (a grayscale signal for black display) with a grayscale value of 0 is used as the grayscale signal NL.

Step SS12 is described with reference to FIG. 24. In Step SS12, the transistors M14 to M16 and the transistors M24 to M26 in the switch circuits 523U and 523D are turned on, and the voltage V0 is input to the wiring ML. Next, the gate line GL1_j is selected, and grayscale signals are written to the subpixels 10R, 10G, and 10B in the j-th row.

In the example of FIG. 24, the subpixels 10R are targeted, and the subpixels 10G and 10B are not targeted. Grayscale signals NL_G and Grayscale signals NL_B are written to the subpixels 10G and the subpixels 10B, respectively. Grayscale signals CM_R are written to the subpixels 10R in a column electrically connected to the pins PM in the odd-numbered channels, and grayscale signals NL_R are written to the other subpixels 10R. The transistors MM1 are in an on state while the gate line GL1_j is selected, and thus currents Im_R flow between the subpixels 10R to which the grayscale signals CM_R have been written and the wirings ML.

(Step SS13-1)

Next, the terminals MO and the wirings ML are electrically connected to each other in order to execute the I/V sequence in the CSN portion 202. The transistors M14 to M16 and the transistors M24 to M26 in the switch circuits 523U and 523D are turned off, and the transistors M11 and M12 are turned on (FIG. 25). The I/V circuit 241 of the CSN portion 202 converts a current flowing through the terminal INM into a voltage using an average voltage of voltages of the terminals INP1 and INP2 as a reference voltage. At the timing of termination of the I/V sequence, the transistors M11 and M12 in the switch circuits 523U and 523D are turned off, and thus electrical continuity between the terminals MO and the wirings ML is broken.

There is high similarity between the noise components of the adjacent wirings ML. When the currents Im_R of the subpixels 10R are sensed in the 3-input differential sensing mode, an output signal of the I/V circuit 241 can remove the noise components effectively, so that the values of the currents Im_R flowing through the subpixels 10R can be obtained with higher accuracy.

(Step SS13-2)

The CSN portion 202 executes the A/D sequence. The A/D circuit 243 converts an output voltage of the I/V circuit 241 into digital data. The transistors M14 to M16 and the transistors M24 to M26 in the switch circuits 523U and 523D are turned on while the CSN portion 202 executes the A/D sequence, and the voltage V0 is input to the wiring ML.

(Step SS14)

The CSN portion 202 executes the R/D sequence and outputs the signal CMDO[3:0].

(Step SS15)

Step SS15 is executed in a manner similar to that of Step SS12. The grayscale signals NL_G and NL_B are written to the subpixels 10G and 10B, respectively. The grayscale signals CM_R are written to the subpixels 10R in a column that is targeted to be sensed in Step S S16, and the grayscale signals NL_R are written to the other subpixels 10R in the column that is targeted to be sensed.

The SDR portion 201 and the CSN portion 202 are operated independently, and thus Step SS15 can be executed while the AD sequence (Step SS13-2) or the RD sequence (Step SS14) is executed.

(Step SS16)

Step SS16 is executed in a manner similar to that of Step SS13, and the CSN portion executes the IV sequence (Step SS16-1) and the AD sequence (Step SS16-2).

(Step SS17)

The CSN portion 202 executes the R/D sequence and outputs the signal CMDO[3:0].

(Step SS18)

In the operation example in FIG. 23, the number of cycles of Steps SS12 to SS18 is set to $N_r$, and currents of the subpixels 10 are sensed row by row. The number of cycles is not limited to $N_r$. The number of cycles is set in accordance with the number of the subpixels that are targeted to be sensed, and the like.

The driving transistors (transistors MD1) in the subpixels 10 each have an extremely low drain current, which is as low as approximately one nanoampere to several hundred nanoamperes. The CM circuit 245 in the CSN portion 202 can sense such a minute current. In the 3-input differential sensing mode, the I/V circuit 241 can obtain an analog signal with a high SNR, so that the CM circuit 245 is capable of high-accuracy current sensing. When the signal CMDO[3:0] is used, grayscale signals to be written to the subpixels 10 can be corrected more appropriately. Thus, the display system 500 including the SD-IC 200 as a source driver circuit can have excellent display quality.

<<Other Structure Examples of Pixel Array and Subpixel>>

Other structure examples of the pixel array and the subpixel are described with reference to FIGS. 26A to 26C, FIG. 27, and FIGS. 28A and 28B.

Figure 26A:
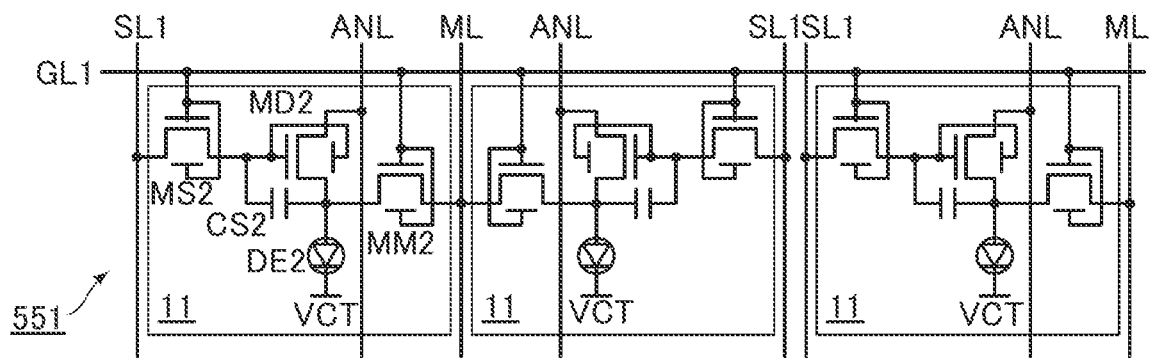
FIGS. 26A to 26C are circuit diagrams each illustrating a structure example of a pixel array.

A pixel array 551 illustrated in FIG. 26A is a modification example of the pixel array 521 and includes subpixels 11 instead of the subpixels 10. The subpixel 11 includes a transistor MS2, a transistor MD2, a transistor MM2, a capacitor CS2, and an EL element DE2.

A back gate of the transistor MS2 is electrically connected to a gate thereof, and a back gate of the transistor MM2 is electrically connected to a gate thereof. The gates of the transistors MS2 and MM2 are electrically connected to the gate line GL1.

Figure 26B:
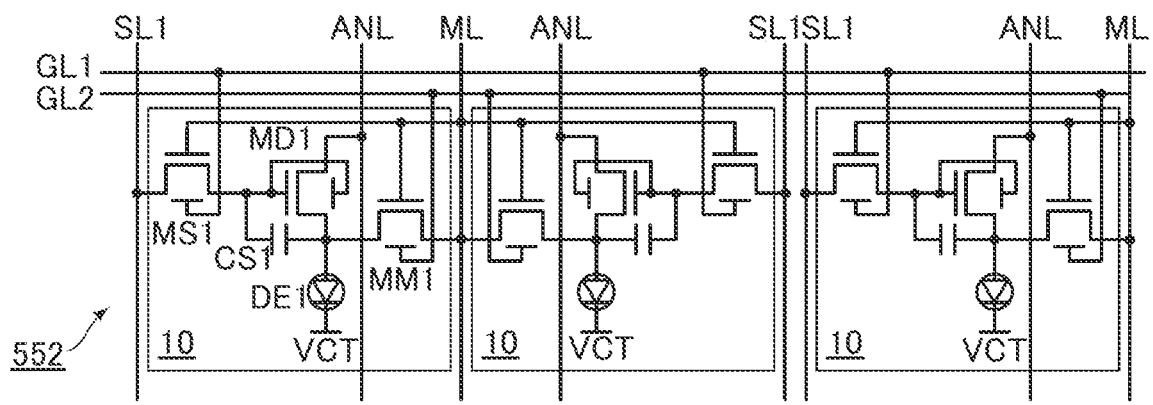

In a pixel array 552 illustrated in FIG. 26B, two gate lines GL1 and GL2 are provided for one row. The back gate of the transistor MM1 is electrically connected to the gate line GL2. The on/off of the transistor MS1 and the transistor MM1 can be controlled independently. The pixel array 552 may include the subpixels 11 instead of the subpixels 10.

Figure 26C:
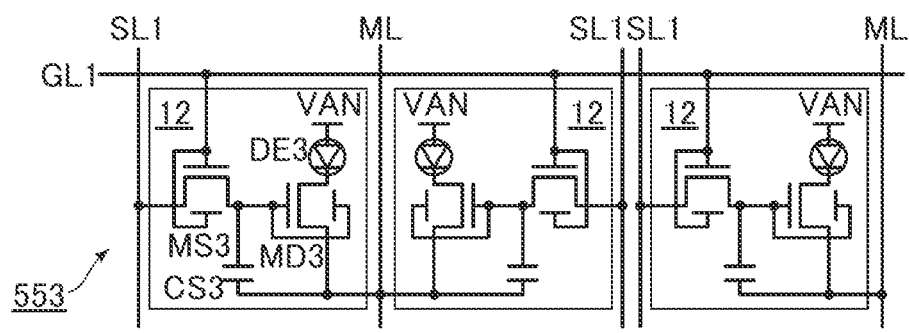
Figure 27:
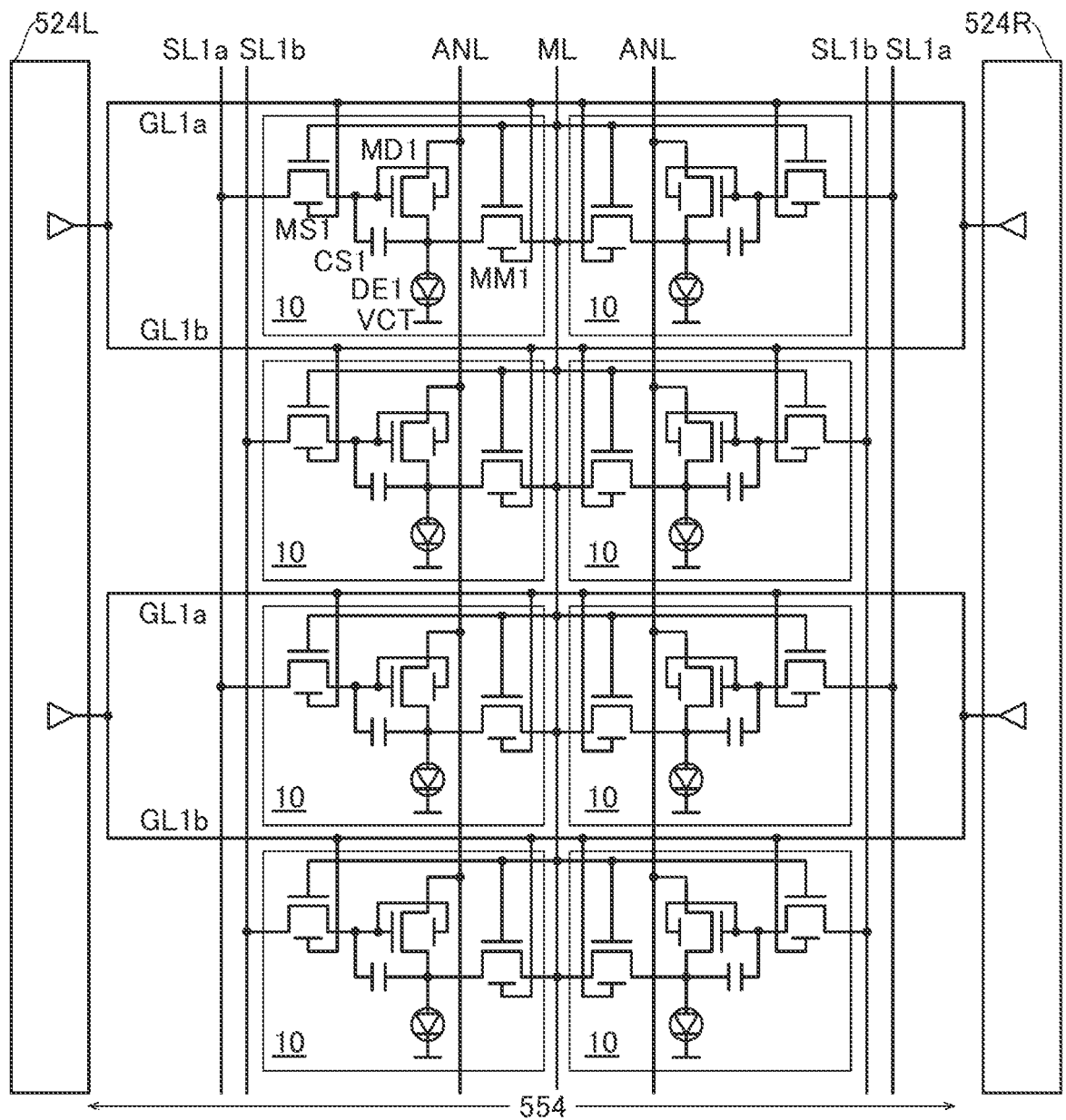
FIG. 27 is a circuit diagram illustrating a structure example of a pixel array.
Figure 28A:
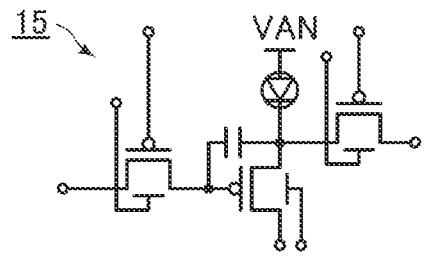
FIGS. 28A and 28B are circuit diagrams illustrating structure examples of a subpixel.
Figure 28B:
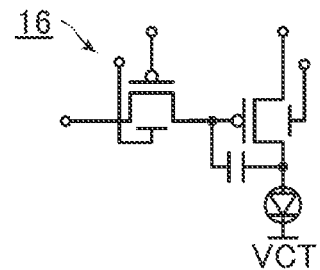

A pixel array 553 illustrated in FIG. 26C includes the gate line GL1, the source line SL, the wiring ML, and a subpixel 12. The subpixel 12 includes a transistor MS3, a transistor MD3, a capacitor CS3, and an EL element DE3. A gate and a back gate of the transistor MS3 are electrically connected to the gate line GL1. A pixel electrode functions as a cathode of the EL element DE3. A common electrode functions as an anode of the EL element DE3 and is supplied with a voltage VAN.

A plurality of source lines may be provided for one column. In a pixel array 554 illustrated in FIG. 27, source lines SL1a and SL1b are provided for one column. Gate lines GL1a and GL1b are provided for the source lines SL1a and SL1b, respectively. Scan signals are input from the gate driver circuits 524L and 524R to the gate lines GL1a and GL1b at the same timing. The pixel array 554 includes the subpixels 10 in the example of FIG. 27 but may include different subpixels.

When the plurality of source lines are provided for one column, a plurality of rows can be selected at the same time. When the number of the source lines is two, one horizontal period is doubled, so that data writing time can be made long. Accordingly, the pixel array 554 is suitable for a large-screen display system (e.g., with a diagonal of 50 inches or more) and a display system to which an image signal with high resolution (e.g., a gray scale of 12 bits and 120 Hz) is input.

The transistor of the subpixel is not limited to an OS transistor and may be a polycrystalline silicon transistor, for example. In the case where a polycrystalline silicon transistor is used, the subpixel can include a p-channel transistor. A subpixel 15 illustrated in FIG. 28A includes three p-channel transistors. A subpixel 16 illustrated in FIG. 28B includes two p-channel transistors.

Some or all of the transistors in the subpixel may be transistors without back gates. The driving transistor is preferably a transistor with a back gate. This is because when a back gate is provided, the saturation characteristics of the Id-Vd characteristics and the current drive capability can be improved.

Embodiment 4

In Embodiment 4, structure examples of a display panel are described with reference to FIG. 29 and FIGS. 30A and 30B.

Figure 29:
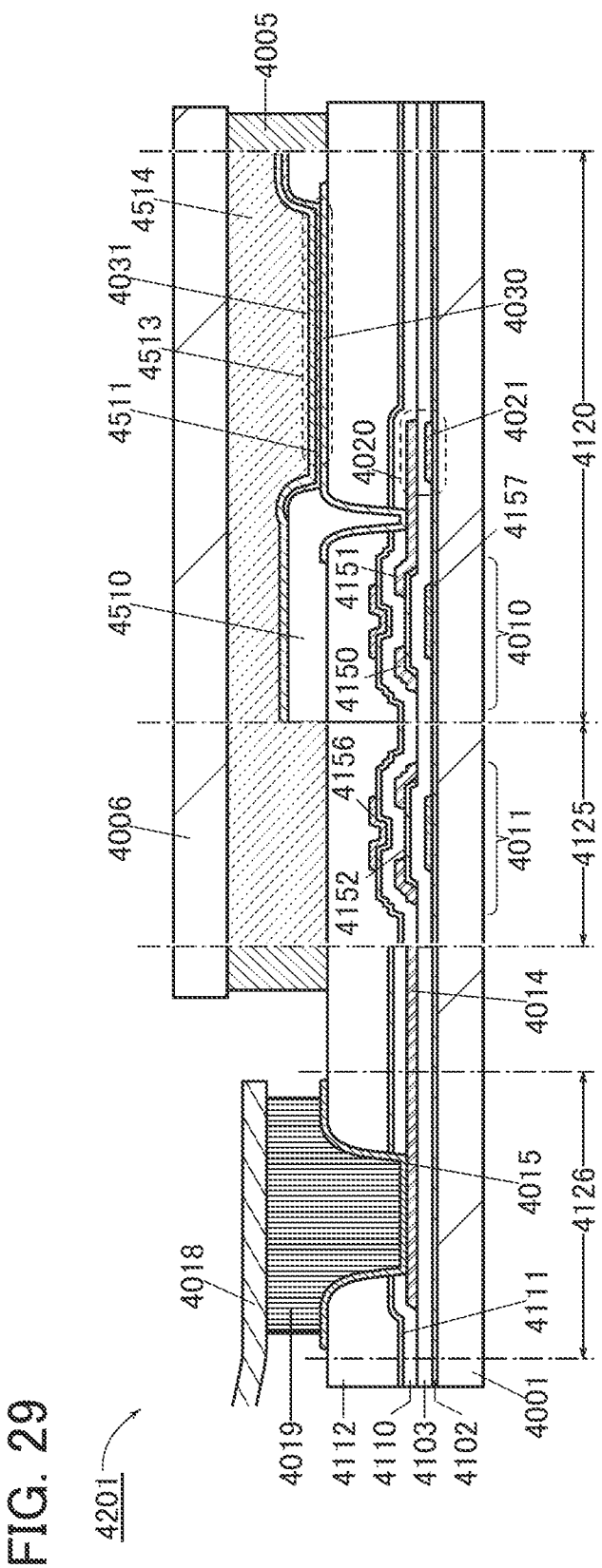
FIG. 29 is a cross-sectional view illustrating a structure example of a display panel.

In a display panel 4201 illustrated in FIG. 29, a substrate 4001 is a base substrate of an element substrate, and a substrate 4006 is a base substrate of a counter substrate.

The substrate 4001 is provided with a pixel array 4120, a gate driver circuit 4125, and a terminal portion 4126. In FIG. 29, a transistor 4010, a capacitor 4020, and an EL element 4513 included in the pixel array 4120 and a transistor 4011 included in the gate driver circuit 4125 are illustrated as an example. Over the substrate 4001, insulating layers 4102, 4103, 4110, 4111, and 4112 are provided.

The transistors 4010 and 4011 are provided over the insulating layer 4102. The transistors 4010 and 4011 each include conductive layers 4150 and 4151, a semiconductor layer 4152, and conductive layers 4156 and 4157. The conductive layers 4150 and 4151 form a source electrode and a drain electrode. The conductive layer 4156 forms a back gate electrode, and the conductive layer 4157 forms a gate electrode.

The capacitor 4020 includes a region where the conductive layer 4151 and a conductive layer 4021 overlap with each other with the insulating layer 4103 sandwiched therebetween.

The terminal portion 4126 is provided with conductive layers 4014 and 4015. The conductive layer 4015 is electrically connected to a terminal included in an FPC 4018 through an anisotropic conductive layer 4019. The conductive layer 4015 is electrically connected to the conductive layer 4014. The conductive layer 4014 forms a terminal, and the conductive layer 4015 forms a lead wiring.

The semiconductor layer 4152 includes a channel formation region. The semiconductor layer 4152 is, for example, a metal oxide layer or a silicon layer.

In the case where the semiconductor layer 4152 is a metal oxide layer, for example, the metal oxide layer preferably contains at least one of indium (In) and zinc (Zn). Typical examples of such a metal oxide include an In oxide, a Zn oxide, an In—Zn oxide, and an In-M-Zn oxide (the element M is Al, Ti, Ga, Y, Zr, La, Ce, Nd, or Hf).

In the case where the transistors 4010 and 4011 are OS transistors, the semiconductor layer 4152 is, for example, a metal oxide layer of one to three layers.

A conductive layer 4030 is provided over the insulating layer 4112. A partition wall 4510 is provided over the conductive layer 4030 and the insulating layer 4112. Stacked layers of a light-emitting layer 4511 and a conductive layer 4031 are provided over the partition wall 4510. The partition wall 4510 is formed using an organic insulating material or an inorganic insulating material. It is particularly preferable that the partition wall be formed using a photosensitive resin material to have an opening over the conductive layer 4030 so that a side surface of the opening is formed as an inclined surface with continuous curvature.

The EL element 4513 is formed of stacked layers of the conductive layer 4030, the light-emitting layer 4511, and the conductive layer 4031. The conductive layer 4030 is a pixel electrode, and the conductive layer 4031 is a common electrode. The light-emitting layer 4511 may be a single layer or stacked layers.

A protective layer may be formed over the conductive layer 4031 and the partition wall 4510 in order to prevent entry of oxygen, hydrogen, moisture, carbon dioxide, or the like into the EL element 4513. As the protective layer, silicon nitride, silicon nitride oxide, aluminum oxide, aluminum nitride, aluminum oxynitride, aluminum nitride oxide, diamond like carbon (DLC), or the like can be used.

The substrate 4006 is fixed to the substrate 4001 with a sealant 4005. A space sealed by the sealant 4005 between the substrate 4001 and the substrate 4006 is filled with a filler 4514. As the filler 4514, an ultraviolet curable resin or a thermosetting resin can be used as well as an inert gas such as nitrogen or argon; for example, polyvinyl chloride (PVC), an acrylic resin, a polyimide resin, an epoxy resin, a silicone resin, polyvinyl butyral (PVB), ethylene vinyl acetate (EVA), or the like can be used. A drying agent may be contained in the filler 4514. A glass material such as a glass frit, or a resin that is curable at room temperature such as a two-component-mixture-type resin, a light curable resin, a thermosetting resin, and the like can be used as the sealant 4005. A drying agent may be contained in the sealant 4005.

A color filter layer, a black matrix layer, a polarizing plate, a circularly polarizing plate (including an elliptically polarizing plate), a retardation plate (a quarter-wave plate or a half-wave plate), or the like may be provided as appropriate. These components may be provided on the substrate 4006 side if the display panel 4201 is of a top-emission type, and provided on the substrate 4001 side if the display panel 4201 is of a bottom-emission type.

Figures 30A, 30B:
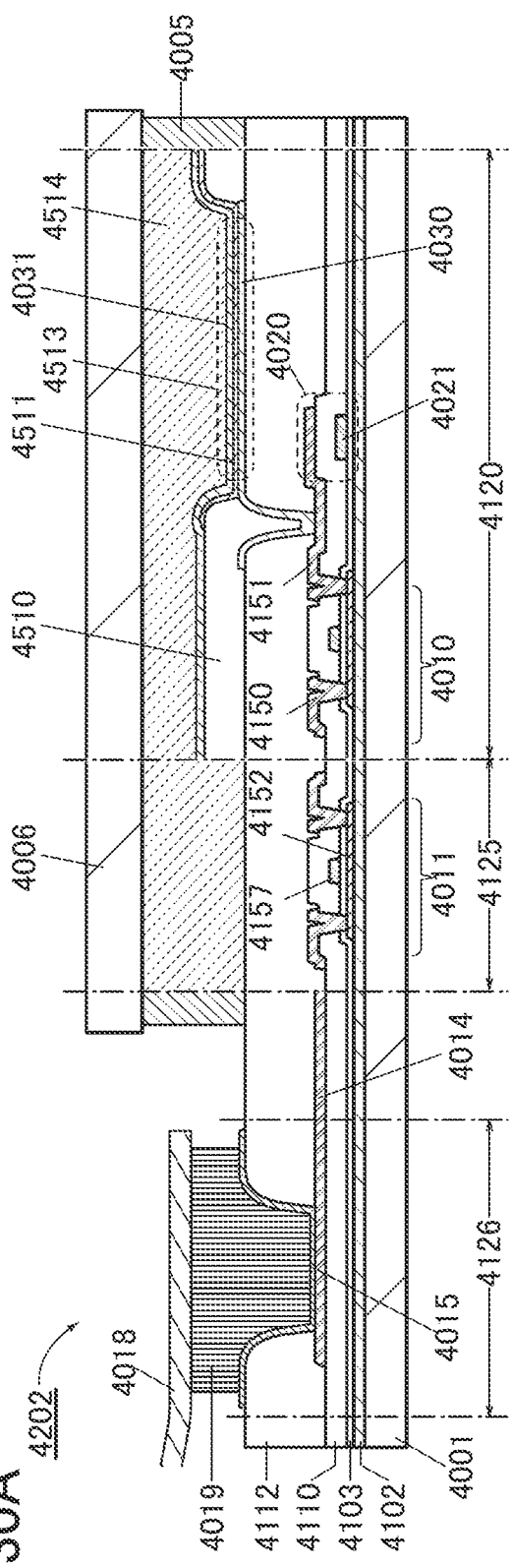
FIGS. 30A and 30B are cross-sectional views illustrating structure examples of a display panel.

Other structure examples of the display panel are illustrated in FIGS. 30A and 30B. A display panel 4202 illustrated in FIG. 30A and a display panel 4203 illustrated in FIG. 30B are different from the display panel 4201 in transistor structure. The transistors 4010 and 4011 in the display panel 4202 are of a top-gate type. The transistors 4010 and 4011 in the display panel 4203 are of a top-gate type with a back gate electrode.

Embodiment 5

The display system disclosed in this specification and the like can be used in display portions of various electronic devices. The luminance of the display portion can be corrected by the SD-IC disclosed in this specification and the like; thus, the number of bits of grayscale data, the size of a screen, and the number of pixels can be easily increased. Examples of electronic devices include a television receiver (hereinafter, a TV device), a virtual-reality (VR) head-mounted display, a medical display device (a display device of a diagnostic imaging device), a digital signage, a simulator for simulating the operation of an aircraft, a ship, an automobile, a machine, or the like, a digital camera, a digital video camera, a mobile device (e.g., a tablet terminal, a smartphone, or a game console), and a wearable device.

Some specific examples of electronic devices provided with the display system are described below with reference to FIGS. 31A to 31D, FIGS. 32A to 32C, and FIGS. 33A and 33B.

A TV device 2010 illustrated in FIG. 31A includes a display portion 2011, a housing 2013, a support base 2015, and the like. The TV device 2010 is, for example, a 30- to 110-inch 8K TV device.

A display device 2020 illustrated in FIG. 31B includes a display portion 2021, a housing 2023, a support base 2025, and the like. The display device 2020 can be used as a monitor of a computer, a game machine, or the like. When a receiver for television broadcasting is incorporated into the display device 2020, the display device 2020 can be utilized as a television (TV) receiver.

FIGS. 31C and 31D illustrate structural examples of medical display devices. A medical display device 2040 illustrated in FIG. 31C includes a display portion 2041, a housing 2043, and a support portion 2045. The support portion 2045 enables the medical display device 2040 to be fixed to a ceiling, a wall, or the like. For example, the medical display device 2040 is installed in an operating room, an intensive care unit, or the like. The display portion 2041 displays an image of a surgical field or an affected area, patient information (e.g., an electrocardiogram or blood pressure), or a medical image (e.g., an X-ray image or an MRI image).

A medical display device 2050 illustrated in FIG. 31D includes a display portion 2051, a housing 2053, and a support base 2055. The medical display device 2050 is a stationary display device and is used for medical image diagnosis, for example. The housing 2053 is rotatably attached to the support base 2055, and the display portion 2253 can be rotated to a horizontal (landscape) position or a vertical (portrait) position depending on an image to be displayed.

Figure 32A:
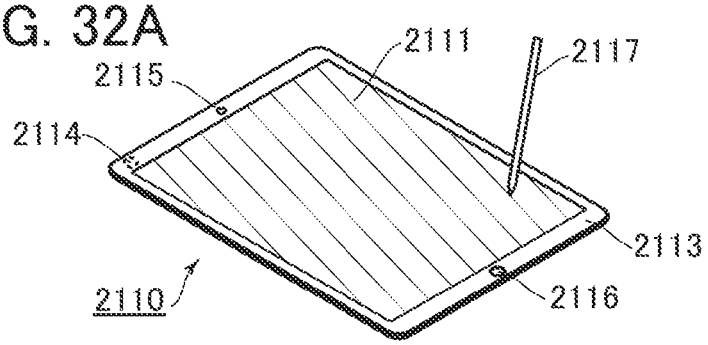
FIGS. 32A to 32C are diagrams illustrating structure examples of an electronic device.

An information terminal 2110 shown in FIG. 32A includes a display portion 2111, a housing 2113, an optical sensor 2114, a camera 2115, and an operation button 2116. The information terminal 2110 has functions of a voice call, a video call with the use of the camera 2115, e-mailing, an appointment organizer, Internet communication, music reproduction, and the like. For example, the information terminal 2110 that stores data of an electronic textbook can be used as a digital textbook reader.

The display portion 2111 includes the display system in which a touch sensor device is incorporated. The information terminal 2110 can be operated when a stylus pen 2117 (or an electronic pen), a finger, or the like touches a screen of the information terminal 2110. The brightness, color tone, or the like of the display portion 2111 can be changed on the basis of data of environmental light detected by the optical sensor 2114. Display portions of electronic devices described below as examples have a function similar to that of the display portion 2111.

Figure 32B:
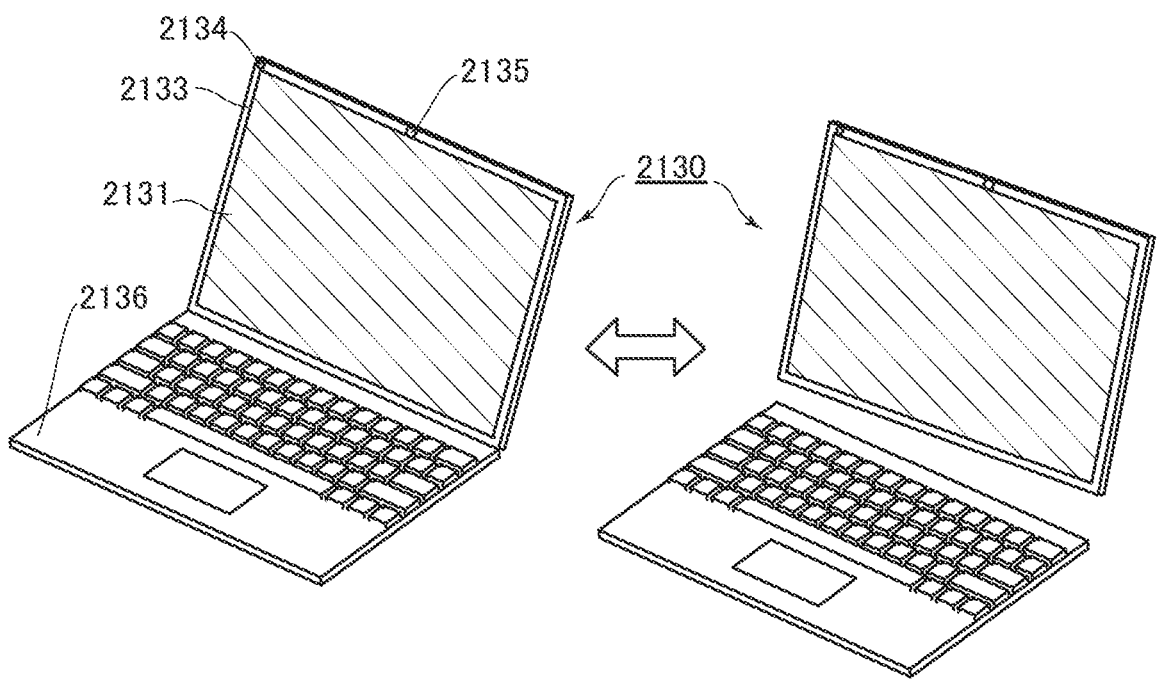

A personal computer (PC) 2130 in FIG. 32B includes a display portion 2131, a housing 2133, an optical sensor 2134, a camera 2135, and a keyboard 2136. The display portion 2131 includes the display system in which a touch sensor device is incorporated, and has a function similar to that of the display portion 2111. The keyboard 2136 can be attached to or detached from the housing 2133. When the keyboard 2136 is attached to the housing 2133, the PC 2130 can be used as a laptop PC. When the keyboard 2136 is detached from the housing 2133, the PC 2130 can be used as a tablet PC.

Figure 32C:
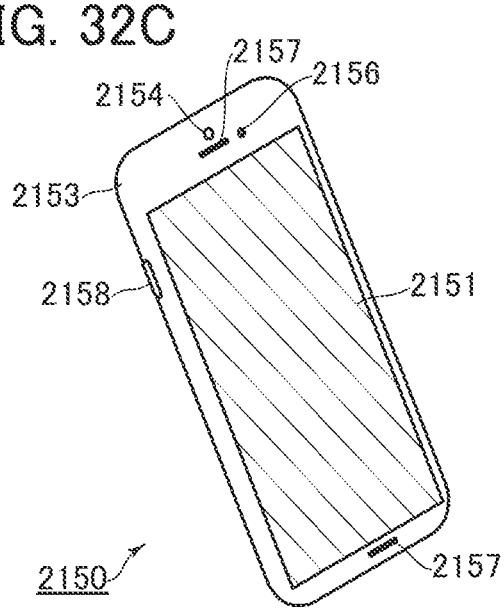

A smartphone 2150 shown in FIG. 32C includes a display portion 2151, a housing 2153, an optical sensor 2154, a microphone 2156, a speaker 2157, and an operation button 2158. The display portion 2151 includes the display system in which a touch sensor device is incorporated, and has a function similar to that of the display portion 2111. A camera or the like is provided on the back side of the housing 2153. The smartphone 2150 has a function similar to that of the information terminal 2110.

Figure 33A:
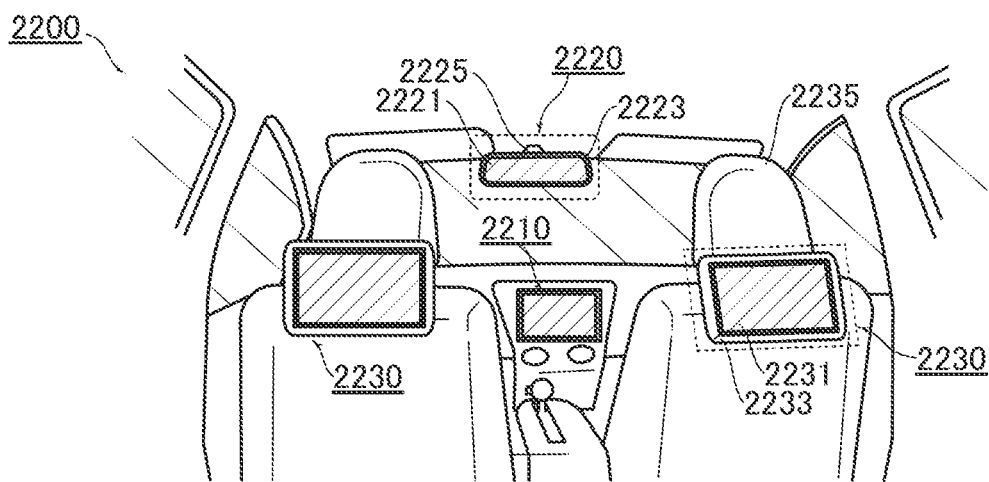
FIGS. 33A and 33B are diagrams illustrating structure examples of an electronic device.

FIG. 33A illustrates structural examples of in-vehicle electronic devices. For example, an automobile 2200 is provided with a navigation system 2210, a rearview monitor 2220, a rear seat monitor 2230, and the like. FIG. 33A schematically illustrates the inside of the automobile 2200 which is seen from a rear seat.

The rearview monitor 2220 functions as a rearview mirror (also referred to as inner rearview mirror). The rearview monitor 2220 includes a display portion 2221, a housing 2223, and a joint 2225. The display portion 2221 is installed in the automobile by the joint 2225 such that the screen orientation can be changed. The automobile 2200 is provided with a camera for taking an image of an area behind the automobile, and the image taken with the camera is displayed by the rearview monitor 2220 in real time. The navigation system 2210 may have a function of displaying an image from the camera when the automobile 2200 is moved backward.

The rear seat monitor 2230 includes a display portion 2231 and a housing 2233. The housing 2233 includes an installation portion for fixing to a shaft of a headrest 2235 of a front seat. The rear seat monitor 2230 displays, for example, an image on the navigation system 2210, a TV broadcast image, video content stored in a recording medium (for example, a DVD or an SD card), or the like.

Figure 33B:
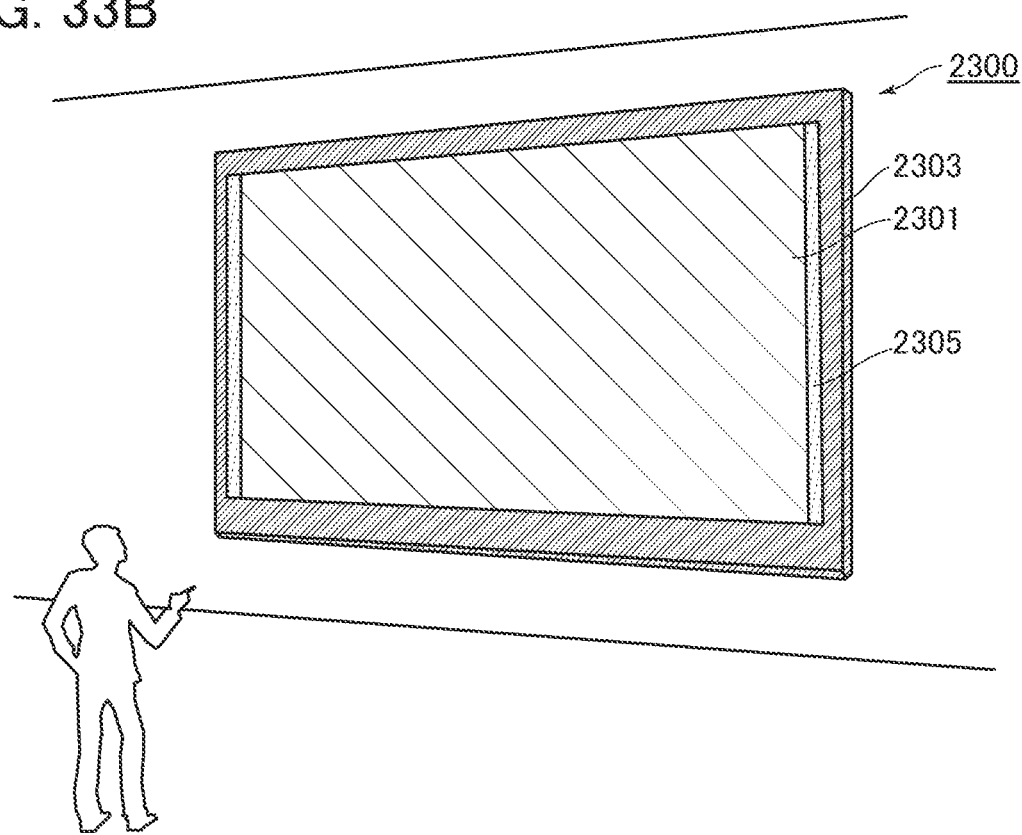

A digital signage 2300 shown in FIG. 33B includes a display portion 2301, a housing 2303, and a speaker 2305. The digital signage 2300 can be used as, for example, a display system for displaying an information map in a station, an airport, a seaport, a variety of facilities (e.g., an exhibition hall, a stadium, a theater, and an art museum), or a display system for displaying a waiting list in a hospital, a bank, or the like.

Example 1

Figure 34:
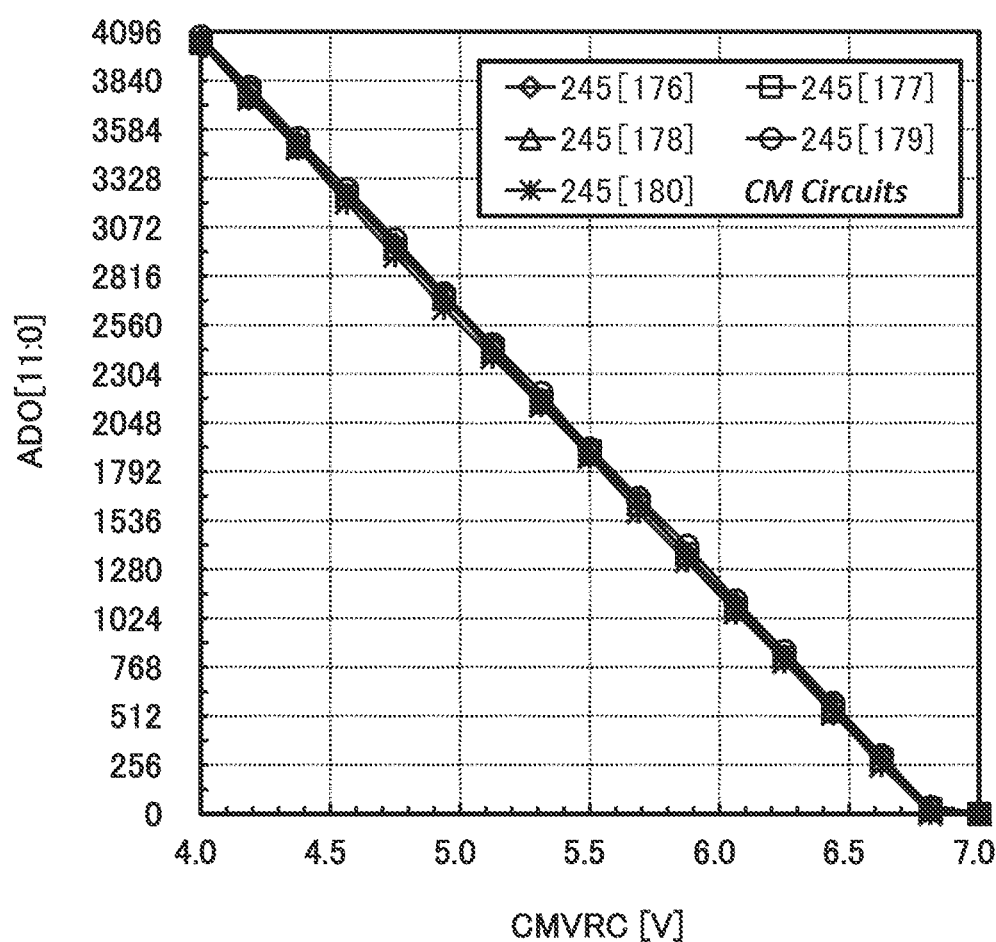
FIG. 34 shows results of current values obtained when a CSN portion of a manufactured SD-IC is operated in a test mode.

The SD-IC 200 of Embodiment 2 was fabricated and a wafer test was performed. A base substrate of the SD-IC 200 is a silicon wafer base. In the wafer test, to check the performance of the current generation portion 258, the CSN portion 202 was operated in the test mode and the signal CMDO[11:0] was obtained. FIG. 34 shows analysis results of the signal CMDO[3:0].

TABLE 3

| SD-IC 200 specifications | |
|---|---|
| SDR portion 201 | |
| Output pins (PS) | 2160 |
| Input image signal | 12 bits |
| CSN portion 202 | |
| Number of input channels (input pins PM) | 360 |
| Resolution | 12 bits |

Table 3 shows specifications of the SD-IC 200. In the CSN portion 202, 180 CM circuits 245 (see FIG. 11) are provided. The A/D circuit 243 is a 12-bit A/D circuit. The capacitance of the capacitor Ct of the current generation portion 258 is 1 pF.

Note that in the SD-IC 200 fabricated, the switch S34 is not provided in the ASW portion 252 and the inverter circuit 63 and the level shift circuit 68 are not provided in the LOG/LS portion 254 (see FIG. 14).

The CSN portion 202 was operated in the test mode and the signal CMDO[3:0] was measured. The sensing mode of the I/V circuit 241 was set to the 3-input differential sensing mode. The signal DACO was input to the comparator 43 of the A/D circuit 243. The reference voltages of the D/A circuit 278 were 1 V (=CMVRD1) and 4 V (=CMVRD2).

The current IRFINT (internally generated current) was used as the current TIREF. The voltage CMVRI is 4 V. The voltage CMVRC was input to the node Nt. The voltage CMVRC was varied from 4 V to 7 V in 16 steps (in increments of 0.1875 V) to vary the current IRFINT. The CSN portion 202 was operated in the test mode for each current IRFINT, and the signal CMDO[3:0] was obtained. FIG. 34 shows the values of output data (ADO[11:0]) of the CM circuits 245[176] to 245[180] versus the voltage CMVRC. The values on the vertical axis in FIG. 34 correspond to the values of the currents IRFINT sensed by the CM circuits 245[176] to 245[180].

FIG. 34 reveals that, by controlling the current IRFINT with the electric charge of the capacitor Ct and the input voltage CMVRC, the current generation portion 258 achieves a wide range of output currents and can accurately adjust the values of the output currents. Accordingly, when the current generation portion 258 is incorporated into the SD-IC 200, the plurality of CM circuits 245 can be accurately examined.

REFERENCE NUMERALS 10, 11, 12, 15, 16: subpixel, 20: pixel, 41: amplifier circuit, 43: comparator, 44, 45, 49, 60: flip-flop, 46: inverter circuit, 47: selector, 48: tri-state (TRI) buffer circuit, 53: TRI buffer circuit, 62: OR circuit, 63: inverter circuit, 64: AND circuit, 67, 68, 69: level shift circuit, 100: IC, 110: current-voltage conversion portion, 112: sample-and-hold portion, 113: analog-digital conversion portion, 114: output driver, 117: switch portion, 118: shift register, 121: level shift portion, 122, 123: logic portion, 124: logic/level shifter (LOG/LS) portion, 125: current generation circuit, 125a: delay circuit, 128: switch matrix, 129: switch portion, 130: current-voltage conversion circuit (I/V circuit), 131: amplifier circuit, 132: sample-and-hold circuit (S/H circuit), 133: analog-digital conversion circuit (A/D circuit), 134: buffer circuit, 135: register, 137: switch matrix, 139: switch circuit, 140: CM circuit, 160: circuit, 161: level shifter, 162: OR circuit, 163: register, 168: shift register, 200: source driver IC (SD-IC), 201: source driver (SDR) portion, 202: current sensing (CSN) portion, 210: receiver, 211: logic portion, 212: shift register, 214: latch portion, 215: latch portion, 216: level shift portion, 217: digital-analog conversion portion (D/A portion), 218: amplifier portion, 224, 225: latch circuit, 226: level shifter, 227: digital-analog conversion circuit (D/A circuit), 228: amplifier circuit, 230: analog switch (ASW) portion, 231: I/V (current-voltage conversion) portion, 232: sample-and-hold (S/H) portion, 233: analog-digital conversion portion (A/D portion), 235: output driver, 236: buffer portion, 237: shift register, 240: switch matrix, 241: I/V circuit, 241S: integrating circuit, 241D: differential integrating circuit, 242: S/H circuit, 243: A/D circuit, 245: CM circuit, 250: switch matrix, 251: ASW portion, 252: ASW portion, 253: buffer portion, 254: LOG/LS portion, 255: shift register, 258: current generation portion, 258a: delay circuit, 258A, 258B, 259, 260, 261: ASW circuit, 258G: current generation circuit, 269: multiplexer (MUX), 270: level shift portion, 271: setup register, 272: decoder, 274, 275: selector, 277: counter, 278: D/A circuit, 500: display system, 510: processor, 512: execution unit, 513: memory device, 515: display controller, 516: image processor, 517: timing controller, 518: memory device, 520: display panel, 521: pixel array, 522: peripheral circuit, 523D, 523U: switch circuit, 524L, 524R: gate driver circuit, 531, 532: circuit, 551, 552, 553, 554: pixel array, 2010: TV device, 2011: display portion, 2013: housing, 2015: support base, 2020: display device, 2021: display portion, 2023: housing, 2025: support base, 2040: medical display device, 2041: display portion, 2043: housing, 2045: support portion, 2050: medical display device, 2051: display portion, 2053: housing, 2055: support base, 2110: information terminal, 2111: display portion, 2113: housing, 2114: optical sensor, 2115: camera, 2116: operation button, 2117: stylus pen, 2130: personal computer (PC), 2131: display portion, 2131: housing, 2133: housing, 2134: optical sensor, 2135: camera, 2136: keyboard, 2150: smartphone, 2151: display portion, 2153: housing, 2154: optical sensor, 2156: microphone, 2157: speaker, 2158: operation button, 2200: automobile, 2210: navigation system, 2220: rearview monitor, 2221: display portion, 2223: housing, 2225: joint, 2230: rear seat monitor, 2231: display portion, 2233: housing, 2235: headrest, 2300: digital signage, 2301: display portion, 2303: housing, 2305: speaker, 4001: substrate, 4005: sealant, 4006: substrate, 4010, 4011: transistor, 4014, 4015, 4021, 4030, 4031, 4156, 4157, 4150, 4151: conductive layer, 4018: FPC, 4019: anisotropic conductive layer, 4020: capacitor, 4102, 4103, 4110, 4111, 4112: insulating layer, 4120: pixel array, 4125: gate driver circuit, 4126: terminal portion, 4152: semiconductor layer, 4201, 4202, 4203: display panel, 4510: partition wall, 4511: light-emitting layer, 4513: electroluminescent (EL) element, 4514: filler, P11, P12, PAIO, PDI, PDO1, PDO2, PI, PM, PMV1, PMV2, PS, PVP, PVR1, PVR2, PVR3, PVR4: pin, B0, B1, B2, B3, B10, B11, B12, B20, B21, INM, INP, INP1, INP2, MO, OTA, OT131: terminal, N81, N82, N132, Nsh, Nt, Nta, Ntb: node, S11, S12, S13, S14, S15, S16, S17, S18, S21, S22, S23, S24, S25, S26, S27, S28, S30, S31, S32, S33, S34, S35, S41, S42, SW71, SW72, SW73, SW74, SW75, SW76, SW81, SW82, SW83, SW84, SW85, SW86, SW87, SW88, SWiv, SWsh, SWt, SWtb: switch, Civ, Csh, Ct, C41, C42, Cn10, Cn11, Cn12, Cn81, Cn82, CS1, CS2, CS3: capacitor, ANL, ML, TM0, TM1, TM2, TM3, TM81, TM82: wiring, GL1, GL1a, GL1b, GL2: gate line, SL1, SL1a, SL1b: source line, DE1, DE2, DE3: EL element, M11, M12, M13, M14, M15, M16, M24, M25, M26, MD1, MD2, MD3, MM1, MM2, MS1, MS2, MS3: transistor This application is based on Japanese Patent Application Serial No. 2017-043102 filed with Japan Patent Office on Mar. 7, 2017, the entire contents of which are hereby incorporated by reference.

The invention claimed is:

1. An IC comprising:
a first pin, a second pin, a third pin, and a fourth pin;
a first current sensing circuit that senses a current flowing through the first pin and a current flowing through the second pin, the first current sensing circuit comprising a first amplifier circuit;
a second current sensing circuit that senses a current flowing through the third pin and a current flowing through the fourth pin, the second current sensing circuit comprising a second amplifier circuit; and
a current generation circuit including a capacitor and a first switch,
wherein a first voltage is input to a first terminal of the capacitor,
wherein a second voltage is input to a second terminal of the capacitor through the first switch,
wherein the first voltage is different from the second voltage,
wherein the current generation circuit generates a reference current corresponding to an amount of electric charge held by the capacitor,
wherein the current generation circuit successively outputs the reference current to the first current sensing circuit and the second current sensing circuit,
wherein a first input terminal and a second input terminal of the first amplifier circuit are capable of connecting the first pin, the second pin, and the second terminal of the capacitor, and
wherein a first input terminal and a second input terminal of the second amplifier circuit are capable of connecting the third pin, the fourth pin, and the second terminal of the capacitor.

2. The IC according to claim 1,
wherein the current generation circuit further includes a second switch, a first node, and a second node,
wherein the second voltage is input to the first node,
wherein the first switch controls electrical continuity between the first node and the second terminal of the capacitor,
wherein the second switch controls electrical continuity between the second node and the second terminal of the capacitor, and
wherein the current generation circuit outputs a current flowing through the second node as the reference current.

3. A driver IC comprising:
the IC according to claim 1; and
a driver portion,
wherein the driver portion processes an image signal input from an outside of the IC and generates a grayscale signal.

4. A display system comprising:
the driver IC according to claim 3; and
a pixel array,
wherein the driver IC transmits the grayscale signal to the pixel array.

5. An electronic device comprising:
a display portion,
wherein the display portion includes the driver IC according to claim 3 and a pixel array, and
wherein the driver IC inputs the grayscale signal to the pixel array.

* * * * *